(12) United States Patent
Kohn et al.

(10) Patent No.: US 10,666,076 B1
(45) Date of Patent: May 26, 2020

(54) USING BATTERY STATE EXCITATION TO CONTROL BATTERY OPERATIONS

(71) Applicant: Veritone Alpha Inc., Costa Mesa, CA (US)

(72) Inventors: Wolf Kohn, Seattle, WA (US); Jordan Makansi, Seattle, WA (US); Yanfang Shen, Bellevue, WA (US)

(73) Assignee: Veritone Alpha, Inc., Costa Mesa, CA (US)

( * ) Notice: Subject to any disclaimer, the term of this patent is extended or adjusted under 35 U.S.C. 154(b) by 58 days.

(21) Appl. No.: 16/103,788

(22) Filed: Aug. 14, 2018

(51) Int. Cl.
| | | |
|---|---|---|
| *G05B 13/04* | (2006.01) |
| *G01R 31/36* | (2020.01) |
| *H02J 7/00* | (2006.01) |
| *G05B 13/02* | (2006.01) |
| *G01R 31/367* | (2019.01) |

(52) U.S. Cl.
CPC .......... *H02J 7/0068* (2013.01); *G01R 31/367* (2019.01); *G05B 13/0265* (2013.01); *G05B 13/041* (2013.01)

(58) Field of Classification Search
CPC .............................. G01R 31/367; H02J 7/0068
See application file for complete search history.

(56) References Cited

U.S. PATENT DOCUMENTS

| | | |
|---|---|---|
| 5,724,239 A | 3/1998 | Kaneko |
| 5,727,128 A | 3/1998 | Morrison |
| 5,755,378 A | 5/1998 | Dage |
| 5,963,447 A | 10/1999 | Kohn et al. |
| 6,088,689 A | 7/2000 | Kohn et al. |
| 6,694,044 B1 | 2/2004 | Pavlovic et al. |

(Continued)

FOREIGN PATENT DOCUMENTS

| | | |
|---|---|---|
| JP | 2008-546370 A | 12/2008 |
| JP | 2015-025685 A | 2/2015 |

(Continued)

OTHER PUBLICATIONS

Ge et al., "Hybrid Systems: Chattering Approximation to Relaxed Controls," *Lecture Notes in Computer Science vol. 1066: Hybrid Systems III*, 1996, 25 pages.

(Continued)

*Primary Examiner* — Mark A Connolly
(74) *Attorney, Agent, or Firm* — VLP Law Group LLP; James A. D. White

(57) ABSTRACT

Techniques are described for implementing automated control systems for target battery systems based at least in part on battery state information gathered from active excitation of the batteries, such as to maximize battery life while performing other battery power use activities. The excitation of a target battery system may occur while it is in use, by repeatedly introducing small defined variations as input to the battery system while the battery system is otherwise used to supply or receive electricity. Corresponding small variations in output of the battery system from the excitation activities are then measured by hardware sensors, aggregated and analyzed to generate a current model of the internal state of the one or more batteries, and then used to assist in controlling further operations of the battery system, including in some cases to update a previously existing model of the battery system.

28 Claims, 23 Drawing Sheets

(56) References Cited

U.S. PATENT DOCUMENTS

| | | |
|---|---|---|
| 7,072,723 B2 | 7/2006 | Kohn et al. |
| 7,216,004 B2 | 5/2007 | Kohn et al. |
| 7,574,383 B1 | 8/2009 | Parasnis et al. |
| 8,261,283 B2 | 9/2012 | Tsafrir et al. |
| 8,429,106 B2 | 4/2013 | Downs et al. |
| 8,606,788 B2 | 12/2013 | Chen et al. |
| 8,949,772 B1 | 2/2015 | Talby et al. |
| 9,946,517 B2 | 4/2018 | Talby et al. |
| 2002/0049899 A1 | 4/2002 | Kenworthy |
| 2003/0069868 A1 | 4/2003 | Vos |
| 2003/0234812 A1 | 12/2003 | Drucker et al. |
| 2004/0260666 A1 | 12/2004 | Pestotnik et al. |
| 2005/0102044 A1 | 5/2005 | Kohn et al. |
| 2005/0273413 A1 | 12/2005 | Vaudrie |
| 2006/0218074 A1 | 9/2006 | Kohn |
| 2006/0229769 A1 | 10/2006 | Grichnik et al. |
| 2008/0167756 A1 | 7/2008 | Golden et al. |
| 2009/0113049 A1 | 4/2009 | Nasle |
| 2010/0033132 A1 | 2/2010 | Nishi et al. |
| 2011/0035071 A1 | 2/2011 | Sun |
| 2011/0178622 A1 | 7/2011 | Tuszynski |
| 2011/0298626 A1 | 12/2011 | Fechalos et al. |
| 2012/0072181 A1 | 3/2012 | Imani |
| 2012/0098481 A1 | 4/2012 | Hunter et al. |
| 2012/0143356 A1 | 6/2012 | Berg-Sonne |
| 2012/0274281 A1 | 11/2012 | Kim |
| 2012/0283887 A1 | 11/2012 | Goldsmith et al. |
| 2013/0080530 A1 | 3/2013 | Frees et al. |
| 2013/0099576 A1 | 4/2013 | Chuah et al. |
| 2013/0119916 A1 | 5/2013 | Wang et al. |
| 2013/0198541 A1* | 8/2013 | Rabii ................. G06F 1/26 713/320 |
| 2013/0253942 A1 | 9/2013 | Liu et al. |
| 2013/0274936 A1 | 10/2013 | Donahue et al. |
| 2014/0114517 A1 | 4/2014 | Tani et al. |
| 2014/0217976 A1 | 8/2014 | McGrath |
| 2014/0250377 A1 | 9/2014 | Bisca et al. |
| 2014/0277600 A1 | 9/2014 | Kolinsky et al. |
| 2015/0032394 A1 | 1/2015 | Kimura et al. |
| 2015/0058078 A1 | 2/2015 | Ehrenberg et al. |
| 2015/0184550 A1 | 7/2015 | Wichmann |
| 2015/0253749 A1 | 9/2015 | Kniazev et al. |
| 2015/0279182 A1 | 10/2015 | Kanaujia et al. |
| 2015/0316618 A1* | 11/2015 | Lou .................. G01R 31/3648 702/63 |
| 2015/0370228 A1 | 12/2015 | Kohn et al. |
| 2015/0370232 A1 | 12/2015 | Kohn et al. |
| 2016/0004228 A1 | 1/2016 | Kohn |
| 2016/0018806 A1 | 1/2016 | Kohn et al. |
| 2016/0125435 A1 | 5/2016 | Kohn et al. |
| 2016/0216708 A1 | 7/2016 | Krivoshein et al. |
| 2017/0198541 A1* | 7/2017 | Bergeron ............ E21B 33/035 |
| 2017/0271984 A1 | 9/2017 | Kohn et al. |
| 2017/0285111 A1 | 10/2017 | Fife |
| 2017/0315517 A1 | 11/2017 | da Silva et al. |
| 2017/0315523 A1 | 11/2017 | Cross et al. |
| 2018/0134170 A1 | 5/2018 | Zhou et al. |
| 2018/0149708 A1* | 5/2018 | Shoa ................. G01R 31/367 |

FOREIGN PATENT DOCUMENTS

| | | |
|---|---|---|
| JP | 2016-105672 A | 6/2016 |
| WO | 2014018048 A1 | 1/2014 |
| WO | 2014030349 1A | 2/2014 |
| WO | 2014089959 A1 | 6/2014 |
| WO | 2016025080 A1 | 2/2016 |
| WO | 2018172216 A1 | 9/2018 |

OTHER PUBLICATIONS

Kohn et al., "Multiple Agent Hybrid Control: Carrier Manifolds and Chattering Approximations to Optimal Control," $33^{rd}$ Conference on Decision and Control Lake Buena Vista, FL, Dec. 1994, 7 pages.

Kohn et al., "A Hybrid Systems Approach to Computer-Aided Control Engineering," *IEEE Control Systems* 15(2), 1995, 30 pages.

Kohn et al., "Hybrid Systems as Finsler Manifolds: Finite State Control as Approximation to Connections," *Lecture Notes in Computer Science vol. 999: Hybrid Systems II*, 1995, 28 pages.

Kohn et al., "Viability in Hybrid Systems," *Theoretical Computer Science* 138, 1995, 28 pages.

Kohn et al., "Digital to Hybrid Program Transformations," IEEE International Symposium on Intelligent Control, Dearborn, MI, Sep. 15-18, 1996, 6 pages.

Kohn et al., "Hybrid Dynamic Programming," *Lecture Notes in Computer Science vol. 1201: Hybrid and Real-Time Systems*, 1997, 7 pages.

Kohn et al., "Implementing Sensor Fusion Using a Cost-Based Approach," American Control Conference, Albuquerque, NM, Jun. 1997, 5 pages.

Kohn et al., "Control Synthesis in Hybrid Systems with Finsler Dynamics," *Houston Journal of Mathematics* 28(2), 2002, 23 pages.

Kohn et al., "A Micro-Grid Distributed Intelligent Control and Management System," *IEEE Transactions on Smart Grid* 6(6), Nov. 2015, 11 pages.

Uddin, K., "The effects of high frequency current ripple on electric vehicle battery performance," Applied Energy 178 (2016), 13 pages.

Hyndman, "Forecasting: Principles & Practice", Workshop at University of Western Australia (robjhyndman.com/uwa), 138 pages, Sep. 23-25, 2014.

Leng et al., "Effect of Temperature on the Aging Rate of Li Ion Battery Operating Above Room Temperature," Scientific Reports 5:12967, Aug. 2015, 12 pages.

Shim et al., "Past, present, and future of decision support technology", Decision Support Systems 33 (2002), 16 pages (pp. 111-126).

Liserre et al., "Future Energy Systems", IEEE Industrial Electronics Magazine, Mar. 2010, 20 pages (pp. 18-37).

Sarkis, "A strategic decision framework for green supply chain management", Journal of Cleaner Production 11 (2003) 13 pages (pp. 397-409).

Chong et al., "Sensor Networks: Evolution, Opportunities, and Challenges", Proceedings of the IEEE, vol. 91, No. 8, Aug. 2003, 10 pages (pp. 1247-1256).

Schutter, B. De "Minimal state-space realization in linear system theory: an overview", Journal of Computational and Applied Mathematics, 121 (2000), 24 pages (331-354).

\* cited by examiner

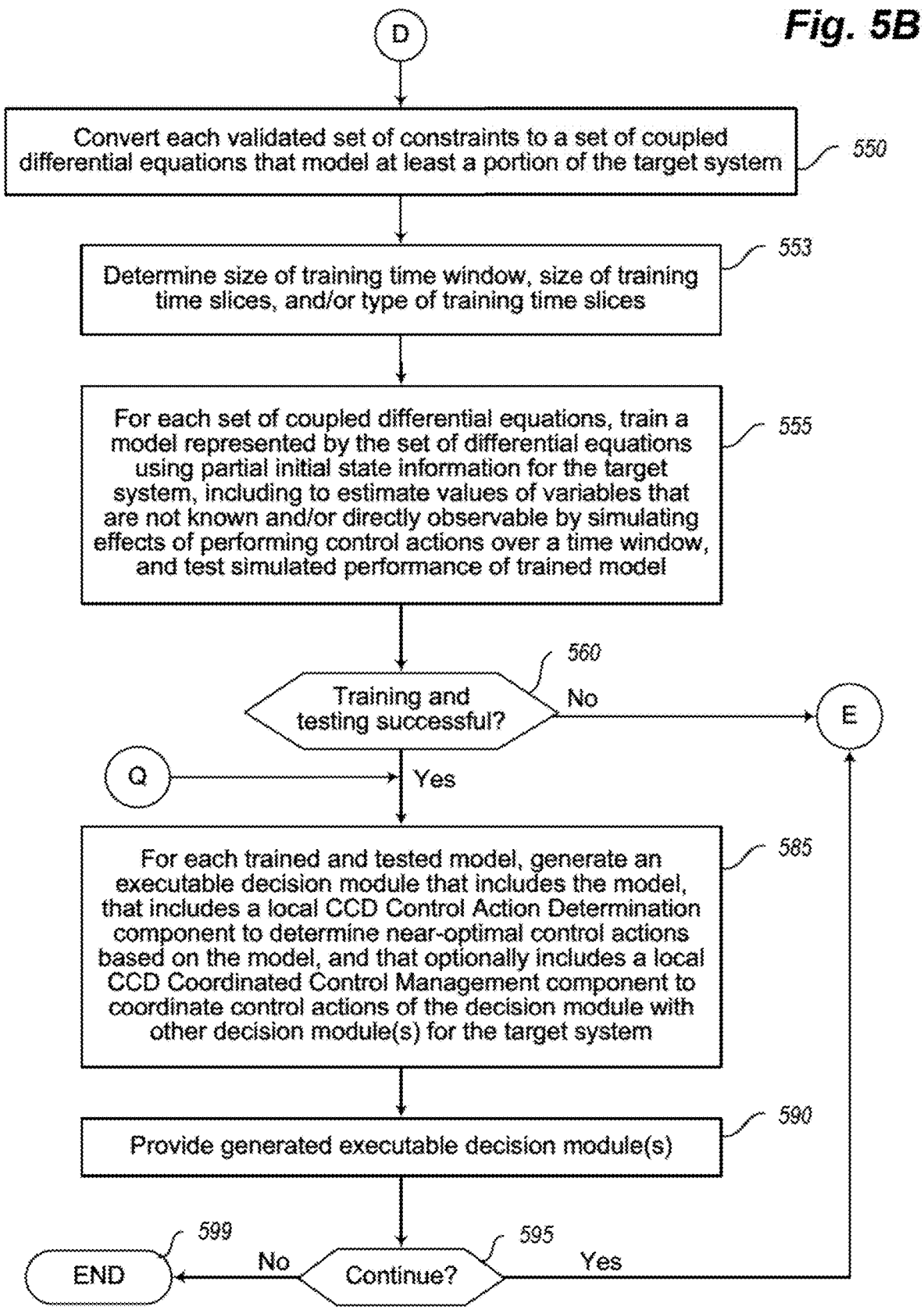

USING BATTERY STATE EXCITATION TO CONTROL BATTERY OPERATIONS

TECHNICAL FIELD

The following disclosure relates generally to techniques for controlling operations of one or more batteries based at least in part on internal battery state information gathered from active excitation of the batteries, such as to maximize battery life while performing other battery power use activities.

BACKGROUND

Attempts have been made to implement automated control systems for various types of physical systems having inputs or other control elements that the control system can manipulate in an attempt to provide desired output or other behavior of the physical systems—one example of such automated control is to manage operations of a battery that is discharging electrical power to support a load and/or is charging using electrical power from a source, while uncertainty exists about an internal temperature and/or chemical state of the battery, and potentially with ongoing changes in load, source and/or internal state of the battery. Such automated control systems have used various types of architectures and underlying computing technologies to attempt to implement such functionality.

However, various difficulties exist with existing automated control systems and their underlying architectures and computing technologies for battery systems, including with respect to managing uncertainty in a current state of a system being controlled and in how different types of inputs will affect operation of the automated control systems.

BRIEF DESCRIPTION OF THE DRAWINGS

FIGS. 5A-5C illustrate a flow diagram of an example embodiment of a CDD Decision Module Construction routine.

DETAILED DESCRIPTION

Figure 1A:
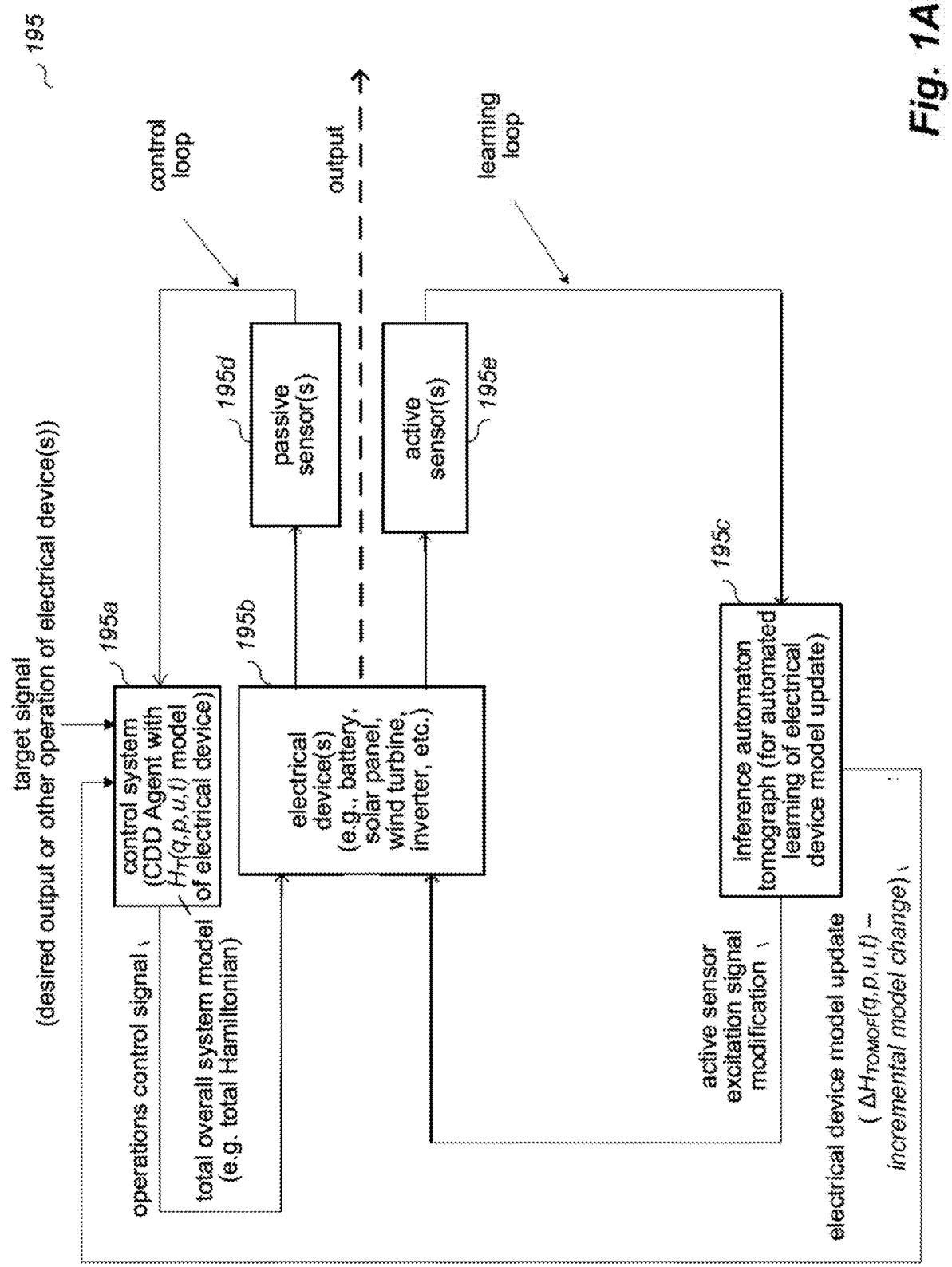
FIG. 1A includes a diagram illustrating use of an inference automaton tomograph component to perform active excitation of an electrical device of a target system to learn information about an internal state of the electrical device.

Techniques are described for implementing automated control systems to control or otherwise manipulate at least some operations of batteries and of target physical systems that use them. In at least some embodiments, the described techniques include performing excitation of one or more target battery systems while they are in use, by repeatedly introducing small defined variations as input to the battery systems (e.g., by repeatedly varying microamperes or microvolts applied or otherwise provided to the anode(s) and/or cathode(s) of one or more batteries in the battery systems) while the battery systems are otherwise used to supply or receive electricity. Corresponding small variations in output of the battery systems from the excitation activities are then measured by hardware sensors (referred to generally as "active sensors" herein), and are aggregated and analyzed to generate a current model of the internal state of the one or more batteries, such as to model the internal temperature, chemistry (e.g., number of free ions at anodes and cathodes), etc.—such excitation and resulting modeling activities are referred to generally herein as using "inference automaton tomography" or "inference automaton tomographic" techniques, such as by an "inference automaton tomography" component. The generated current internal state model may then be used to assist in controlling further operations of the battery systems (e.g., to determine further control actions to perform for the battery systems), including in some cases to update a previously existing model of the battery systems (e.g., an existing model that is based at least in part on other types of information about the battery) and to use the updated battery system model to control whether and how much power is supplied to and/or extracted from the battery systems (e.g., in a current or next time period). Additional details are described below related to performing such improved modeling of a target system's state and operational characteristics via battery excitation activities, and to using a resulting improved model of the target system in particular manners, and some or all of the described techniques are performed in at least some embodiments by automated operations of one or more 'inference automaton tomograph' components, optionally as part of or in conjunction with one or more CDD (Collaborative Distributed Decision) systems controlling specific target systems that include one or more batteries.

In at least some embodiments, the described techniques are used to provide a feedback control system for a target system having one or more batteries that dynamically change during operation, including to generate and use a model of the target system that is improved in real-time by generating and using updated incremental models (rather than merely changing parameter values in an existing model) based on information generated by active sensors. The described techniques include injecting signals into the target system in such a manner that they do not substantially alter the behavior of the target system (referred to herein as a "non-demolition" strategy), but with the injected signals eliciting a response that reflects the internal characteristics of the target system. In at least some such embodiments, the described techniques encode the dynamics of the target system under control in a function of the state of the target system referred to as a data Hamiltonian model, and further generate updates in real-time to the model of the dynamics of the target system. Some characteristics of the target system under control may not be completely known (e.g., internal state of the battery), with the data Hamiltonian encoding the currently known information, and the Inference Automaton Tomograph periodically updating the data Hamiltonian model of the target system to better reflect the actual ongoing dynamics of the target system as it is operating. Additional details are included below related to the providing of a feedback control system for a target system having one or more batteries that dynamically change during operation, including based on the use of Hamiltonian models in at least some embodiments.

The described techniques involving the use of inference automaton tomographic techniques may provide a variety of benefits and advantages. In particular, many traditional control system approaches involving batteries have been ineffective for controlling complex systems in which internal state information cannot be determined, while the use of the described inference automaton tomographic techniques overcome such problems based at least in part by actively probing the internal state of the batteries being controlled in a non-demolition manner. Such traditional control system approaches typically involve the system designers beginning with requirements for battery system behavior, using the requirements to develop a static model of the system with constraints and other criteria, and attempting to optimize the run-time battery system operations in light of the constraints and other criteria. Conversely, in at least some embodiments, the described inference automaton tomographic techniques do not need to use such constraints and other criteria, nor to develop such a resulting static model, nor to do such optimization—instead, a desired behavior of a battery system is expressed and used to create a desired behavioral model (e.g., expressed as a total Hamiltonian system model), and the information used from the feedback learning loop during run-time operation is used to improve the structure of the system model (e.g., continuously) by expressing actual learned internal state information in model updates used to reduce the difference between the total system model and the actual system behavior (e.g., by learning coefficients of polynomial equations used as part of the total Hamiltonian system model, such that the total system model better represents the actual battery system behavior). In this manner, as the differences between the total system model and the actual system behavior are reduced, the control actions determined by the automated control system using the modified total system model more accurately control the target system to achieve the desired behavior. Additional non-exclusive examples of such benefits and advantages include the following (with further details provided herein): improving how a current state of a target system is modeled, such as to generate a function and/or or structure that models internal operations of the target system based on actual data that is collected from active excitation of the target system rather than merely attempting to estimate target system state; increasing capabilities for handling uncertainty management and/or optimal dispatch and commitment and/or anomaly detection and response; performing structural adaptation to automatically generate an incremental model update of a target system that is used to modify an existing total system model for the target system, rather than merely tuning parameter values without changing the model structure; etc.

FIG. 1A includes an example diagram 195 illustrating how an inference automaton tomograph component may be used to estimate internal state information for a target system using an electrical device 195$b$—the electrical device may be a battery in at least some embodiments, as discussed in greater detail elsewhere herein (including with respect to the examples of FIGS. 2A-2G), although in other situations the electrical device may have other forms (e.g., a solar panel, wind turbine, inverter, fuel cell, solid waste generator, other active loads, etc.).

In this example, a control system 195$a$ performs a control loop to control ongoing operation of the electrical device 195$b$ of the target system, such as to drive the target system to a desired dynamic behavior. In particular, the control system may include a CDD agent (as discussed in greater detail below with respect to FIGS. 1B-1C, as well as elsewhere herein), and an overall total model of the target system that was previously generated based in part on data obtained from actual operation of the target system over time (such as to identify some or all inputs supplied to the target system; resulting outputs from the target system, such as sensor data measured regarding operations of the target system from passive sensors 195$d$, etc.)—the overall system model is a total representation of the target system and its operations, and in this example is in the form of a total Hamiltonian function $H_T$, as discussed in greater detail below. As part of the operation of the control system 195$a$, it receives a target signal that indicates a desired output or other desired operation of the electrical device 195$b$ of the target system, and uses information from its overall total system model $H_T$ to determine an energy supply control signal to send to the electrical device that satisfies defined constraints and other goals of the control system in light of its current state, while attempting to satisfy the desired output or other desired operation of the target signal if possible. The electrical device receives the energy supply control signal, and optionally performs a corresponding output, with that output and/or other characteristics of the electrical device being measured at least in part by the one or more passive sensors 195$d$ (e.g., a suite of multiple passive sensors). The passive sensors 195$d$ may further supply their measured readings to the control system 195$a$, such as to update corresponding state information in the overall system model $H_T$, with the control system 195$a$ continuing to control operation of the electrical device 195$b$ for a next target signal (e.g., in a continuous or substantially continuous manner, and such as based on an overall system model that is updated in a continuous or substantially continuous manner based at least in part on readings from the passive sensors 195$d$).

In addition to the control loop used to control the operations of the electrical device 195$b$, FIG. 1A further illustrates an inference automaton tomograph component 195$c$ that participates in a learning feedback loop to generate a current internal state model of the electrical device 195$b$, such as for use in sending a model update to the control system 195$a$ to update its overall total system model $H_T$—the current internal state model in this example is in the form of an incremental Hamiltonian function $H_{TOMOF}$. In this example, both the overall total system model $H_T$ and the current internal state model $H_{TOMOF}$ are a function of the state q, the momentum p and the control u at current time t, with the current internal state model $H_{TOMOF}$ being used as a corrective function that is supplied to the control system 195$a$ to update the current overall total system model $H_T$. The learning loop further includes one or more active sensors 195e (e.g., a suite of multiple active sensors) that provide information about the current internal state of the electrical device 195b based on changes in the electrical device 195b in response to the excitation signals supplied to the electrical device, which is this example are a low voltage variable high frequency group of signals (referred to at times herein as the "excitation suite") that are successively applied to the electrical device and that interact with internal dynamics of the electrical device 195b in a non-demolition form (so as to provide internal information about dynamics of the electrical device without causing changes on the output or control loop for the target system that exceed a defined threshold). In particular, the inference automaton tomograph 195c generates the active sensor excitation signals, which are supplied to the electrical device 195b (e.g., optionally after being added to the main energy supply control signal from the control system 195a). In this manner, the inference automaton tomograph performs excitation activities while the electrical device 195b is in use by repeatedly introducing small defined variations in input, to measure corresponding small variations in output of the electrical device 195b via the active sensors 195e, with those output variations being aggregated and analyzed to generate a current internal state model $H_{TOMOF}$ used to update the current overall system model $H_T$ of the control system 195a. Additional details are included below regarding the operations of the inference automaton tomograph.

With respect to such an overall total system model $H_T$ of a target system that includes an electrical device, the target system may, for example, include one or more batteries used to store and provide electrical power (e.g., for a local load, for an electrical grid that supports various loads in various locations, etc.), and the automated operations to control the target system may include using characteristics of at least one such battery in the target system to perform automated control of DC (direct current) power that is provided from and/or stored by that battery. In such embodiments, the automated operations of one or more CDD agents may include generating an overall total system model of battery performance by receiving information about inputs to, outputs from, control signal instructions provided to and other attributes related to the one or more batteries (e.g., electrical current and/or voltage being output for use, electrical current and/or voltage being input for storage, temperature readings external to the one or more batteries as part of their surrounding environment, etc.), and using such information as part of modeling current operational characteristics of the one or more batteries—given such modeled information, the CDD agent(s) that control the one or more batteries may then use such information to make decisions on current and/or future control actions in a manner that reflects actual behavior of the target system.

However, before further discussion of the inference automaton tomograph component and its functionality, a more general description of the control of target systems using such representations and other models is provided.

Figure 1B:
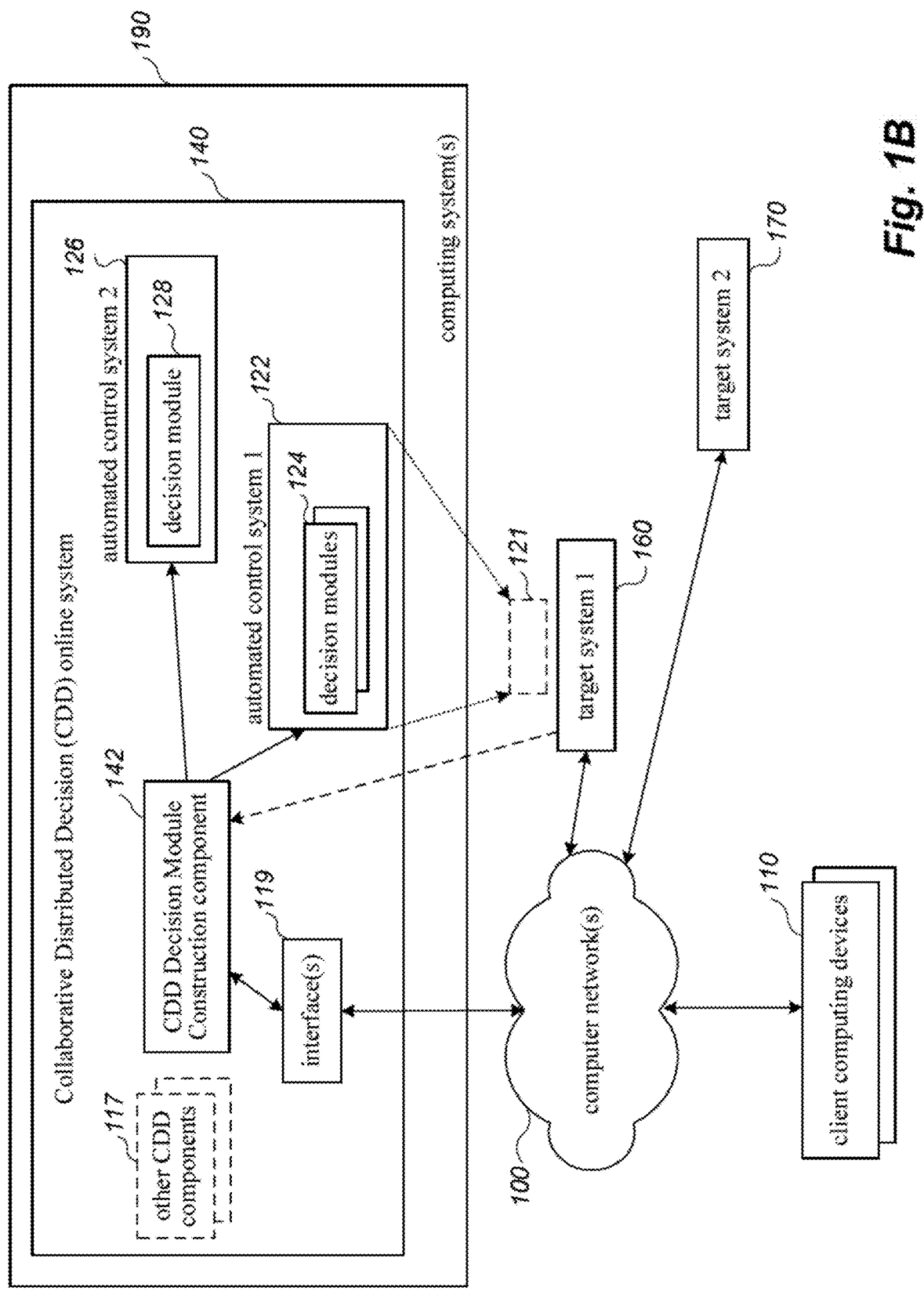
FIG. 1B is a network diagram illustrating an example environment in which a system for performing cooperative distributed control of target systems may be configured and initiated.

In particular, FIG. 1B is a network diagram illustrating an example environment in which a system for performing cooperative distributed control of one or more target systems may be configured and initiated. In particular, an embodiment of a CDD system 140 is executing on one or more computing systems 190, including in the illustrated embodiment to operate in an online manner and provide a graphical user interface (GUI) (not shown) and/or other interfaces 119 to enable one or more remote users of client computing devices 110 to interact over one or more intervening computer networks 100 with the CDD system 140 to configure and create one or more decision modules to include as part of an automated control system to use with each of one or more target systems to be controlled. While not illustrated in FIG. 1B, the CDD system 140 may include and use one or more inference automaton tomograph components as discussed herein, such as to include one or more such inference automaton tomograph components in one or both of the automated control systems 1 and 2.

In particular, target system 1 160 and target system 2 170 are example target systems illustrated in this example, although it will be appreciated that only one target system or numerous target systems may be available in particular embodiments and situations, and that each such target system may include a variety of mechanical, electronic, chemical, biological, and/or other types of components to implement operations of the target system in a manner specific to the target system. In this example, the one or more users (not shown) may interact with the CDD system 140 to generate an example automated control system 122 for target system 1, with the automated control system including multiple decision modules (or "agents") 124 in this example that will cooperatively interact to control portions of the target system 1 160 when later deployed and implemented. The interactions of the users with the CDD system 140 to create the automated control system 122 may involve a variety of interactions over time, including in some cases independent actions of different groups of users. In addition, as part of the process of creating and/or training or testing automated control system 122, it may perform one or more interactions with the target system 1 as illustrated, such as to obtain partial initial state information, although some or all training activities may in at least some embodiments include simulating effects of control actions in the target system 1 without actually implementing those control actions at that time. In some embodiments and situations, such initial user interactions may be used to generate an initial rule-based overall system model of a target system that is based at least in part on binary rules.

After the automated control system 122 is created, the automated control system may be deployed and implemented to begin performing operations involving controlling the target system 1 160, such as by optionally executing the automated control system 122 on the one or more computing systems 190 of the CDD system 140, so as to interact over the computer networks 100 with the target system 1. In other embodiments and situations, the automated control system 122 may instead be deployed by executing local copies of some or all of the automated control system 122 (e.g., one or more of the multiple decision modules 124) in a manner local to the target system 1, as illustrated with respect to a deployed copy 121 of some or all of automated control system 1, such as on one or more computing systems (not shown) that are part of or otherwise associated with the target system 1. In addition, in embodiments and situations in which initial user interactions are used to generate an initial rule-based system model of a target system using binary rules, the initially deployed automated control system 122 may be based on such an initial rule-based system model, and data from the operation of the target system under control of that initially deployed automated control system 122 may be gathered and used to include information about current characteristics of the target system in a revised model of the target system, including under control of an inference automaton tomography component as discussed elsewhere herein.

In a similar manner to that discussed with respect to automated control system 122, one or more users (whether the same users, overlapping users, or completely unrelated users to those that were involved in creating the automated control system 122) may similarly interact over the computer network 100 with the CDD system 140 to create a separate automated control system 126 for use in controlling some or all of the target system 2 170. In this example, the automated control system 126 for target system 2 includes only a single decision module (or "agent") 128 that will perform all of the control actions for the automated control system 126. The automated control system 126 may similarly be deployed and implemented for target system 2 in a manner similar to that discussed with respect to automated control system 122, such as to execute locally on the one or more computing systems 190 and/or on one or more computing systems (not shown) that are part of or otherwise associated with the target system 2, although a deployed copy of automated control system 2 is not illustrated in this example. It will be further appreciated that the automated control systems 122 and/or 126 may further include other components and/or functionality that are separate from the particular decision modules 124 and 128, respectively, although such other components and/or functionality are not illustrated in FIG. 1B.

The network 100 may, for example, be a publicly accessible network of linked networks, possibly operated by various distinct parties, such as the Internet, with the CDD system 140 available to any users or only certain users over the network 100. In other embodiments, the network 100 may be a private network, such as, for example, a corporate or university network that is wholly or partially inaccessible to non-privileged users. In still other embodiments, the network 100 may include one or more private networks with access to and/or from the Internet. Thus, while the CDD system 140 in the illustrated embodiment is implemented in an online manner to support various users over the one or more computer networks 100, in other embodiments a copy of the CDD system 140 may instead be implemented in other manners, such as to support a single user or a group of related users (e.g., a company or other organization), such as if the one or more computer networks 100 are instead an internal computer network of the company or other organization, and with such a copy of the CDD system optionally not being available to other users external to the company or other organizations. In addition, the CDD system 140, each of its components (including component 142 and optional other components 117, such as one or more CDD Control Action Determination components and/or one or more CDD Coordinated Control Management components and/or one or more CDD Inference Automaton Tomography components), each of the decision modules, and/or each of the automated control systems may include software instructions that execute on one or more computing systems (not shown) by one or more processors (not shown), such as to configure those processors and computing systems to operate as specialized machines with respect to performing their programmed functionality.

As noted above, various types of data may be obtained and used as part of modeling operational characteristics of a target system in a general overall model, including information about prior input data to the target system and resulting behavior of the target system. In some embodiments and situations, such data may include data that is gathered in an automated manner from one or more types of passive hardware sensors that do not use the types of excitation information discussed elsewhere herein, and in some embodiments and situations, such data may include information about actions of human users or otherwise information about such humans. The term "sensor" and "sensor data" as used herein generally refers to such data regardless of source or type, including data from hardware sensors, unless otherwise indicated with respect to a particular situation. In addition, the modeling of the current overall characteristics of a target system and/or of current internal state of the target system's batteries via excitation activities may in at least some embodiments be performed to complete or repair or otherwise address conflicts in state information for one or more parts of the target system, such as from lack of sufficient internal state structure information or other information, and to enable learning of or other improvements to a function or other model of the target system's internal state and operational characteristics. Additional details are included below related to obtaining and using such sensor data.

Figure 1C:
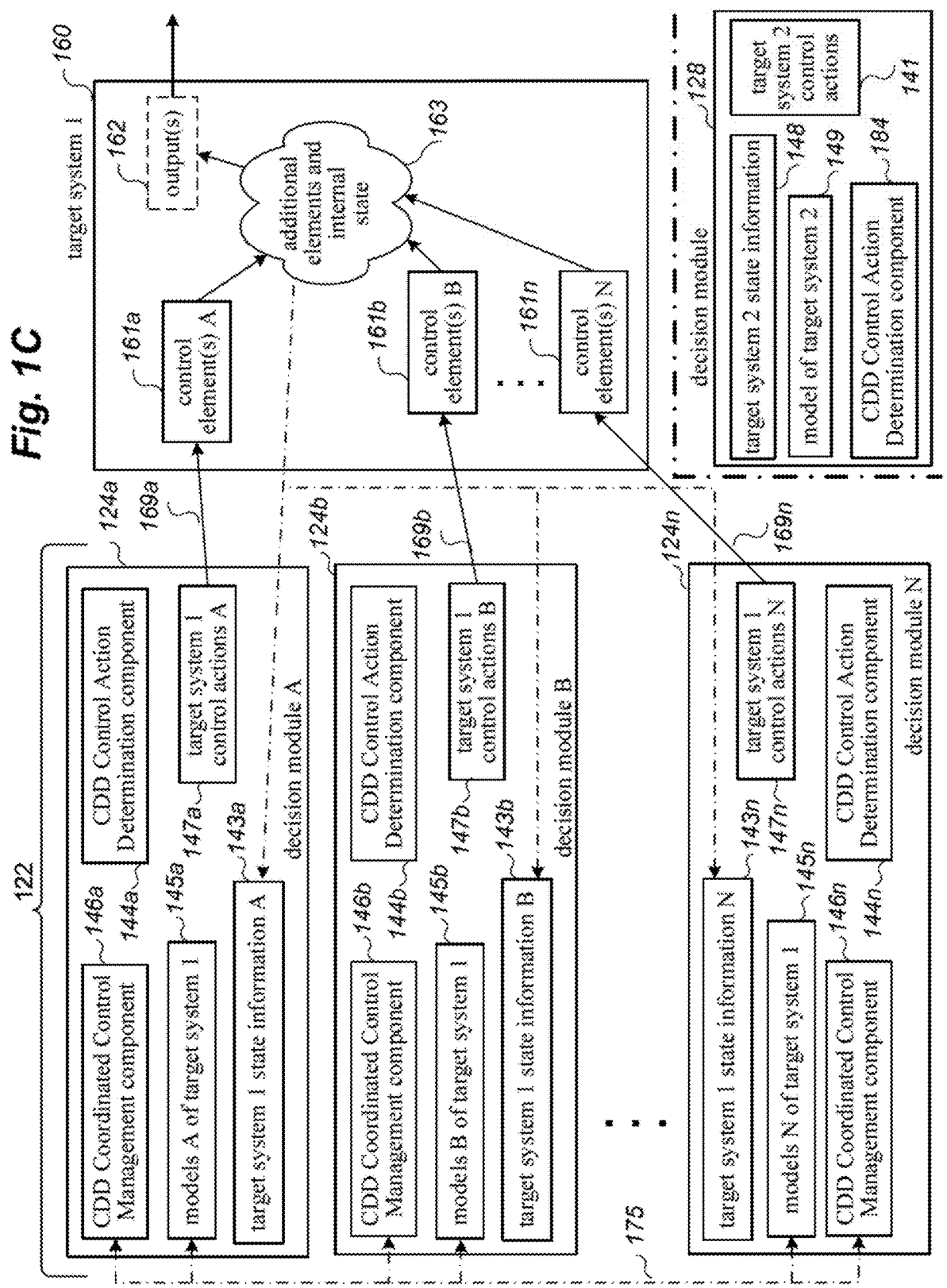
FIG. 1C is a network diagram illustrating an example environment in which a system for performing cooperative distributed control of target systems may be implemented.

FIG. 1C is a network diagram illustrating an example environment in which a system for performing cooperative distributed control of target systems may be implemented, and in particular continues the examples discussed with respect to FIG. 1B. In the example environment of FIG. 1C, target system 1 160 is again illustrated, with the automated control system 122 (whether an initial or revised version) now being deployed and implemented to use in actively controlling the target system 1 160. In the example of FIG. 1C, the decision modules 124 are represented as individual decision modules 124a, 124b, etc., to 124n, and may be executing locally to the target system 1 160 and/or in a remote manner over one or more intervening computer networks (not shown). In the illustrated example, each of the decision modules 124 includes a local copy of a CDD Control Action Determination component 144, such as with component 144a supporting its local decision module 124a, component 144b supporting its local decision module 124b, and component 144n supporting its local decision module 124n. Similarly, the actions of the various decision modules 124 are coordinated and synchronized in a peer-to-peer manner in the illustrated embodiment, with each of the decision modules 124 including a copy of a CDD Coordinated Control Management component 146 to perform such synchronization, with component 146a supporting its local decision module 124a, component 146b supporting its local decision module 124b, and component 146n supporting its local decision module 124n. One or more of the decision modules 124 may further include a local copy of a CDD Inference Automaton Tomograph component, such as to perform inference automaton tomography techniques to excite and learn internal state information for at least some of the target system 1 (e.g., for a respective subset of the target system 1 that is controlled by that decision module), although such CDD Inference Automaton Tomograph component are not illustrated in this example.

As the decision modules 124 and automated control system 122 execute, various interactions 175 between the decision modules 124 are performed, such as to share information about current models and other state of the decision modules to enable cooperation and coordination between various decision modules, such as for a particular decision module to operate in a partially synchronized consensus manner with respect to one or more other decision modules (and in some situations in a fully synchronized manner in which the consensus actions of all of the decision modules 124 converge). During operation of the decision modules 124 and automated control system 122, various state information 143 may be obtained by the automated control system 122 from the target system 160, such as initial state information and changing state information over time (e.g., from passive sensors and/or active sensors, not shown), and including outputs or other results in the target system 1 from control actions performed by the decision modules 124. Such active sensors may, for example, be used to measure results of excitation signals (not shown) that are supplied to the target system 160 from one or more inference automaton tomograph components (not shown) of one or more decision modules 124, and determine a corresponding update to apply to the overall system model 145 of the target system, although such operations are not illustrated in FIG. 1C.

The target system 1 in this example includes various control elements 161 that the automated control system 122 may manipulate, and in this example each decision module 124 may have a separate group of one or more control elements 161 that it manipulates (such that decision module A 124a performs interactions 169a to perform control actions A 147a on control elements A 161a, decision module B 124b performs interactions 169b to perform control actions B 147b on control elements B 161b, and decision module N 124n performs interactions 169n to perform control actions N 147n on control elements N 161n). Such control actions affect the internal state 163 of other elements of the target system 1, including optionally to cause or influence one or more outputs 162. As operation of the target system 1 is ongoing, at least some of the internal state information 163 is provided to some or all of the decision modules to influence their ongoing control actions, with each of the decision modules 124a-124n possibly having a distinct set of state information 143a-143n, respectively, in this example.

As discussed in greater detail elsewhere, each decision module 124 may use such state information 143 and a local sub-model 145x of an overall system model for the target system to determine particular control actions 147 to next perform, such as for each of multiple time periods, although in other embodiments and situations, a particular automated control system may perform interactions with a particular target system for only one time period or only for some time periods. For example, the local CDD Control Action Determination component 144 for a decision module 124 may determine a near-optimal local solution for that decision module's local model 145, and with the local CDD Coordinated Control Management component 146 determining a synchronized consensus solution to reflect other of the decision modules 124, including to update the decision module's local sub-model 145 based on such local and/or synchronized solutions that are determined. Thus, during execution of the automated control system 122, the automated control system performs various interactions with the target system 160, including to request state information, and to provide instructions to modify values of or otherwise manipulate control elements 161 of the target system 160. For example, for each of multiple time periods, decision module 124a may perform one or more interactions 169a with one or more control elements 161a of the target system, while decision module 124b may similarly perform one or more interactions 169b with one or more separate control elements B 161b, and decision module 124n may perform one or more interactions 169n with one or more control elements N 161n of the target system 160. In other embodiments and situations, at least some control elements may not perform control actions during each time period. One or more inference automaton tomograph components may further perform active excitation activities during such control of the target system 160, such as to determine and subsequently use information about a current internal state of the target system, although activities related to such inference automaton tomography are not illustrated in the example of FIG. 1C.

In addition, while example target system 2 170 of FIG. 1B is not illustrated in FIG. 1C, further details are illustrated for decision module 128 of automated control system 126 for reference purposes, although such a decision module 128 would not typically be implemented together with the decision modules 124 controlling target system 1. In particular, the deployed copy of automated control system 126 includes only the single executing decision module 128 in this example, although in other embodiments the automated control system 126 may include other components and functionality. In addition, since only a single decision module 128 is implemented for the automated control system 126, the decision module 128 includes a local CDD Control Action Determination component 184, any may optionally further include a local CDD Inference Automaton Tomography component (not shown), but does not in the illustrated embodiment include any local CDD Coordinated Control Management component, since there are not other decision modules with which to synchronize and interact.

While not illustrated in FIGS. 1B and 1C, the distributed nature of operations of automated control systems such as those of 122 allow partially decoupled operations of the various decision modules, include to allow modifications to the group of decision modules 124 to be modified over time while the automated control system 122 is in use, such as to add new decision modules 124 and/or to remove existing decision modules 124. In a similar manner, changes may be made to particular decision modules 124 and/or 128, such as to change rules or other restrictions specific to a particular decision module and/or to change goals specific to a particular decision module over time, with a new corresponding model being generated and deployed within such a decision module, including in some embodiments and situations while the corresponding automated control system continues to control operations of a corresponding target system. As one example, at least some such modifications may reflect operations of one or more inference automaton tomograph components to improve a model of a target system (or a model for a particular target system subset that includes one or more respective control elements of the target system and optionally other respective internal elements of the target system) at one or more times, including to automatically learn and provide updates about an internal state model determined for the target system from generated excitation signals (whether automatically or in response to additional user instructions or interactions) that is used to update and produce the improved target system model for further use. In addition, while each automated control system is described as controlling a single target system in the examples of FIGS. 1B and 1C, in other embodiments and situations, other configurations may be used, such as for a single automated control system to control multiple target systems (e.g., multiple inter-related target systems, multiple target systems of the same type, etc.), and/or for multiple automated control systems to operate together to control a single target system, such as by each operating independently to control different portions of that target control system. It will be appreciated that other configurations may similarly be used in other embodiments and situations.

For illustrative purposes, some embodiments are described below in which specific types of data is gathered and used in particular manners to perform specific types of control actions for specific types of target systems, including via active excitation and corresponding measurement of particular types of components. However, it will be understood that such described techniques may be used in other manners in other embodiments, including with other types of target systems and active excitation techniques, and that the invention is thus not limited to the exemplary details provided.

As noted above, in at least some embodiments, the model of a target system to be controlled is encoded as a data Hamiltonian model that is a function of three types of variables (state variables, momentum variables and control variables), and is composed of three additive elements (the physical model, the constrained model and the learned model). The physical and constrained models are determined respectively by the physical principles characterizing the system and operational requirements. The learned model is generated by the Inference Automaton Tomograph component from the active sensor signals. In particular, the three types of variables used in the function for the data Hamiltonian model include a vector defining the state of the battery, a vector defining the momentum of the battery, and a vector of action variables that control the battery. The three additive elements that compose the data Hamiltonian model include three Hamiltonians ($H_0$, $H_C$ and $\Delta H_{TOMOF}$), where $H_0$ is the physical Hamiltonian of the battery, $H_C$ is the constrained Hamiltonian representing the known operational and requirement constraints, and $\Delta H_{TOMOF}$ is the learned Hamiltonian as a function of collecting data from the active sensors, with the total Hamiltonian model in the following form:

$$H_T = H_0 + H_C + \Delta H_{TOMOF}.$$

$H_0$ and $H_C$ are determined from stored operational rules and historical data of the battery. The total Hamiltonian model $H_T$ has the same properties of the Hamiltonian of classic mechanics, but adapted to electrical devices. In addition to the total Hamiltonian model $H_T$ that characterizes the dynamic target system, a control system implemented by the described techniques may in some embodiments use a specified desired behavior Hamiltonian $H_D$, which reflects the desired behavior of the system under control, and affects the dynamics of the control signal produced by the control system.

The total Hamiltonian model $H_T$ encodes the evolution of the battery system under control, with the evolution represented in the form of the extended Hamilton Jacobi equations, as follows:

$$\frac{dq(t)}{dt} = \frac{\partial H_T}{\partial p(t)}$$

$$\frac{dq(t)}{dt} = -\frac{\partial H_T}{\partial p(t)}$$

$$\frac{du(t)}{dt} = -\Gamma * \frac{\partial}{\partial u}\left(\frac{d(H_T - H_D)^2}{dt}\right)$$

where q(t) is the state vector of the battery being learned, p(t) is their momentum, and u(t) is the control action vector. The first two equations are classic evolution equations of the dynamics of the dynamic target system, and the last equation describes control of the battery on the DC side to satisfy constraints and approximate the desired behavior represented by $H_D$. The parameter $\Gamma$ is an empirical parameter to ensure stability of the control system.

Turning now to FIGS. 2A-2G, these figures illustrate examples of performing inference automaton tomography techniques to determine a current internal state of a battery via corresponding excitation and analysis activities, in order to improve a total system model of the battery and use it to perform further automated control of DC power from the battery.

Figure 2A:
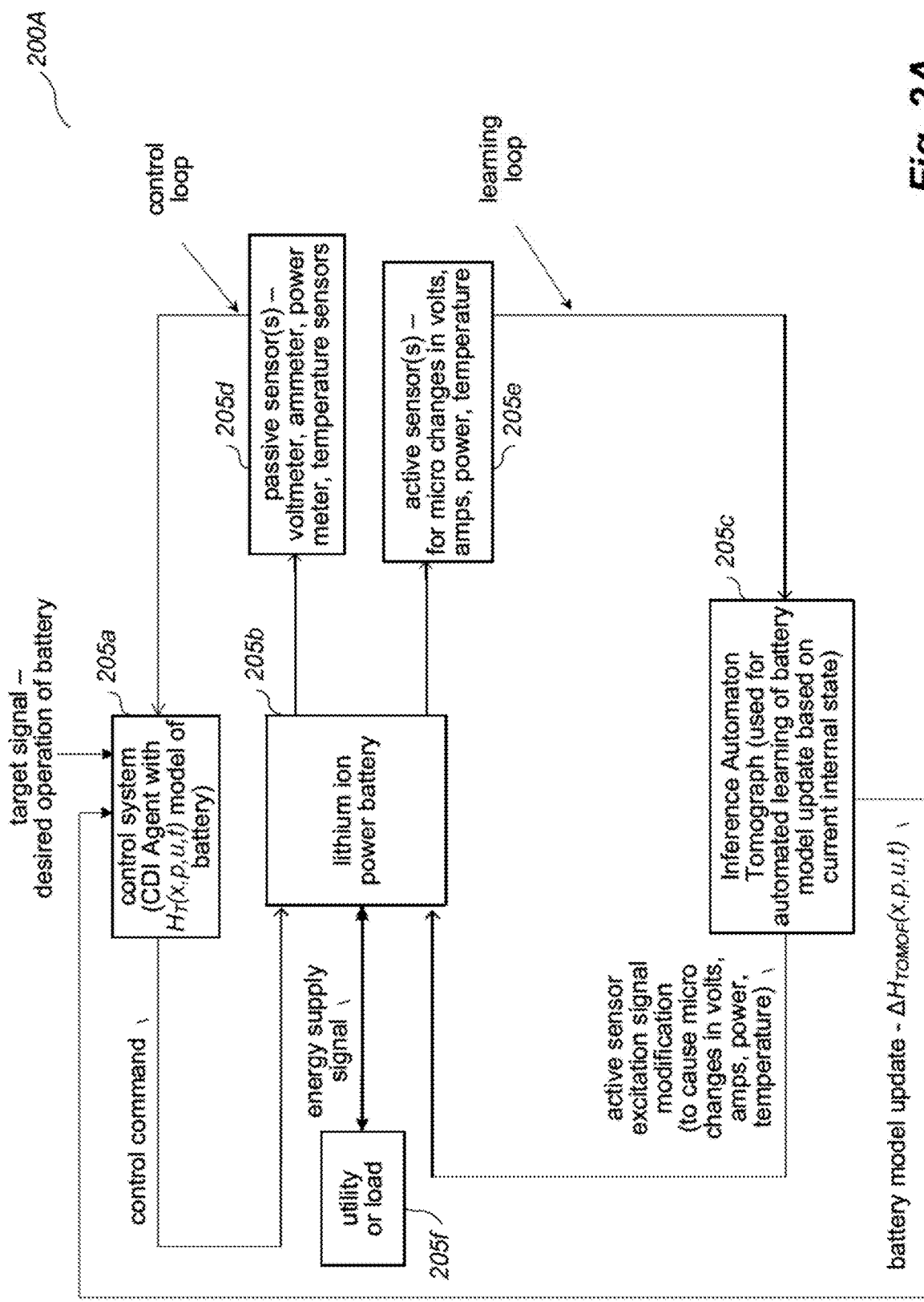
FIGS. 2A-2G illustrate examples of performing inference automaton tomography techniques to determine a current internal state of a battery via corresponding excitation and analysis activities, in order to improve a total system model of the battery and use it to perform further automated control of DC power from the battery.

FIG. 2A has similarities to FIG. 1A, but further illustrates the use of the inference automaton component to control use of a lithium ion battery system, such as to use the inference automaton tomograph component to perform active excitation of the battery to learn information about an internal state of the battery. For example, in at least some embodiments involving a physical target system that includes one or more batteries used to store and provide electrical power, the automated operations to control the target system may include using characteristics of each battery's state to perform automated control of DC (direct current) power that is provided from the battery—in some such embodiments, such control may include using a DC-to-DC amplifier (e.g., a field-effect transistor, or FET, amplifier) connected to the battery to control an amount of electrical current and/or voltage being output from the battery (e.g., in a real-time manner and to optimize long-term operation of the battery), although such an amplifier is not illustrated in FIG. 2A. Such a DC-to-DC amplifier may, for example, be part of a buck converter (or step-down converter) that steps down voltage while stepping up current from its input (supply) to its output (load) and/or be part of a boost converter (or step-up converter) that steps up voltage while stepping down current from its input (supply) to its output (load), referred to generally at times herein as a "boost/buck controller" or "buck/boost controller". In addition, in some embodiments and situations, multiple batteries may be controlled in such a manner by using multiple control modules that are each associated with one of the batteries, and with the overall control of the multiple batteries being coordinated in a distributed manner, such as based on interactions between the multiple associated control modules for the multiple batteries. A system that includes one or more batteries to be controlled may further include additional components in some embodiments and situations, such as one or more electrical sources and/or one or more electrical loads, with one non-exclusive example of such a type of system being one or more home or business electrical power systems that may optionally include electrical generation sources (e.g., solar panels, wind turbines, etc.) as well as electrical load from the house or business.

As part of controlling use of a lithium ion battery system in FIG. 2A, various illustrated components interact to control operations of the battery according to one or more defined goals in light of defined constraints, rules and other criteria, as discussed elsewhere herein. In some embodiments, the automated activities to control the battery may be performed in a real-time manner and/or to optimize long-term operation of the battery (e.g., the life of the battery), while satisfying as many external requests for power (e.g., from a utility or other load 205f to which the battery can supply power) as is possible (e.g., at least a defined percentage or quantity of such requests)—for example, the control system 205a may attempt to fully or partially satisfy a request from the utility for power in a real-time manner if the request can be satisfied in a way that also satisfies other constraints on the battery performance given the current state of the battery and the defined goal(s), such as to enable the battery to operate in a desired non-saturation range or level (e.g., with respect to an internal temperature of the battery and/or internal chemistry of the battery). In addition, the control commands sent from the control system 205a to battery 205b may have various forms in various embodiments, such as to specify an amount of power to be generated as DC output of the battery, and/or for the battery to receive electrical power from one or more sources (not shown) to be stored for later use (e.g., at different time periods, or otherwise at different times). The specified power amount to be generated may include information indicating, for example, to increase or decrease the power being output by a specified amount, or to not change the power output. The output of the battery may serve to provide power to one or more loads 205f (e.g., an electrical grid associated with the utility), and in at least some embodiments may be connected to an inverter/rectifier component (not shown) to convert the power output of the battery to AC power to support corresponding loads—such an inverter may, for example, control power being provided from the battery by regulating voltage and/or frequency of the AC power. Similarly, input of the battery may serve to receive power from one or more sources (not shown), and in at least some embodiments may be connected to an inverter/rectifier component (not shown) to convert AC power input from the sources to DC power for the battery—such a rectifier may, for example, control power being provided to the battery by regulating voltage and/or frequency of the AC power.

In the illustrated example of FIG. 2A, a control system 205a is using two loops (a control loop and a learning feedback loop) to control operation of a lithium ion power battery 205b. The control loop has the functionality to drive the battery system to a desired dynamic behavior, which in this example depends on two pieces of information, with a target signal telling the control system 205a the current desired battery output or other battery operation, and the control system using a current total Hamiltonian model $H_T$ that characterizes the battery system being controlled. The command signal generated by the control system represents actions for the battery to perform to satisfy the operational constraints (e.g., to protect the battery and extend battery life) and desired dispatch considerations (e.g., as dictated by a utility or other load 205f requesting power from the battery). The energy supply signal is either an output power signal generated by the battery and sent to the utility or load 205f, or an input power signal for charging the battery from the utility or load. In addition the passive sensor suite 205d provides feedback information about the current system operation to the control system.

The learning feedback loop, which includes an inference automaton tomograph component 205c that is acting as an active learning device, uses a suite of active sensors 205e that provide information about the current status of the battery system. These active sensors are driven in this example by a low voltage variable high frequency suite, called the excitation suite, whose signals interact with internal dynamics of the battery system in a non-demolition form. That is, the active sensor signal is designed to provide internal information about dynamics of the battery without causing significant changes on the control loop of the system.

In this example, the inference automaton tomograph generates an active sensor excitation suite, which is a set of signals that affects the battery system slightly to generate information about the current internal status of the battery. The active sensor suite 205e then receives information about the battery and generates resulting signals that are fed to the inference automaton tomograph component and that contain information about internal dynamics of the battery system at the current time. This information is processed by the inference automaton tomograph component to generate a corrective $\Delta H_{TOMOF}$ model for use in updating the total Hamiltonian model $H_T$ used by the control system 205a, and which is a function of the battery system state, the battery system momentum and the control command at current time. This corrective model is provided to the control system 205a as a model update used to update the current total Hamiltonian model $H_T$. As one non-exclusive example, the active sensor excitation signals may include a pulsed voltage signal that is supplied to the battery, with a corresponding active sensor measuring the resulting voltage signal from the battery to identify changes (if any) between the resulting voltage signal and the input (e.g., with respect to frequency, amplitude, etc.). If the identified changes are below a defined threshold, the frequency of the excitation signal continues to be modified until it has sufficient resonance with the internal battery state (e.g., chemistry, temperature, etc.) that such resulting changes exceed the defined threshold, with those resulting changes then analyzed to identify corresponding internal state information that is associated with such changes. Such analysis may include using a model of the internal state that associates different internal state conditions with different types of changes, such as with the internal state model being automatically learned before runtime during a training phase (e.g., using machine learning), being constructed from information obtained using a test battery system whose internal state is measured while corresponding changes in excitation signal results are measured, being manually specified, etc.

The feedback provided by the learning loop is used in this example embodiment to maximize useful lifetime of the battery by controlling the DC side of the battery. The target signal to the control system 205a represents a desired power delivery of the battery (or receipt by the battery) and information about longevity targets. The control system uses dynamics information from the current status of the battery, such as given by voltage and current sensors, to determine control commands provided to the battery (e.g., whether to supply or receive power, how much power to supply, etc.). To maximize the useful lifetime, the control system also uses information about the model changes of the battery as a function of level of charge, demand, temperature, etc., as well as information about the availability of ions and electrochemical activity within the battery, which is obtained from the learning loop and encoded in the incremental Hamiltonian function model update generated by the inference automaton tomograph component. This information is obtained by injecting excitation signals at the anode and the cathode of the battery, such as by using a signal with a frequency around the resonant of the chemical reactions around the anode and the cathode of the battery (e.g., a frequency varying around 440 KHZ±20%, or a range of 352-528 KHZ, with a voltage magnitude of approximately 1 millivolt, such as in a range of 0.5 millivolts to 1.5 millivolts).

In this example, the control system uses an actuator for actively controlling the impedance that the battery system "sees". The battery output (charging or discharging) is optimized for factors such as load satisfaction and/or longevity, with economic factors also optionally used. The impedance actuator (not shown in FIG. 2A) may be directly controlled by the control system and in series with the battery, such that the impedance is decreased when more power is desired from the battery, and is increased when less power is desired. In at least some embodiments, the impedance is implemented electronically with switches that do not to increase the dissipation.

With respect to an initial model of the battery that is used by the control system 205a, before model updates from the Inference Automaton Tomograph 205c cause the current version of the model to structurally change, the initial model may in some embodiments be a generic battery model that is applicable to any type of battery, while in other embodiments an initial battery model may be used that is specific to a type of the battery (e.g., a type of chemical reaction used to store and/or generate electricity, such as lithium ion or nickel cadmium), while in yet other embodiments an initial battery model may be used that is designed and/or configured specifically for the particular battery in use. Thus, such an initial battery model that is initially employed in a particular system with a particular battery may be updated over time, such as to reflect improvements to the underlying structure of the model—when updating a model to a particular battery and/or system, the updating operations may in some embodiments be performed initially in a learning phase before using the automated control system to control the battery, and/or in some embodiments may be performed continuously or periodically while the automated control system is controlling the battery (e.g., to reflect changes over time in an impedance profile of the battery). Additional details are included elsewhere herein regarding such models, including their construction and use. In addition, in some embodiments the control agent may be implemented as multiple separate components (e.g., with a battery controller sub-component implemented in whole or in part in hardware and/or firmware that is attached to the battery or otherwise at a location of the battery, and with other portions of the control agent implemented in part by software instructions executing on one or more computing systems remote from the battery location and optionally communicating with the battery controller over one or more intervening computer networks), while in other embodiments the control agent may be implemented as a single component (whether at the location of the battery or remote from it). Similarly, while in some embodiments the inference automaton tomograph component and control agent may be implemented as separate components (e.g., with the tomograph component implemented in whole or in part at the location of the battery, and/or in whole or in part at a remote location), in other embodiments the control agent and tomograph component may be implemented as a single component (whether at the location of the battery or remote from it). Further details regarding operation of the control agent to determine operations to take for the battery are discussed in greater detail below.

While the operation of the tomograph component in FIG. 2A may be performed only once in some embodiments and situations, such as to learn updates for the battery state that were not reflected in the structure of the initial model, in other embodiments the tomograph component may be used in a similar manner multiple times (e.g., periodically, continuously or substantially continuously, etc.), such as to continue to improve the control agent over time (e.g., to structurally adapt the control agent to changes that occur to the system over time, such as the addition and/or removal and/or modification of one or more loads, the addition and/or removal and/or modification of one or more sources, changes to the internal state and operational characteristics of the battery 210, changes to one or more other elements, etc.).

In addition, while not illustrated with respect to FIG. 2A, in some embodiments multiple batteries (e.g., tens, hundreds, thousands, millions, etc.) may each have an associated control agent that controls actions of that battery in a similar manner, and with the various batteries acting together in a coordinated manner to supply aggregate power to the utility or to other entities. In such embodiments, the utility or other external entity may send synchronization and monitoring signals for use by the various systems including the batteries, and the multiple control agents associated with the various batteries may interact to exchange information and maintain at least partial coordination between the operations of the batteries.

Some further aspects of performing automated operations to control such a target system with one or more batteries and/or other types are target systems are included in U.S. patent application Ser. No. 15/096,091, filed Apr. 11, 2016 and entitled "Using Battery DC Characteristics To Control Power Output;" and in U.S. patent application Ser. No. 15/410,647, filed Jan. 19, 2017 and entitled "Using Sensor Data To Assist In Controlling A Target System By Modeling The Functionality Of The Target System," which claims the priority benefit of U.S. Provisional Patent Application No. 62/336,418, filed May 13, 2016 and entitled "Using Sensor Data To Assist In Controlling A Target System By Modeling The Functionality Of The Target System;" each of which is hereby incorporated by reference in its entirety.

In at least some embodiments, initial modeling of a state of a target system is performed using one or more data Hamiltonian functions, and the described techniques include using inference automaton tomographic techniques to update and improve the data Hamiltonian function(s) (e.g., in order to complete an underlying Hamiltonian-based model) based on analysis of one or more types of sensor data. A CDD system controlling such a target system may, in at least some embodiments and situations, implement multiple CDD decision modules or sub-systems (also referred to at times herein as CDI, or Collaborative Distributed Inferencing, control agents, such that a particular embodiment of the CDD system with one or more such CDI control agents may be referred to as a CDI system) to distribute the control and management through an agent-based network with synchronization via a mean field Hamiltonian approach, such as with each agent characterized by a data Hamiltonian that defines the dynamics and interaction of one or more corresponding components in the target system, and with each such data Hamiltonian of an agent being dynamically computed from sensory data and actions. Such a data Hamiltonian (for a single target system component) and/or mean field Hamiltonian (for multiple coordinated target system components) can be thought of as a mathematical function that helps navigate a query through huge bodies of information by defining a spectrum of possible outcomes, including to model history, current situation and possible options. Non-exclusive example embodiments using such techniques are further described herein, but it will be appreciated that other embodiments may differ in one or more manners from these example embodiments.

A data Hamiltonian may be implemented as a function that captures the flow and interdependence of a data domain, and may have three types of variables (e.g., state variables, flow variables, and decision or control variables). A CDI control agent may be implemented as an optimization-based inference automaton engine operating in a data domain that belongs to a multi-data domain, with agent optimization functionality encoded in the agent's Hamiltonian. The CDD system may be implemented as a formal, distributed inference automaton rule-based optimization process for resolving time-based queries from a distributed agent based domain in real-time. A CDI control agent of the CDD system may be implemented using Horn clause rules of three types, as follows: absolute rules that characterize the physics of a physical target system being controlled (or otherwise describe unchangeable rules in other types of target systems), and have truth value equal to true in any Hamiltonian realization (e.g., a value of 0 for false or 1 for true); hard rules that characterize the desired behavior and goals, and have truth value equal to true in any Hamiltonian realization (e.g., a value of 0 for false or 1 for true); and soft rules that characterize the empirical knowledge of the operation, heuristic strategies, economic dispatch, and response to anomalies and learning strategies, and have a variable, probabilistic truth value in [0,1], as well as an associated confidence value for that variable, probabilistic truth value in some embodiments. Meta-rules are special kinds of soft rules used to transform sensory data and desired behavior into constraint data Hamiltonians. Soft rules can be thought of as being used to navigate queries through "gradients" (information that is neither true nor false), as a means of identifying what areas of data are pertinent to any given query. Thus, such rules for a CDI control agent define the constraints for a data Hamiltonian for the agent, and may be converted to a constraint optimization problem that a corresponding CDD system solves. For example, such conversion may include the following: transform truth values {0,1} to a [0,1] interval; transform variables and parameters to continuous variables and parameters; transform absolute rules to equality constraints; transform hard rules to equality constraints; transform soft rules to inequality constraints; transform inclusion sets to functional forms; transform algorithms to differential equations; etc.

Some further aspects of implementing such techniques for modeling target systems and performing automated operations to control such target systems, including in a distributed manner using multiple agents, are included in U.S. patent application Ser. No. 14/746,738, filed Jun. 22, 2015 and entitled "Cooperative Distributed Control Of Target Systems;" in U.S. Patent Application No. 62/182,968, filed Jun. 22, 2015 and entitled "Applications Of Cooperative Distributed Control Of Target Systems;" in U.S. Patent Application No. 62/182,796, filed Jun. 22, 2015 and entitled "Gauge Systems;" and in international PCT Patent Application No. PCT/US2015/037022, filed Jun. 22, 2015 and entitled "Cooperative Distributed Control Of Target Systems," each of which is hereby incorporated by reference in its entirety.

Figure 2B:
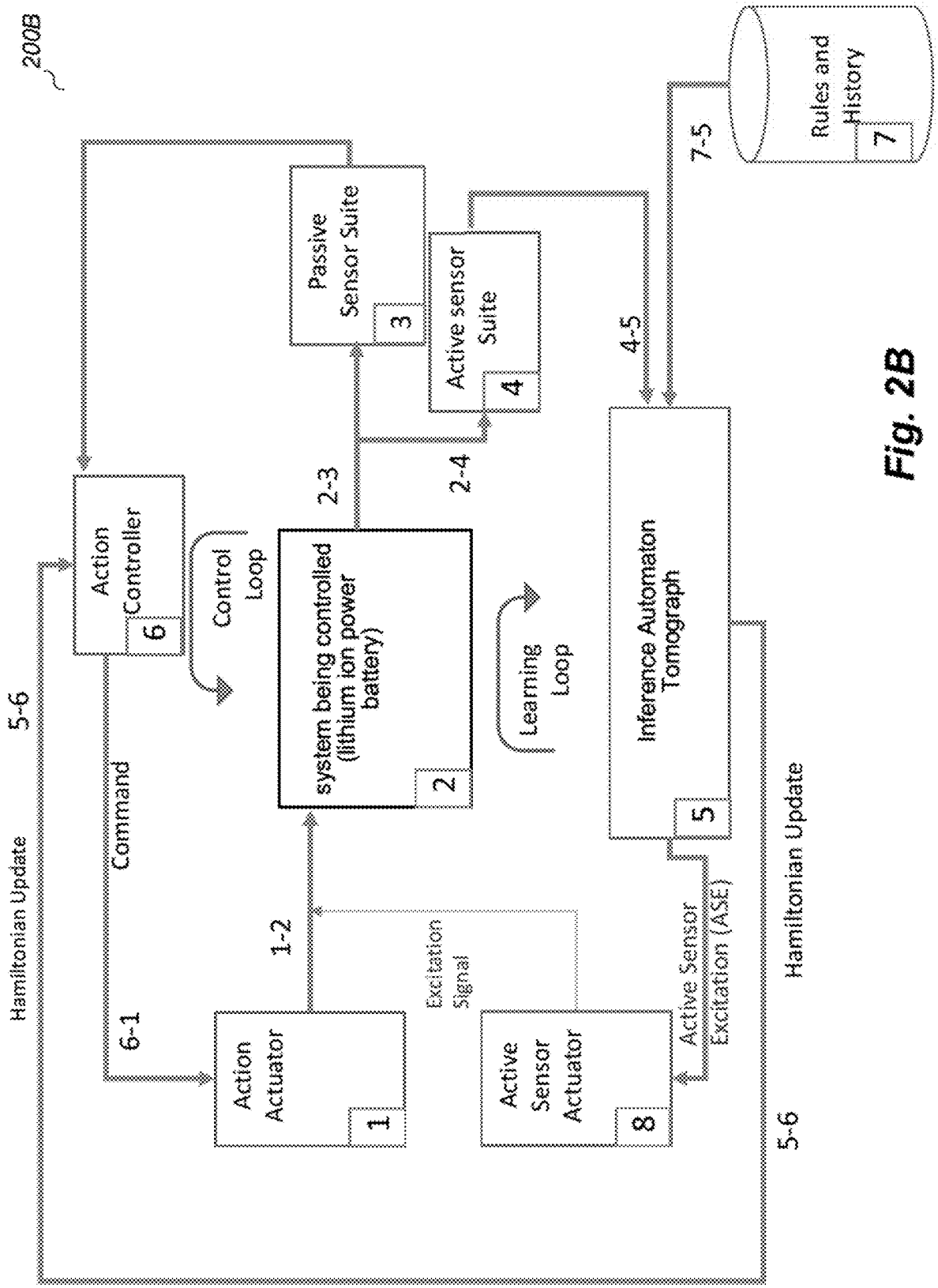

FIG. 2B continues the example of FIG. 2A, and provides additional details about the control and learning feedback loops discussed with respect to FIG. 2A. FIG. 2B illustrates components that include an action actuator 1 (e.g., part of or controlled by the control system 205a of FIG. 2A), a system 2 being controlled (e.g., the battery 205b of FIG. 2A), a passive sensor suite 3 (e.g., the passive sensors 205d of FIG. 2A), an active sensor suite 4 (e.g., the active sensors 205e of FIG. 2A), an Inference Automaton Tomograph component 5 (e.g., the interference automaton tomograph 205c of FIG. 2C), an action controller 6 (e.g., part of or controlled by the control system 205a of FIG. 2A), rules and history information 7 (e.g., part of or accessed by the interference automaton tomograph 205c of FIG. 2C), and an active sensor actuator 8 (g., part of or controlled by the interference automaton tomograph 205c of FIG. 2C).

The components of FIG. 2B operate as follows in this example embodiment. Action actuator 1 is a hardware device that connects directly to the battery system being controlled (e.g., is executed by a SCADA, or Supervisory Control And Data Acquisition, system). Battery system 2 is being controlled, but the state of the system that is used in the Hamiltonian (p and q) is not directly observable. Passive sensor suite 3 contains sensory devices such as voltmeter, ammeter, power meter and temperature sensors. Active sensor suite 4 includes a hardware system with high frequency low voltage sensory signal generators as a function of measured high frequency low voltage responses from the battery system, with the active sensors responding to high frequency excitations generated by the Inference Automaton Tomograph component 5 via the active sensor actuator 8. The Inference Automaton Tomograph component 5 manages operations of the learning feedback loop in order to update the total system model used by the control system, with FIG. 2C providing further details regarding an example embodiment of the Inference Automaton Tomograph component. The action controller 6 generates a command signal or signals to the action actuator to drive the battery (or other electrical device being controlled) to a desired behavior, using the total Hamiltonian model $H_T$ at the current time (which is updated periodically by the Inference Automaton Tomograph), with FIG. 2D providing further details regarding an example embodiment of the action controller component. The rules and history 7 includes data that describes the base total Hamiltonian model $H_T$ of the battery (or other system being controlled), such as based on rules describing the system operation but without updates from the learning feedback loop to reflect an actual current state of the battery (or other system being controlled). The active sensor actuator 8 receives the active sensor excitation signal from the Inference Automaton Tomograph 5, and then supplies the battery (or other system being controlled) with excitation signals to provide resulting output signals used by the active sensor suite 4 for the learning loop.

Figure 2C:
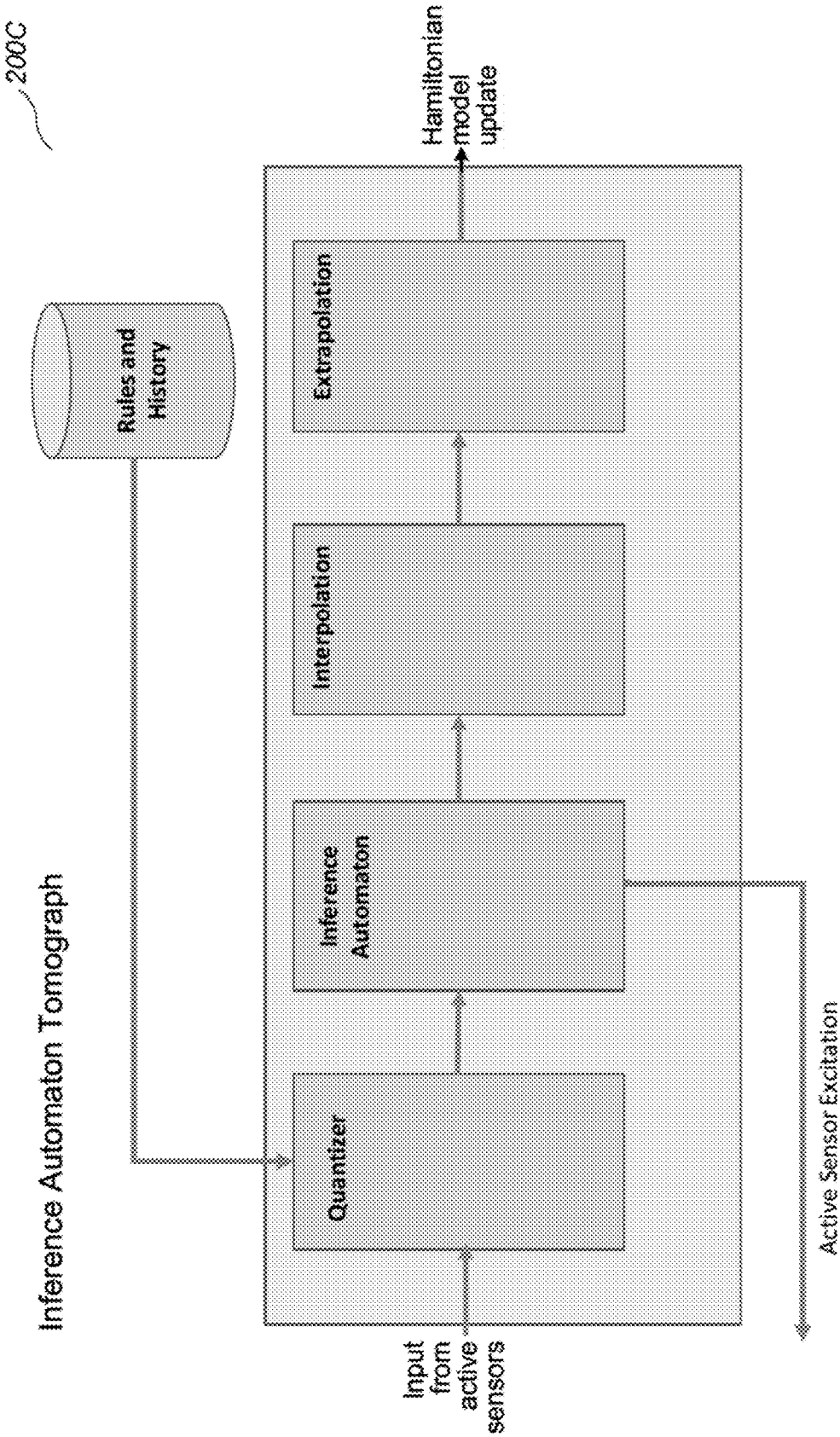

FIG. 2C continues the examples of FIGS. 2A-2B, and provides further details regarding an example embodiment of the Inference Automaton Tomograph component. In this example embodiment, the active sensor data and rules and history data of the battery system are quantized to discrete levels that are determined by the precision of the sensors and the stored data. The quantized vector is fed to the Inference Automaton sub-component, which infers from the quantized vector history to generate feasible infinitesimal state, momentum and control values. These infinitesimal data are extrapolated to generate estimates of the Hamiltonian model update for tuning the total Hamiltonian model of the battery system. The incremental Hamiltonian model update generated by the Inference Automaton Tomograph is a function of the state, the momentum and the control at the current time (not a signal, but a function).

Figure 2D:
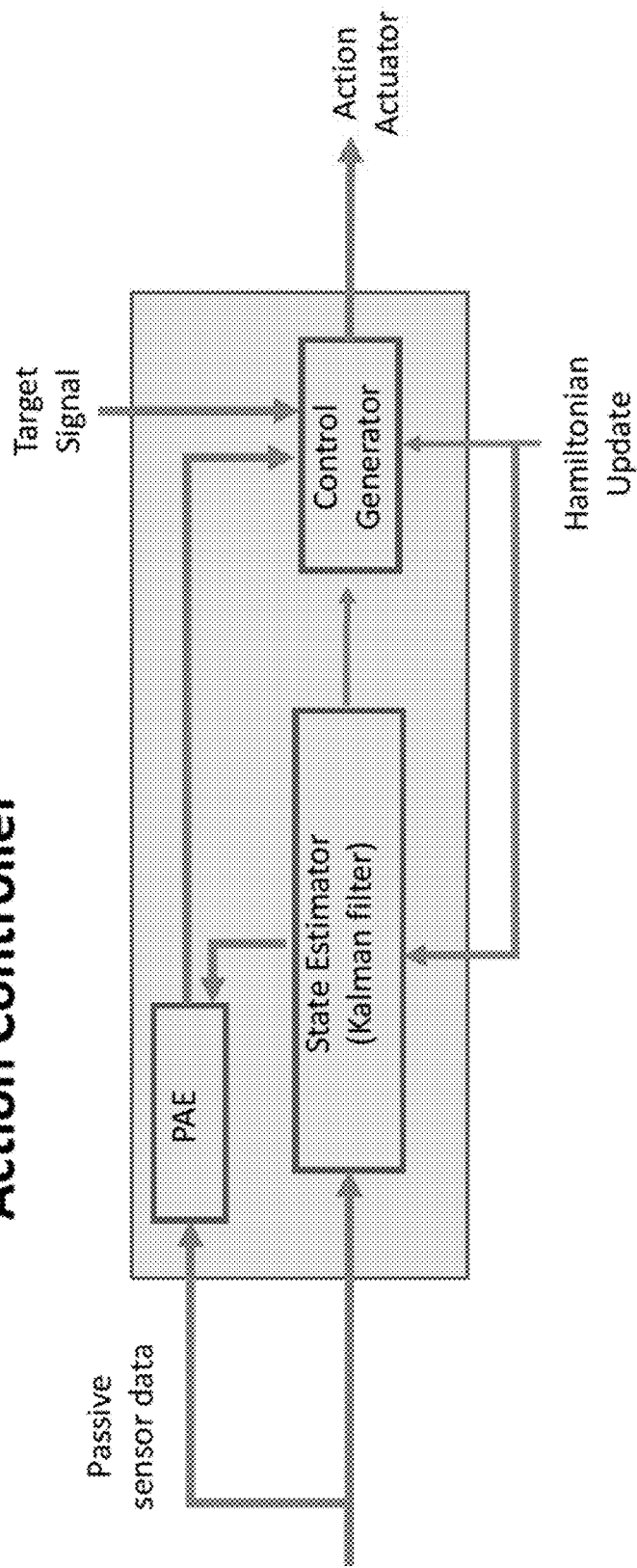

FIG. 2D continues the examples of FIGS. 2A-2C, and provides further details regarding an example embodiment of the action controller component. In this example embodiment, the action controller has three elements. In particular, the state estimator element gets current information from the passive sensor signal suite and the updated total Hamiltonian model $H_T$, and estimates the state of the system. The estimated state is fed to the control generator element and to the Parameter Adaptation Engine (PAE) element. The control generator element generates action actuator commands as a function of the target signal, while the parameter adaptation engine periodically tunes the parameters of the evolution equations to match the sensor variability to the parameter evolution equations.

With respect to constructing the Inference Automaton Tomograph, in some embodiments the first step in the construction process is to establish active sensor equations, which are of the form $$y_i(t) = \psi_i(\delta q(t), \delta p(t), \delta u(t), v_i(t)) \text{ for } t = t_0, t_0 - \delta, \ldots, t_0 - k\delta, i = 1, \ldots, m$$

where δq(t) is infinitesimal state, p(t) is infinitesimal momentum, δu(t) infinitesimal control, $v_i(t)$ is a sensor excitation signal of the $i^{st}$ sensor in the sensor suite, m is total number of sensors, $t_0$ is the current wall clock time, and δ is the sensor update interval. Equations of this form are generated and used by the Inference Automaton Tomograph to infer the values of δq(t), δp(t) and δu(t), such as a sufficient quantity of equations to allow a level of uncertainty in the inferred values to be below a defined threshold or to satisfy one or more other defined criteria (e.g., a defined minimum quantity). Thus, the Inference Automaton Tomograph generates the excitation signal $v_i(t)$, with these sensor equations being determined using the specifications of the active sensors.

The next step is to construct the inference matrix. The entries of this matrix are inference operators represented by finite state automaton that dictate how to extract the infinitesimal values of state, momentum and control variables. Because the equations of the sensors are quantized into polynomial forms, the inference operators are rational operators for generating solutions to polynomic equations with quantized coefficients.

The next step is to construct a Kleene-Schutzenberger Equation (KSE) for executing the inference process to generate instances of infinitesimal versions of the state, momentum and control signals. The Inference Automaton Tomograph satisfies the following equation, $$\begin{array}{ccccccc}
X & = & E & \circ & X & + & T \\
\downarrow & & \downarrow & & \downarrow & & \downarrow \\
\text{Automaton} & & \text{Inference} & & \text{Apply} & & \text{Goal} \\
\text{State} & & \text{Transition} & & \text{Inference} & & \text{Vector} \\
\text{Vector} & & \text{Matrix} & & \text{to} & &
\end{array}$$

In this equation, X is a vector of equations; these equations represent the active sensor equation vector and operational rules equations.

The next step is to specify a sensor excitation generator (as discussed further below with respect to FIG. 2E), which is specified by the following set of equations. These equations define an algorithm for computing the excitation signal for each active sensor, as well as the infinitesimal samples of the state, momentum and control signals and the corresponding Hamiltonian update function.

Figure 2E:
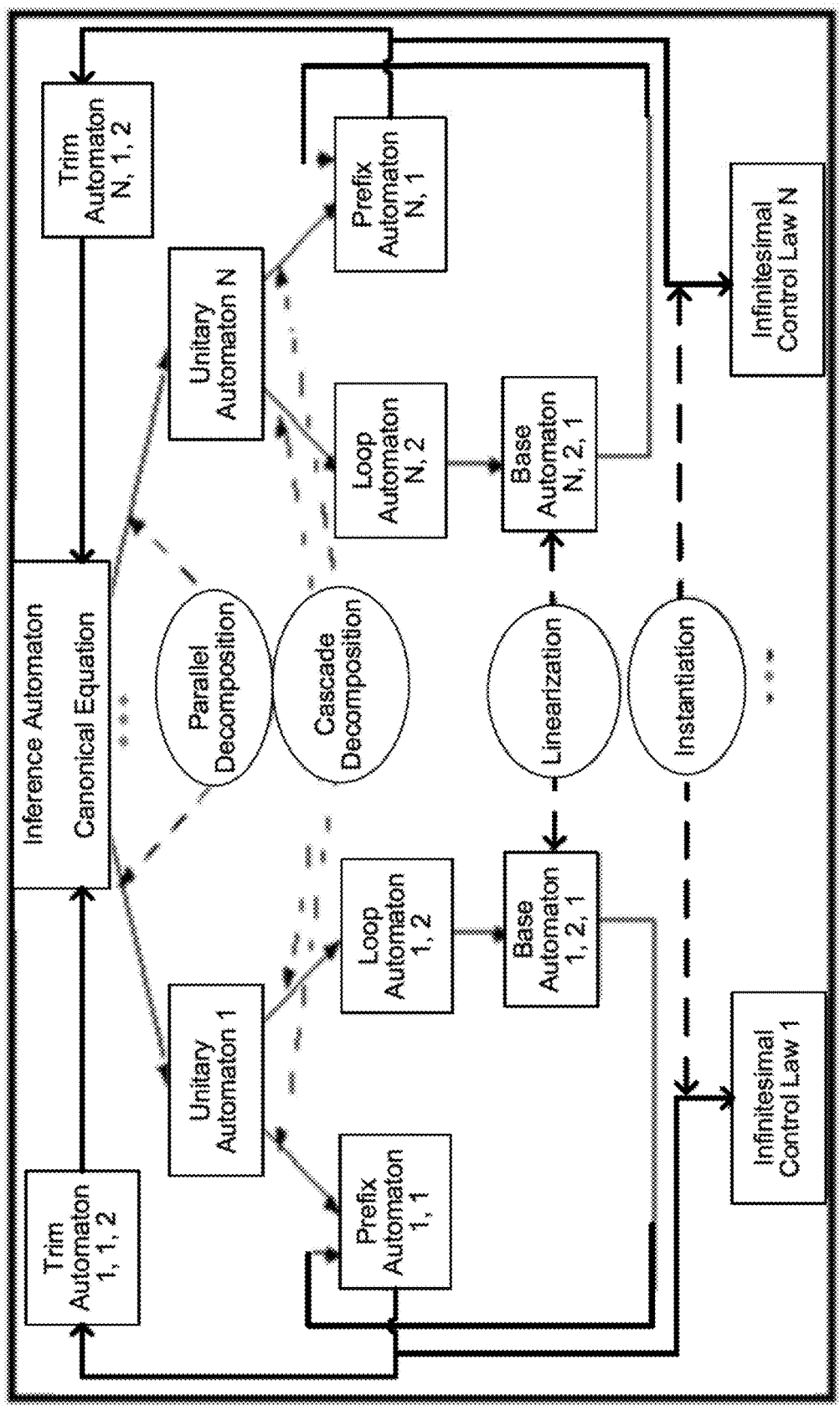

$(\delta q_t^\tau, \delta p_t^\tau, \delta u_t^\tau) =$ $\theta_t((\delta q_t^{\tau-\delta}, \delta p_t^{\tau-\delta}, \delta u_t^{\tau-\delta}), v_t^{\tau-\delta})$ State Neighborhood Transistion $v_t^\tau - \varphi_t((\delta q_t^\tau, \delta p_t^\tau, \delta u_t^\tau))$ current Excitation $Y_t^\tau = E((\delta q_t^\tau, \delta p_t^\tau, \delta u_t^\tau)) \square Y_t^\tau + K^\tau((\delta q_t^\tau, \delta p_t^\tau, \delta u_t^\tau))$ Current KSE $Y_t^{Solution}(\ ) = \lim_{\tau \to \infty} Y_t^\tau$ Fixed Point Solution -continued $h_t^{Solution}((\delta q_t, \delta p_t, \delta u_t,)) = \beta_\tau((\delta q, \delta p_t, \delta u_t))$ Infinitesimal output at $t$ $\Delta H_t(q_t, p_t, u_t) = \text{Exp}(Y_t^{Solution}(\ ))$ $(h_t^{Solution}((\delta q_t, \delta p_t, \delta u_t))$ Hamiltonian model update Extrapolation FIG. 2E continues the examples of FIGS. 2A-2D, and illustrates a technique for decomposing the Inference Automaton Tomograph into simpler automata, such as into unitary sub-automata, and each of those into unitary prefixed automata in series with unitary loop automata. In this example, each of original equations is implemented by a single sub-automaton which is unitary. Each unitary automaton is composed into a prefix automaton and a loop automaton. A prefix automaton is an automaton that has one initial state, one terminal state, and no inference transitions are issued from the terminal state. A loop automaton is an automaton with the initial state concise with the terminal state. The loop automaton is defined by a prefix automaton called base automaton. Once completing the iteration, a trim automaton is applied to each of these automata, which takes state trajectories that are not connected with a terminal state and trims them out. Similarly, inference state trajectories that are connected to an initial state are also determined and trimmed out. The resulting Inference Automaton Tomograph is a simplified accessible and co-accessible automaton which generates the infinitesimal values of the control, the state and the momentum. This algorithm corresponds to decomposition of the inference matrix of the KSE, as shown below. Equations for n sensors:

$$\begin{bmatrix} X_1 \\ \vdots \\ X_n \end{bmatrix} = \begin{bmatrix} E_{1,1} & L & E_{1,n} \\ \vdots & L & \vdots \\ E_{n,1} & L & E_{n,n} \end{bmatrix} O \begin{bmatrix} X_1 \\ \vdots \\ X_n \end{bmatrix} + \begin{bmatrix} T_1 \\ \vdots \\ T_n \end{bmatrix} \quad (1)$$

Theorem:

With respect to every sample of equations are equivalent to a 2-equations problem.

Proof:

Consider equation 1. For other equations proof is similar. Partition (1) as follows:

$$\begin{bmatrix} [X_1] \\ \begin{bmatrix} \vdots \\ X_n \end{bmatrix} \end{bmatrix} = \begin{bmatrix} [E_{1,1}] & [L \ E_{1,n}] \\ \begin{bmatrix} \vdots \\ E_{n,1} \end{bmatrix} & \begin{bmatrix} \vdots & \vdots \\ L & E_{n,n} \end{bmatrix} \end{bmatrix} O \begin{bmatrix} [X_1] \\ \begin{bmatrix} \vdots \\ X_n \end{bmatrix} \end{bmatrix} + \begin{bmatrix} [T_1] \\ \begin{bmatrix} \vdots \\ T_n \end{bmatrix} \end{bmatrix}$$

$$\begin{bmatrix} X_1 \\ X_c^1 \end{bmatrix} = \begin{bmatrix} E_{1,1} & E_{1,c} \\ E_{c,1} & E_{c,c} \end{bmatrix} O \begin{bmatrix} X_1 \\ X_c^1 \end{bmatrix} + \begin{bmatrix} T_1 \\ T_c^1 \end{bmatrix}$$

The result shown below illustrates that KSE constructed by the procedure above converges to samples of the state, momentum and control signals, and is solvable if it is Lyapunov stable and the domain has quasi-regular convergence.

$X = E \circ X + T$

Approximation to agent equation $X_{k+1} = E \circ X_k + T$ $X_1 = E \circ X_0 + T$ -continued $$X_2 = E \circ X_1 + T = E^2 \circ X_0 + E \circ T + T$$

$$\vdots$$

$$X_N = E^N \circ X_0 + \sum_{n=0}^{N-1} E^n \circ T$$

$$\text{let } E^* = \sum_{n=0}^{\infty} E^n$$

$$\text{as } N \to \infty: E^N \to 0, X_N \to X, \Rightarrow X = E^* \circ T$$
$$\qquad\qquad\quad \uparrow \qquad\quad \uparrow \qquad\qquad \uparrow$$
$$\text{Lyapunov} \quad \text{Contraction} \quad \text{Quasiregular}$$
$$\text{Stability} \quad\;\; \text{Mapping} \quad\;\; \text{Convergence}$$

Figure 2F:
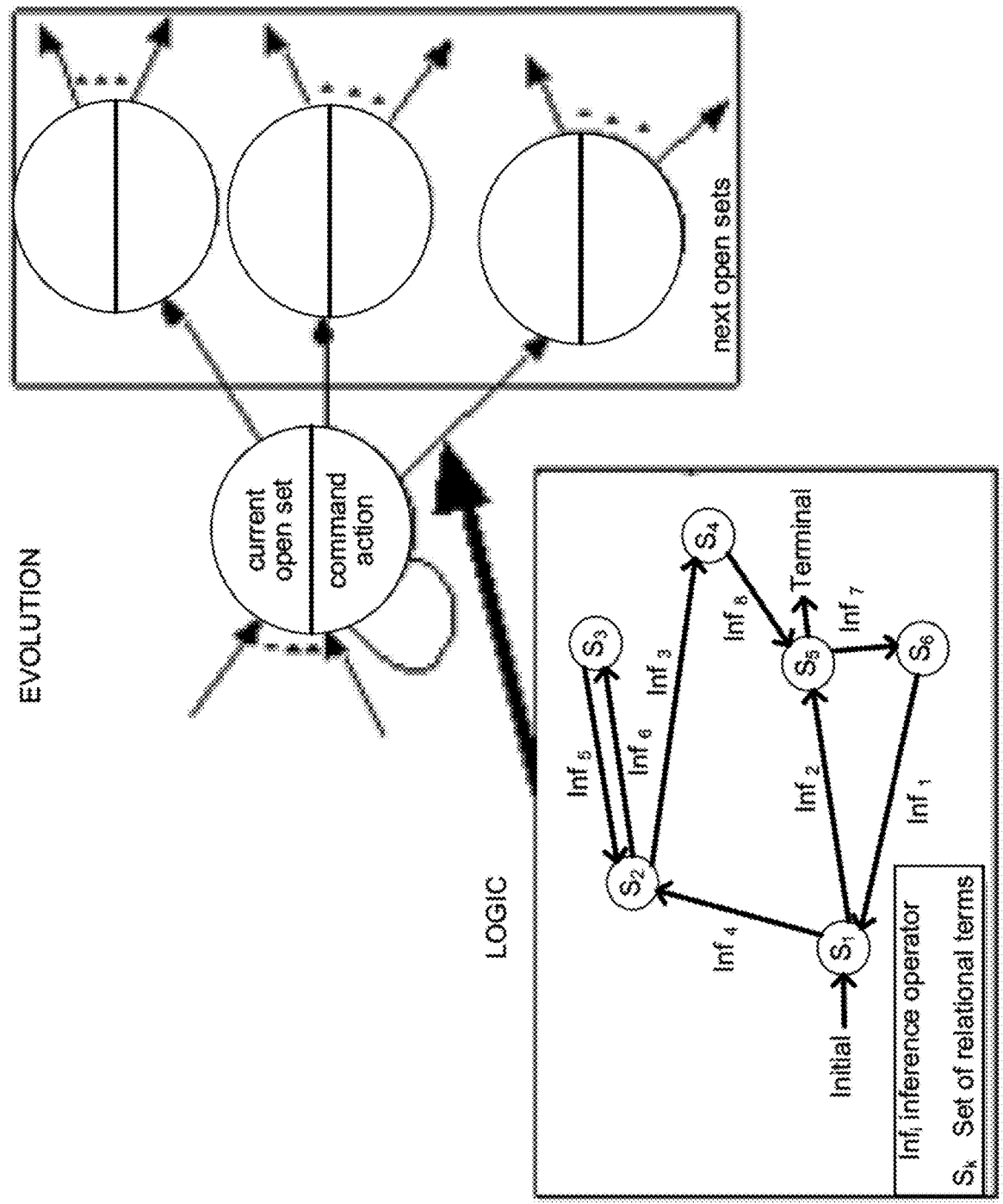

FIG. 2F continues the examples of FIGS. 2A-2E, and illustrates a transition schema that is the last step of the automaton procedure.

Figure 2G:
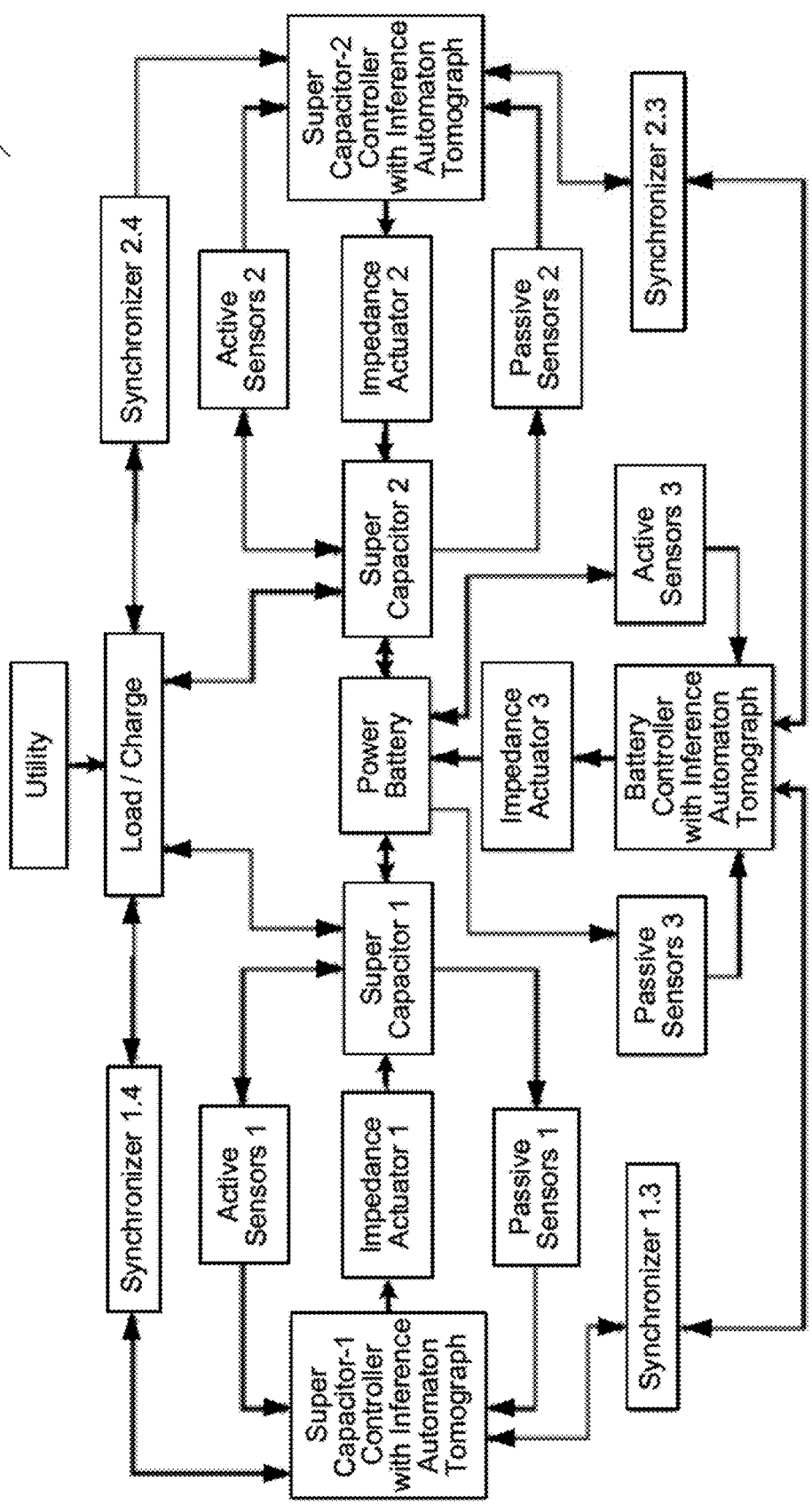

FIG. 2G illustrates an example of further using one or more Inference Automaton Tomograph components in a larger system with additional components, including one or more super capacitor components in this example. In particular, for many applications that involve battery systems, the load exhibits high speed dynamic variability, such as for batteries for assisting energy supply to train and subway systems and vehicle batteries. In those systems, the load becomes a generating system that returns energy to the source (in this case the battery system), and at start-up has a high rate of increase of the power supply to the load. Lithium ion batteries and other batteries may suffer irreversible damage when the rates of supply or charge are significantly above the average operation. To prevent this damage, the battery is encapsulated in this embodiment in a circuit with one or more super capacitor batteries, which are batteries that can operate in a regime with high power flow (both for charging and discharging).

The control system (referred to as a "controller" in this example) is used in this example embodiment to model and control one or more super capacitor batteries in a circuit with a regular lithium ion battery (e.g., battery 205b of FIG. 2A), as shown in FIG. 2G. In this example circuit, the controllers for the super capacitors and battery are affected by continuous model generation techniques of one or more Inference Automaton Tomograph components, allowing the system to operate with a high Quality Factor. The controllers interact with the batteries and super capacitors via controllable impedance actuators, which present to the device a non-dissipative average directional impedance; for high flow the average directional impedance is low, and for low flow the average directional impedance is large.

In the example of FIG. 2G, the power battery is connected to two super capacitors, to enable high-speed dynamic power to be supplied to a time-varying load. For example, a drive train in a subway generates power via dynamic braking that can be used to charge the battery or the super capacitors. At start-up time, it uses a high pulse of power which is partially returned via dynamic braking. The system shown in FIG. 2G has two super capacitors to allow the system to be generating power to a load and retrieving power from a load that is doing dynamic braking. The control system is delivered to each of the elements in this system via a local controller, which are synchronized in real time using a controller customized to operate as a synchronizer. An Inference Automaton Tomograph component is assigned to each of the controllers to generate an incremental model of the device under control.

It will be appreciated that the examples of FIGS. 2A-2G are provided for illustrative purposes and are simplified for the sake of brevity, and the inventive techniques may be used in a wide variety of other situations, including in other environments and with other types of automated control action determination techniques, some of which are discussed below.

Figure 3:
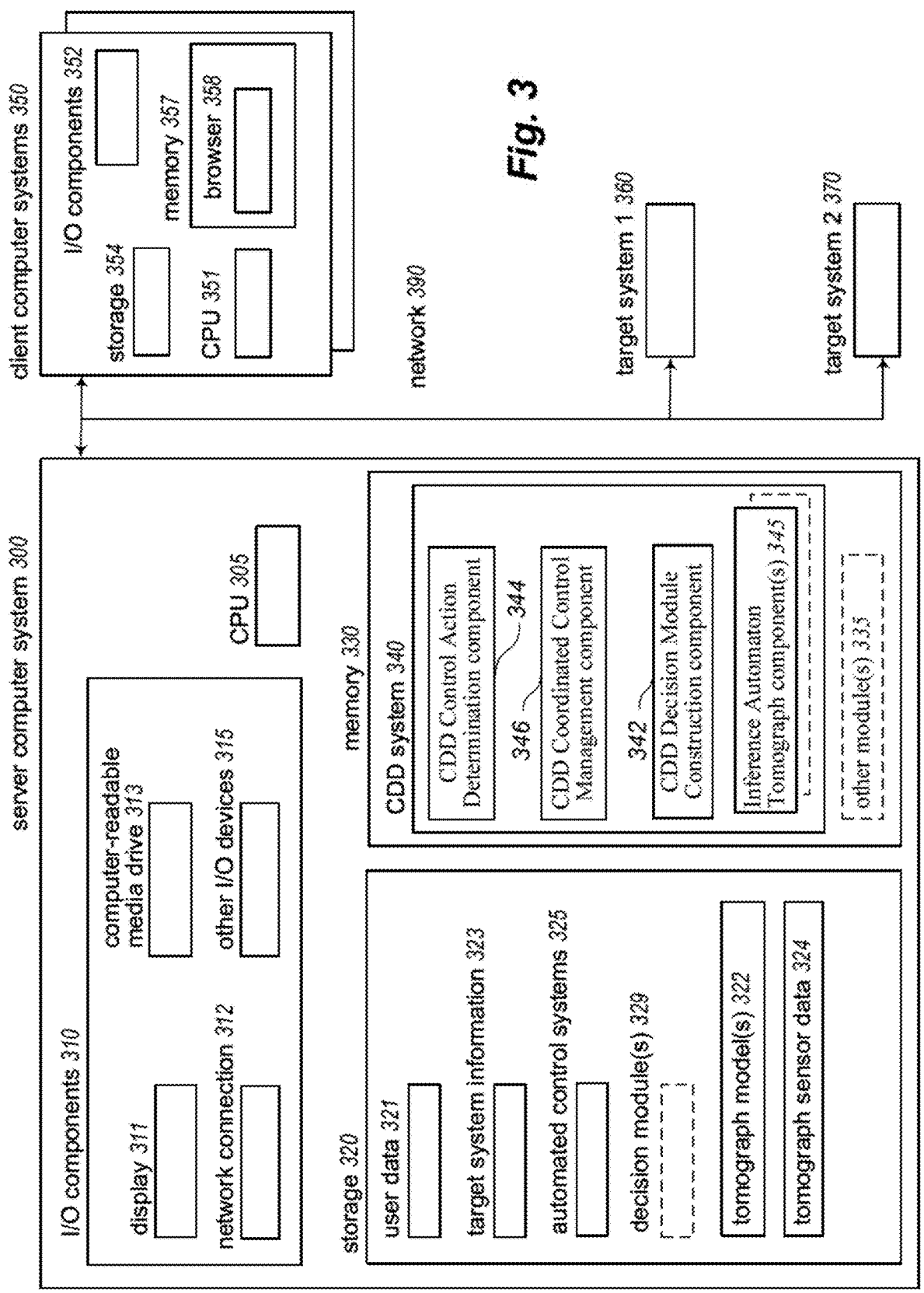
FIG. 3 is a block diagram illustrating example computing systems suitable for executing an embodiment of a system for performing cooperative distributed control of target systems in configured manners.

FIG. 3 is a block diagram illustrating example computing systems suitable for performing techniques for implementing automated control systems to control or otherwise manipulate at least some operations of specified physical systems or other target systems that include one or more batteries in configured manners based at least in part on internal battery state information generated using inference automaton tomographic techniques, as discussed in greater detail elsewhere herein. In particular, FIG. 3 illustrates a server computing system 300 suitable for providing at least some functionality of a CDD system including one or more inference automaton tomograph components, although in other embodiments multiple computing systems may be used for the execution (e.g., to have distinct computing systems executing the CDD Decision Module Construction component for initial configuration and setup before run-time control occurs, and one or more copies of the CDD Control Action Determination component 344 and/or the CDD Coordinated Control Managements component 346 and/or inference automaton tomograph component 345 for the actual run-time control; to have one or more computing systems executing the inference automaton tomograph components that are separate from one or more other computing systems executing some or all of a CDD system with which the inference automaton tomograph components interact; to have different computing systems executing different tomograph components; etc.). FIG. 3 also illustrates various client computer systems 350 that may be used by customers or other users of the CDD system 340, as well as one or more target systems to be controlled (in this example, target system 1 360 and target system 2 370, which are accessible to the CDD system 340 and its inference automaton tomograph components 345 over one or more computer networks 390, although in other embodiments the inference automaton tomograph components and/or other CDD components may execute local to a target system that they are controlling).

In the illustrated embodiment, the one or more inference automaton tomograph components 345 are executing in memory 330 as part of the CDD system 340, and in some embodiments the component(s) each includes various software instructions that when executed program one or more of the hardware CPU processors 305 to provide an embodiment of a tomograph component as described elsewhere herein. During operation, in at least some embodiments, each inference automaton tomograph component may obtain various input data 324 (e.g., from one or more active sensors, not shown) and modify one or more target system state models (e.g., copies of models 322 stored on storage 320), such as by generating one or more incremental model updates to change the structure of the target system state model being updated, as well as exchange various information with other executing components, as discussed in greater detail elsewhere herein.

The server computing system 300 has components in the illustrated embodiment that include one or more hardware CPU ("central processing unit") computer processors 305, various I/O ("input/output") hardware components 310, storage 320, and memory 330. The illustrated I/O components include a display 311, a network connection 312, a computer-readable media drive 313, and other I/O devices 315 (e.g., a keyboard, a mouse, speakers, etc.). In addition, the illustrated client computer systems 350 may each have components similar to those of server computing system 300, including one or more hardware CPUs 351, I/O components 352, storage 354, and memory 357, although some details are not illustrated for the computing systems 350 for the sake of brevity. The target systems 360 and 370 may also each include one or more computing systems (not shown) having components that are similar to some or all of the components illustrated with respect to server computing system 300, including to optionally locally execute one or more CDD components, but such computing systems and components are also not illustrated in this example for the sake of brevity.

The CDD system 340 is executing in memory 330 and includes components 342-346, and in some embodiments the system and/or components each includes various software instructions that when executed program one or more of the CPU processors 305 to provide an embodiment of a CDD system as described elsewhere herein. The CDD system 340 may interact with computing systems 350 over the network 390 (e.g., via the Internet and/or the World Wide Web, via a private cellular network, etc.), as well as the target systems 360 and 370 in this example. In this example embodiment, the CDD system includes functionality related to generating and deploying decision modules in configured manners for customers or other users, as discussed in greater detail elsewhere herein, as well as generating or deploying inference automaton tomograph components 345 at runtime to improve modeled state information of a corresponding target system. The other computing systems 350 may also be executing various software as part of interactions with the CDD system 340 and/or its components. For example, client computing systems 350 may be executing software in memory 357 to interact with CDD system 340 (e.g., as part of a Web browser, a specialized client-side application program, etc.), such as to interact with one or more interfaces (not shown) of the CDD system 340 to configure and deploy automated control systems (e.g., stored automated control systems 325 that were previously created by the CDD system 340 for use in controlling one or more physical target systems) or other decision modules 329, as well as to perform various other types of actions, as discussed in greater detail elsewhere. Various information related to the functionality of the CDD system 340 may be stored in storage 320, such as information 321 related to users of the CDD system (e.g., account information), and information 323 related to one or more target systems (e.g., systems that have batteries to be controlled).

It will be appreciated that computing systems 300 and 350 and target systems 360 and 370 are merely illustrative and are not intended to limit the scope of the present invention. The computing systems may instead each include multiple interacting computing systems or devices, and the computing systems/nodes may be connected to other devices that are not illustrated, including through one or more networks such as the Internet, via the Web, or via private networks (e.g., mobile communication networks, etc.). More generally, a computing node or other computing system or device may comprise any combination of hardware that may interact and perform the described types of functionality, including without limitation desktop or other computers, database servers, network storage devices and other network devices, PDAs, cell phones, wireless phones, pagers, electronic organizers, Internet appliances, television-based systems (e.g., using set-top boxes and/or personal/digital video recorders), and various other consumer products that include appropriate communication capabilities. In addition, the functionality provided by the illustrated CDD system 340 and its components may in some embodiments be distributed in additional components. Similarly, in some embodiments some of the functionality of the CDD system 340 and/or CDD components 342-346 may not be provided and/or other additional functionality may be available.

As part of implementing an automated control system for a particular target system, an embodiment of a Collaborative Distributed Decision (CDD) system may use the described techniques to perform various automated activities involved in constructing and implementing the automated control system, including generating one or more CDI agents (also referred to as a CDD decision module or system, or a portion of such module or system) for use as some or all of an automated control system in controlling particular target systems.

In particular, the CDD system may in some embodiments implement a Decision Module Construction component that interacts with one or more users to obtain a description of a target system, including restrictions related to the various elements of the target system, and one or more goals to be achieved during control of the target system—the Decision Module Construction component then performs various automated actions to generate, test and deploy one or more executable decision modules (also referred to at times as "decision elements" and/or "agents") to use in performing the control of the target system. When the one or more executable decision modules are deployed and executed, the CDD system may further provide various components within or external to the decision modules being executed to manage their control of the target system, such as a Control Action Determination component of each decision module as part of a control system to optimize or otherwise enhance the control actions that the decision module generates, an inference automaton tomograph component to improve modeled internal battery state information for the target system, and/or one or more Coordinated Control Management components to coordinate the control actions of multiple decision modules that are collectively performing the control of the target system.

As noted above, a Collaborative Distributed Decision (CDD) system may in some embodiments use at least some of the described techniques to perform various automated activities involved in constructing and implementing a automated control system for a specified target system, such as to modify or otherwise manipulate inputs or other control elements of the target system that affect its operation (e.g., affect one or more outputs of the target system). An automated control system for such a target system may in some situations have a distributed architecture that provides cooperative distributed control of the target system, such as with multiple decision modules that each control a portion of the target system and that operate in a partially decoupled manner with respect to each other. If so, the various decision modules' operations for the automated control system may be at least partially synchronized, such as by each reaching a consensus with one or more other decision modules at one or more times, even if a fully synchronized convergence of all decision modules at all times is not guaranteed or achieved.

The CDD system may in some embodiments implement a Decision Module Construction component that interacts with one or more users to obtain a description of a target system, including restrictions related to the various elements of the target system, and one or more goals to be achieved during control of the target system—the Decision Module Construction component then performs various automated actions to generate, test and deploy one or more executable decision modules to use in performing the control of the target system. The Decision Module Construction component may thus operate as part of a configuration or setup phase that occurs before a later run-time phase in which the generated decision modules are executed to perform control of the target system, although in some embodiments and situations the Decision Module Construction component may be further used after an initial deployment to improve or extend or otherwise modify an automated control system that has one or more decision modules (e.g., while the automated control system continues to be used to control the target system), such as to implement functionality of an inference automaton tomograph component to improve and update a model of a target system being controlled, or to add, remove or modify decision modules for the automated control system.

In some embodiments, some or all automated control systems that are generated and deployed may further provide various components within them for execution during the runtime operation of the automated control system, such as by including such components within decision modules in some embodiments and situations. Such components may include, for example, a Control Action Determination component of each decision module (or of some decision modules) to optimize or otherwise determine and improve the control actions that the decision module generates, and/or an inference automaton tomograph component of each decision module (or of some decision modules) to improve modeled state information for the target system. For example, such a Control Action Determination component in a decision module may in some embodiments attempt to automatically determine the decision module's control actions for a particular time to reflect a near-optimal solution with respect to or one more goals and in light of a model of the decision module for the target system that has multiple inter-related constraints and based on current state information that is modeled for the target system—if so, such a near-optimal solution may be based at least in part on a partially optimized solution that is within a threshold amount of a fully optimized solution. Such determination of one or more control actions to perform may occur for a particular time and for each of one or more decision modules, as well as be repeated over multiple times for ongoing control by at least some decision modules in some situations. In some embodiments, the model for a decision module is implemented as a Hamiltonian function that reflects a set of coupled differential equations based in part on constraints representing at least part of the target system, such as to allow the model and its Hamiltonian function implementation to be updated over multiple time periods by adding additional expressions within the evolving Hamiltonian function, as discussed in greater detail elsewhere herein.

In some embodiments, the components included within a generated and deployed automated control system for execution during the automated control system's runtime operation may further include one or more Coordinated Control Management components to coordinate the control actions of multiple decision modules that are collectively performing the control of a target system for the automated control system. For example, some or all decision modules may each include such a Coordinated Control Management component in some embodiments to attempt to synchronize that decision module's local solutions and proposed control actions with those of one or more other decision modules in the automated control system, such as by determining a consensus shared model with those other decision modules that simultaneously provides solutions from the decision module's local model and the models of the one or more other decision modules. Such inter-module synchronizations may occur repeatedly to determine one or more control actions for each decision module at a particular time, as well as to be repeated over multiple times for ongoing control. In addition, each decision module's model is implemented in some embodiments as a Hamiltonian function that reflects a set of coupled differential equations based in part on constraints representing at least part of the target system, such as to allow each decision module's model and its Hamiltonian function implementation to be combined with the models of one or more other decision modules by adding additional expressions for those other decision modules' models within the initial Hamiltonian function for the local model of the decision module, as discussed in greater detail elsewhere herein.

It will also be appreciated that, while various items are illustrated as being stored in memory or on storage while being used, these items or portions of them may be transferred between memory and other storage devices for purposes of memory management and data integrity. Alternatively, in other embodiments some or all of the software modules and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the inference automaton tomograph components 345 and/or other of the CDD components 342-346, or more generally by the CDD system 340) and/or data structures, such as by execution of software instructions of the one or more software programs and/or by storage of such software instructions and/or data structures. Furthermore, in some embodiments, some or all of the systems and/or components may be implemented or provided in other manners, such as by using means that are implemented at least partially or completely in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage medium, such as a hard disk or flash drive or other non-volatile storage device, volatile or non-volatile memory (e.g., RAM), a network storage device, or a portable media article to be read by an appropriate drive (e.g., a DVD disk, a CD disk, an optical disk, etc.) or via an appropriate connection. The systems, components and data structures may also in some embodiments be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Figure 4:
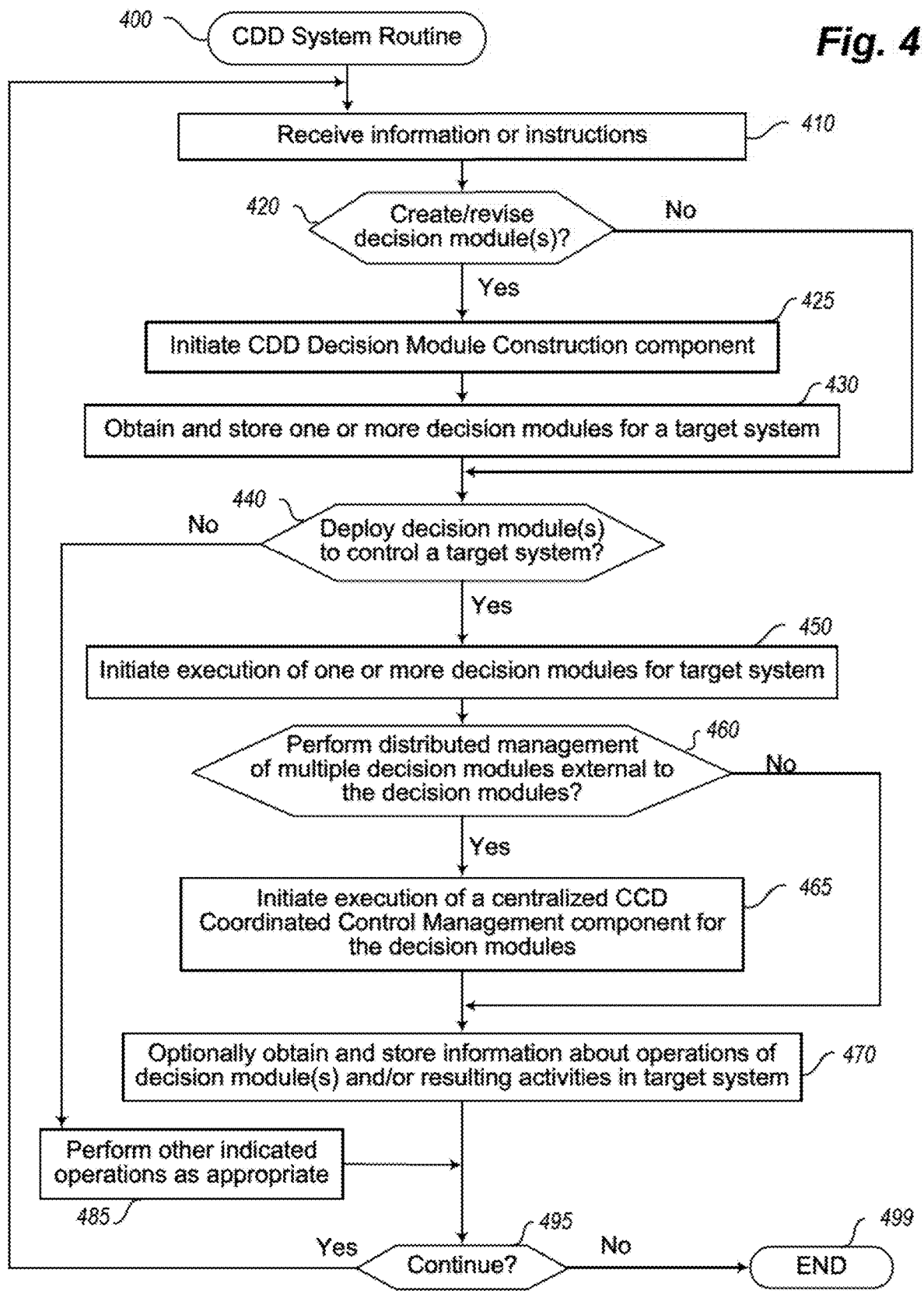
FIG. 4 illustrates a flow diagram of an example embodiment of a Collaborative Distributed Decision (CDD) System routine.

FIG. 4 is a flow diagram of an example embodiment of a Collaborative Distributed Decision (CDD) system routine 400. The routine may, for example, be provided by execution of the CDD system 340 of FIG. 3 and/or the CDD system 140 of FIG. 1B, such as to provide functionality to construct and implement automated control systems for specified target systems.

The illustrated embodiment of the routine begins at block 410, where information or instructions are received. If it is determined in block 420 that the information or instructions of block 410 include an indication to create or revise one or more decision modules for use as part of an automated control system for a particular target system, the routine continues to block 425 to initiate execution of a Decision Module Construction component, and in block 430 obtains and stores one or more resulting decision modules for the target system that are created in block 425. One example of a routine for such a Decision Module Construction component is discussed in greater detail with respect to FIGS. 5A-5C.

After block 430, or if it is instead determined in block 420 that the information or instructions received in block 410 are not to create or revise one or more decision modules, the routine continues to block 440 to determine whether the information or instructions received in block 410 indicate to deploy one or more created decision modules to control a specified target system, such as for one or more decision modules that are some or all of an automated control system for that target system. The one or more decision modules to deploy may have been created immediately prior with respect to block 425, such that the deployment occurs in a manner that is substantially simultaneous with the creation, or in other situations may include one or more decision modules that were created at a previous time and stored for later use. If it is determined to deploy one or more such decision modules for such a target system, the routine continues to block 450 to initiate the execution of those one or more decision modules for that target system, such as on one or more computing systems local to an environment of the target system, or instead on one or more remote computing systems that communicate with the target system over one or more intermediary computer networks (e.g., one or more computing systems under control of a provider of the CDD system).

After block 450, the routine continues to block 460 to determine whether to perform distributed management of multiple decision modules being deployed in a manner external to those decision modules, such as via one or more centralized Coordinated Control Management components. If so, the routine continues to block 465 to initiate execution of one or more such centralized CDD Coordinated Control Management components for use with those decision modules. After block 465, or if it is instead determined in block 460 to not perform such distributed management in an external manner (e.g., if only one decision module is executed, if multiple decision modules are executed but coordinate their operations in a distributed peer-to-peer manner via local CDD Coordinated Control Management components, etc.), the routine continues to block 470 to optionally obtain and store information about the operations of the one or more decision modules and/or resulting activities that occur in the target system, such as for later analysis and/or reporting.

If it is instead determined in block 440 that the information or instructions received in block 410 are not to deploy one or more decision modules, the routine continues instead to block 485 to perform one or more other indicated operations if appropriate. For example, such other authorized operations may include obtaining results information about the operation of a target system in other manners (e.g., by monitoring outputs or other state information for the target system), analyzing results of operations of decision modules and/or activities of corresponding target systems, generating reports or otherwise providing information to users regarding such operations and/or activities, etc. In addition, in some embodiments the analysis of activities of a particular target system over time may allow patterns to be identified in operation of the target system, such as to allow a model of that target system to be modified accordingly (whether manually or in an automated learning manner) to reflect those patterns and to respond based on them. In addition, as discussed in greater detail elsewhere, distributed operation of multiple decision modules for an automated control system in a partially decoupled manner allows various changes to be made while the automated control system is in operation, such as to add one or more new decision modules, to remove one or more existing decision modules, to modify the operation of a particular decision module (e.g., by changing rules or other information describing the target system that is part of a model for the decision module), etc. In addition, the partially decoupled nature of multiple such decision modules in an automated control system allows one or more such decision modules to operate individually at times, such as if network communication issues or other problems prevent communication between multiple decision modules that would otherwise allow their individualized control actions to be coordinated—in such situations, some or all such decision modules may continue to operate in an individualized manner, such as to provide useful ongoing control operations for a target system even if optimal or near-optimal solutions cannot be identified from coordination and synchronization between a group of multiple decision modules that collectively provide the automated control system for the target system.

After blocks 470 or 485, the routine continues to block 495 to determine whether to continue, such as until an explicit indication to terminate is received. If it is determined to continue, the routine returns to block 410, and otherwise continues to block 499 and ends.

Figure 5A:
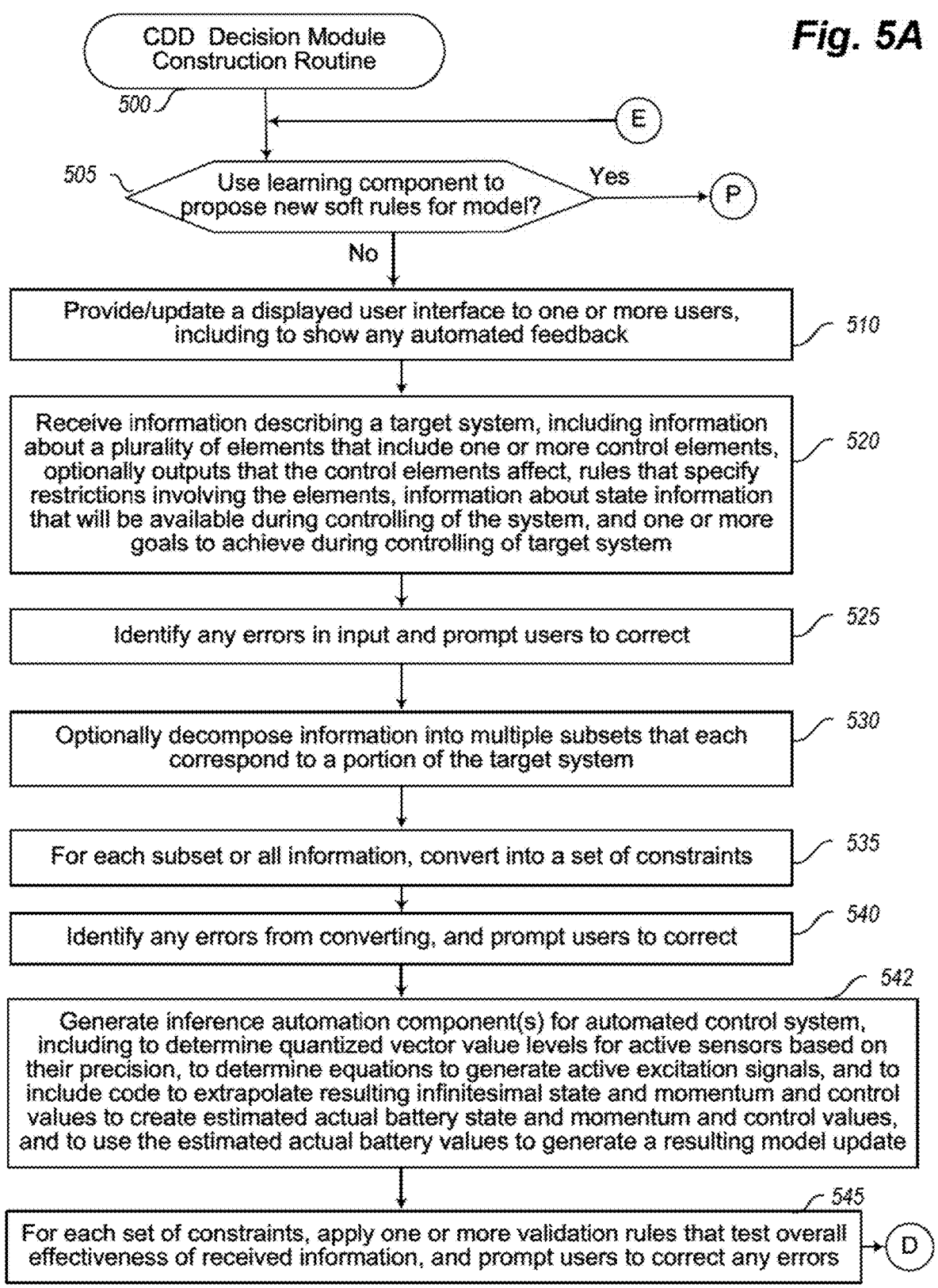
Figure 5C:
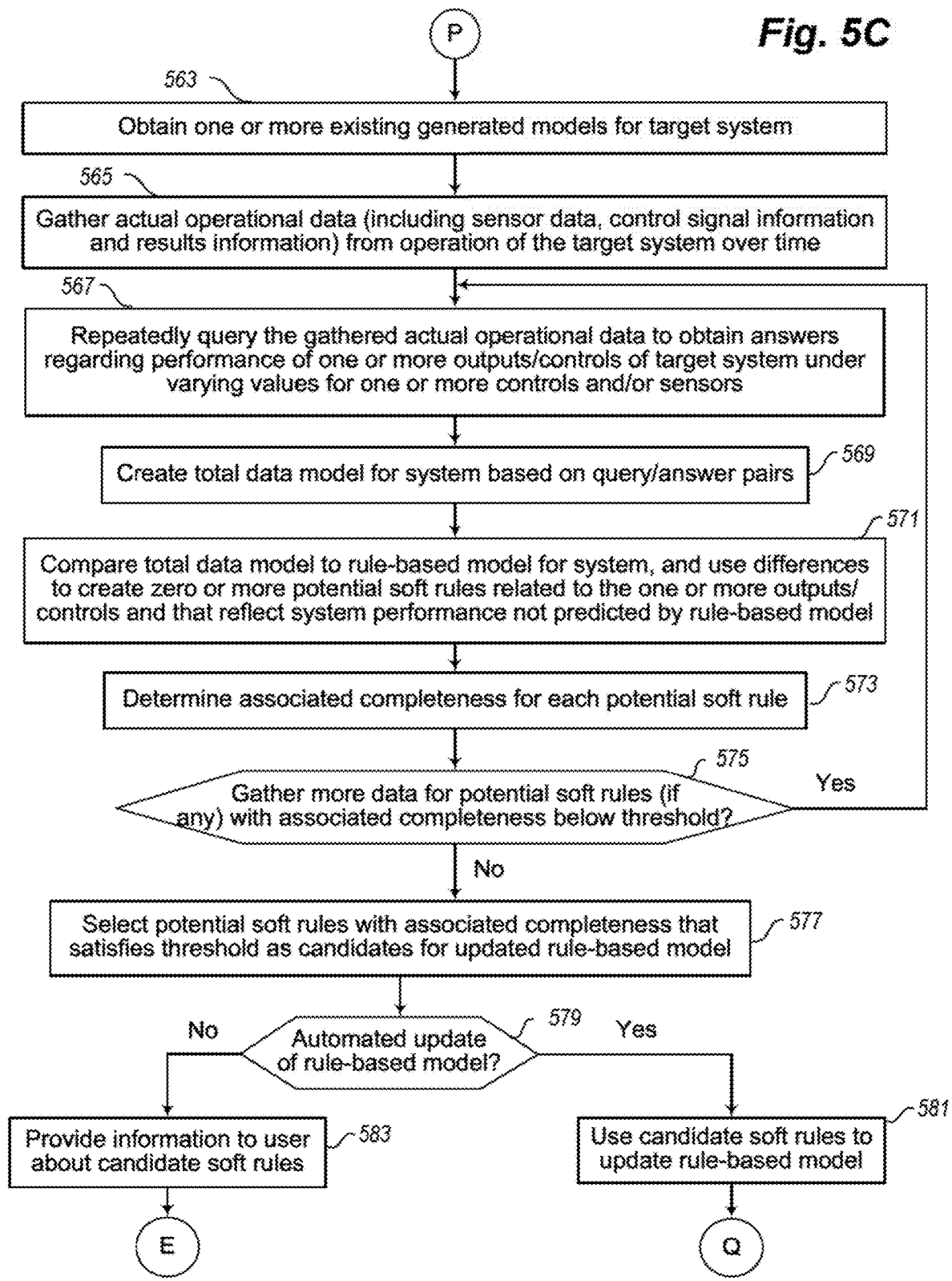

FIGS. 5A-5C illustrate a flow diagram of an example embodiment of a CDD Decision Module Construction routine 500. The routine may, for example, be provided by execution of the component 342 of FIG. 3 and/or the component 142 of FIG. 1B, such as to provide functionality to allow users to provide information describing a target system of interest, and to perform corresponding automated operations to construct one or more decision modules to use to control the target system in specified manners. While the illustrated embodiment of the routine interacts with users in particular manners, such as via a displayed GUI (graphical user interface), it will be appreciated that other embodiments of the routine may interact with users in other manners, such as via a defined API (application programming interface) that an executing program invokes on behalf of a user. In some embodiments, the routine may further be implemented as part of an integrated development environment or other software tool that is available for one or more users to use, such as by implementing an online interface that is available to a variety of remote users over a public network such as the Internet, while in other embodiments a copy of the CDD system and/or particular CDD components may be used to support a single organization or other group of one or more users, such as by being executed on computing systems under the control of the organization or group. In addition, the CDD Decision Module Construction component may in some embodiments and situations be separated into multiple sub-components, such as a rules editor component that users interact with to specify rules and other description information for a target system, and a rules compiler engine that processes the user-specified rules and other information to create one or more corresponding decision modules.

Figure 6A:
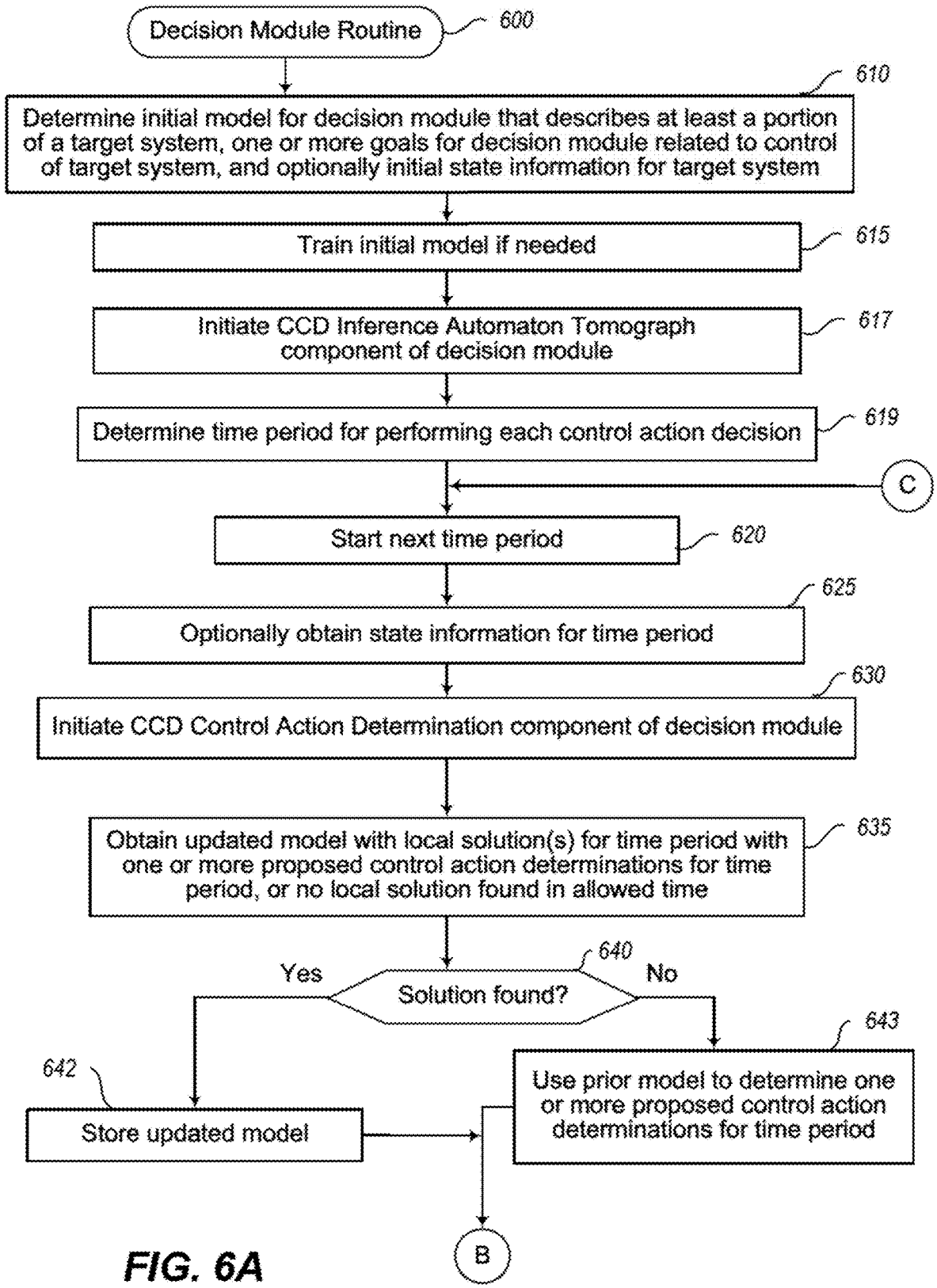
FIGS. 6A-6B illustrate a flow diagram of an example embodiment of a decision module routine.
Figure 6B:
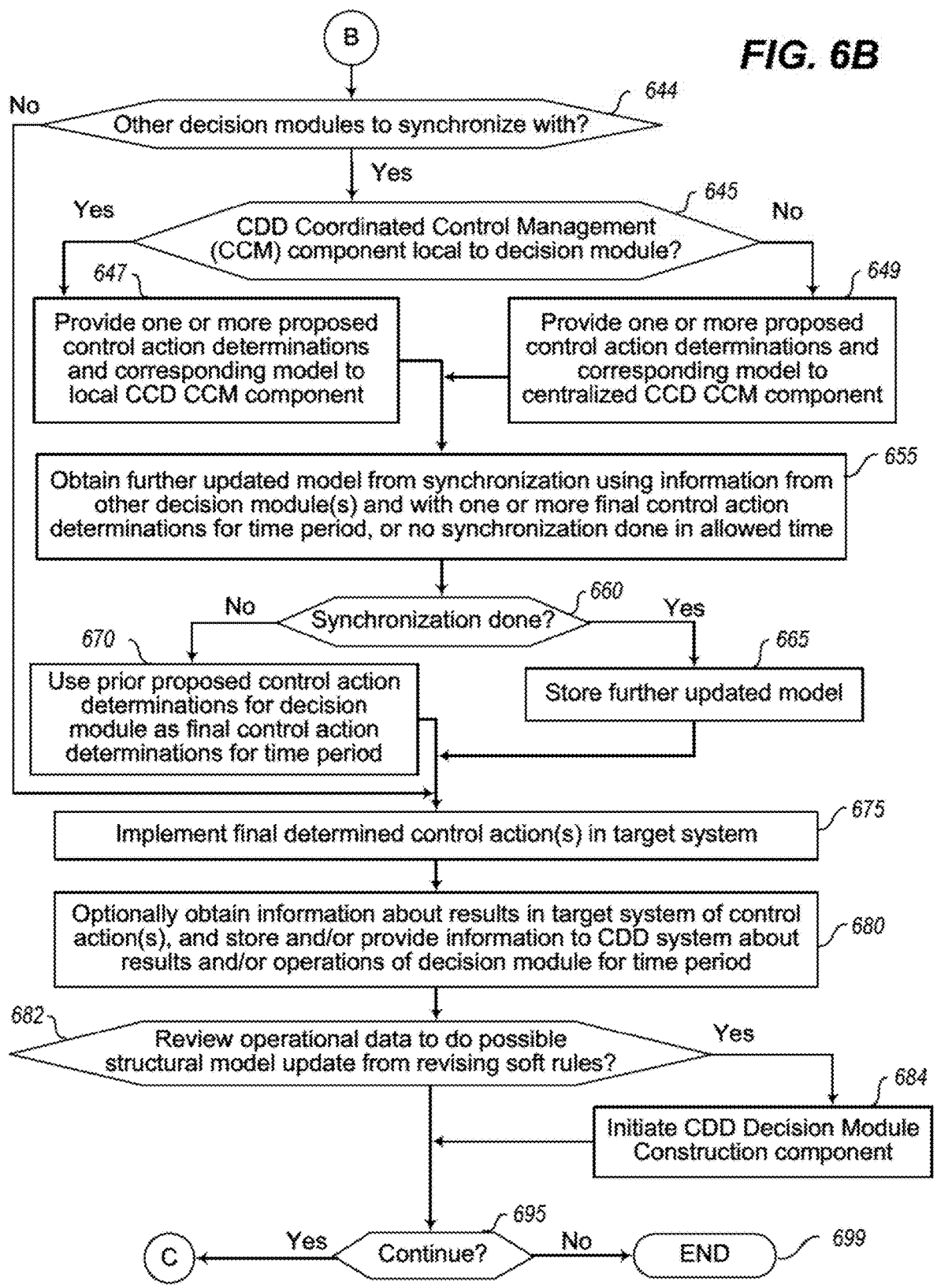

The illustrated embodiment of the routine 500 begins at block 505, where the routine determines whether to currently use a soft rule learning component to learn new soft rules for potential addition to a model of a target system, such as periodically, in response to one or more triggering conditions being satisfied, based on being invoked by block 684 of FIG. 6B, etc. If so, the routine continues to block 563 of FIG. 5C, and otherwise continues to block 510, where the routine provides or updates a displayed user interface to one or more users, such as via a request received at an online version of component that is implementing the routine, or instead based on the routine being executed by one or more such users on computing systems that they control. While various operations are shown in the illustrated embodiment of the routine as occurring in a serial manner for the purpose of illustration, it will be appreciated that user interactions with such a user interface may occur in an iterative manner and/or over multiple periods of time and/or user sessions, including to update a user interface previously displayed to a user in various manners (e.g., to reflect a user action, to reflect user feedback generated by operation of the routine or from another component, etc.), as discussed further below.

After block 510, the routine continues to block 520 to receive information from one or more such users describing a target system to be controlled, including information about a plurality of elements of the target system that include one or more manipulatable control elements and optionally one or more outputs that the control elements affect, information about rules that specify restrictions involving the elements, information about state information that will be available during controlling of the system (e.g., values of particular elements or other state variables, such as from passive sensors), and one or more goals to achieve during the controlling of the target system. It will be appreciated that such information may be obtained over a period of time from one or more users, including in some embodiments for a first group of one or more users to supply some information related to a target system and for one or more other second groups of users to independently provide other information about the target system, such as to reflect different areas of expertise of the different users and/or different parts of the target system.

After block 520, the routine continues to block 525 to identify any errors that have been received in the user input, and to prompt the user(s) to correct those errors, such as by updating the display in a corresponding manner as discussed with respect to block 510. While the identification of such errors is illustrated as occurring after the receiving of the information in block 520, it will be appreciated that some or all such errors may instead be identified as the users are inputting information into the user interface, such as to identify syntax errors in rules or other information that the users specify. After block 525, the illustrated embodiment of the routine continues to block 530 to optionally decompose the information about the target system into multiple subsets that each correspond to a portion of the target system, such as with each subset having one or more different control elements that are manipulatable by the automated control system being created by the routine, and optionally have overlapping or completely distinct goals and/or sets of rules and other information describing the respective portions of the target system. As discussed in greater detail elsewhere, such decomposition, if performed, may in some situations be performed manually by the users indicating different sub-groups of information that they enter, and/or in an automated manner by the routine based on an analysis of the information that has been specified (e.g., based on the size of rules and other descriptive information supplied for a target system, based on inter-relationships between different rules or goals or other information, etc.). In other embodiments, no such decomposition may be performed.

After block 530, the routine continues to block 535 to, for each subset of target system description information (or for all the received information if no such subsets are identified), convert that subset (or all the information) into a set of constraints that encapsulate the restrictions, goals, and other specified information for that subset (or for all the information). In block 540, the routine then identifies any errors that occur from the converting process, and if any are identified, may prompt the user to correct those errors, such as in a manner similar to that described with respect to blocks 525 and 510. While not illustrated in this example, the routine may in some situations in blocks 525 and/or 540 return to block 510 when such errors are identified, to display corresponding feedback to the user(s) and to allow the user(s) to make corrections and re-perform following operations such as those of blocks 520-540. The errors identified in the converting process in block 540 may include, for example, errors related to inconsistent restrictions, such as if the restrictions as a group are impossible to satisfy.

After block 540, the routine continues to block 542 to generate one or more inference automaton components to use at run-time with the automated control system being generated, such as one for each subset determined in block 530, one for the entire automated control system, etc. In particular, the generation of the one or more inference automaton components is performed in a manner similar to that discussed with respect to FIGS. 2A-2F and elsewhere herein, including to determine quantized vector value levels for active sensors based on their precision, to determine equations to use to generate active excitation signals, and to include executable code to extrapolate resulting infinitesimal state and momentum and control values from the active sensors at run-time to create estimated actual battery state and momentum and control values and to use the estimated actual battery values to generate a resulting model update. Additional details related to such an inference automaton component are included elsewhere herein.

After block 542, the routine continues to block 545 to, for each set of constraints (or a single constraint set if no subsets were identified in block 530), apply one or more validation rules to the set of constraints to test overall effectiveness of the corresponding information that the constraints represent, and to prompt the one or more users to correct any errors that are identified in a manner similar to that with respect to blocks 525, 540 and 510. Such validation rules may test one or more of controllability, observability, stability, and goal completeness, as well as any user-added validation rules, as discussed in greater detail elsewhere. In block 550, the routine then converts each validated set of constraints to a set of coupled differential equations that model at least a portion of the target system to which the underlying information corresponds.

After block 550, the routine continues to block 553 to perform activities related to training a model for each set of coupled differential equations, including to determine one or more of a size of a training time window to use, size of multiple training time slices within the time window, and/or a type of training time slice within the time window. In some embodiments and situations, the determination of one or more such sizes or types of information is performed by using default or pre-specified information, while in other embodiments and situations the users may specify such information, or an automated determination of such information may be performed in one or more manners (e.g., by testing different sizes and evaluating results to find sizes with the best performance). Different types of time slices may include, for example, successions of time slices that overlap or do not overlap, such that the training for a second time slice may be dependent only on results of a first time slice (if they do not overlap) or instead may be based at least in part on updating information already determined for at least some of the first time slice (if they do overlap in part or in whole). After block 553, the routine continues to block 555 to, for each set of coupled differential equations representing a model, train the model for that set of coupled differential equations using partial initial state information determined externally for the target system (e.g., from passive sensors), including to estimate values of variable that are not known and/or directly observable for the target system by simulating effects of performing control actions over the time window, such as for successive time slices throughout the time window, and to test the simulated performance of the trained model. Additional details related to training and testing are included elsewhere herein.

After block 555, the routine continues to block 560 to determine whether the training and testing was successful, and if not returns to block 510 to display corresponding feedback information to the users to allow them to correct errors that caused the lack of success. If it is instead determined in block 560 that the testing and training were successful, however, or after block 581 of FIG. 5C with a model updated with one or more learned soft rules, the routine continues instead to block 585 to generate an executable decision module for each trained and tested model that includes that model, as well as a local CCD Control Action Determination component that the decision module will use when executed to determine optimal or near-optimal control actions to perform for the target system based on the information included in the model and in light of the one or more goals for that decision module, and that includes or uses at least one CCD Inference Automation Tomograph component generated in block 542. The generated executable decision module may in some embodiments and situations further include a local CCD Coordinated Control Management component to coordinate control actions of multiple decision modules that collectively will provide an automated control system for the target system, such as by synchronizing respective models of the various decision modules over time. After block 585, the routine continues to block 590 to provide the generated executable decision modules for use, including to optionally store them for later execution and/or deployment.

It if was determined in block 505 to use a learning component to learn new soft rules for potential addition to a model of a target system, the routine continues to block 563 of FIG. 5C, where one or more existing generated models (e.g., an initial model based on binary rules) for the target system are obtained. In block 565, the routine then gathers actual operational data from operation of the target system over time (e.g., as controlled by the one or more existing generated models), such as to retrieve previously generated and stored data from storage, to enter a data-gathering stage that continues until a specified amount of data is available, etc. After block 565, the routine continues to block 567 to repeatedly query a data model from the gathered data to obtain answers regarding performance of the target system under varying situations and values for one or more passive sensors and/or controls, such as with respect to one or more outputs of the target system corresponding to a specified goal to achieve. In block 569, the routine then creates a total data model for the system based on the query/answer pairs, such as to construct a total Hamiltonian function. In block 571, the routine then obtains a rule-based model for the system (e.g., a rule-based Hamiltonian function), and compares the total model and rule-based model in order to identify any differences, which are then use to create zero or more potential soft rules related to the queries.

In block 573, the routine then determines an associated completeness value for each such potential soft rule, such as based on whether the execution of blocks 565 through 571 continue to produce new information with respect to the potential soft rules. If any such potential soft rules are not sufficiently complete (e.g., have completeness values below an associated threshold), the routine returns to block 567 to perform additional queries, and otherwise continues to block 577 to select any of the potential soft rules that are sufficiently complete as candidates to use in an improved model for the target system. In block 579, the routine then determines whether to automatically update an existing model, and if so continues to block 581 to use the learned candidate soft rule(s) to update an existing rule-based model, before continuing to block 585. Otherwise, the routine continues to block 583 to provide information about the learned candidate soft rule(s) to one or more users associated with the existing models and/or target system, such as to enable the user(s) to decide whether or not to use them to update an existing rule-based model, before continuing to block 505 (e.g., to receive further instructions from the user for such an update with respect to block 520.

After block 590, the routine continues to block 595 to determine whether to continue, such as until an explicit indication to terminate is received. If it is determined to continue, the routine returns to block 510, and otherwise continues to block 599 and ends.

FIGS. 6A-6B illustrate a flow diagram of an example embodiment of a routine 600 corresponding to a generic representation of a decision module that is being executed. The routine may, for example, be provided by execution of a decision module 329 or as part of an automated control system 325 of FIG. 3, the automated control system 195a of FIG. 1A, the automated control system 205a of FIG. 2A, and/or a decision module 124 or 128 of FIG. 1B or 1C, such as to provide functionality for controlling at least a portion of a target system in a manner specific to information and a model encoded for the decision module, including to reflect one or more goals to be achieved by the decision module during its controlling activities. As discussed in greater detail elsewhere, in some embodiments and situations, multiple decision modules may collectively and cooperatively act to control a particular target system, such as with each decision module controlling one or more distinct control elements for the target system or otherwise representing or interacting with a portion of the target system, while in other embodiments and situations a single decision module may act alone to control a target system. The routine 600 further reflects actions performed by a particular example decision module when it is deployed in controlling a portion of a target system, although execution of at least portions of a decision module may occur at other times, such as initially to train a model for the decision module before the decision module is deployed, as discussed in greater detail with respect to the CDD Decision Module Construction routine 500 of FIGS. 5A-5C.

The illustrated embodiment of the routine 600 begins at block 610, where an initial model for the decision module is determined that describes at least a portion of a target system to be controlled, one or more goals for the decision module to attempt to achieve related to control of the target system, and optionally initial state information for the target system. The routine continues to block 615 to perform one or more actions to train the initial model if needed, as discussed in greater detail with respect to blocks 553 and 555 of FIGS. 5A-5C—in some embodiments and situations, such training for block 615 is performed only if initial training is not done by the routine 500 of FIGS. 5A-5C, while in other embodiments and situations the training of block 615 is performed to capture information about a current state of the target system at a time that the decision module begins to execute (e.g., if not immediately deployed after initial creation and training) and/or to re-train the model at times as discussed in greater detail with respect to routine 700 of FIGS. 7A-7B as initiated by block 630.

Figure 9:
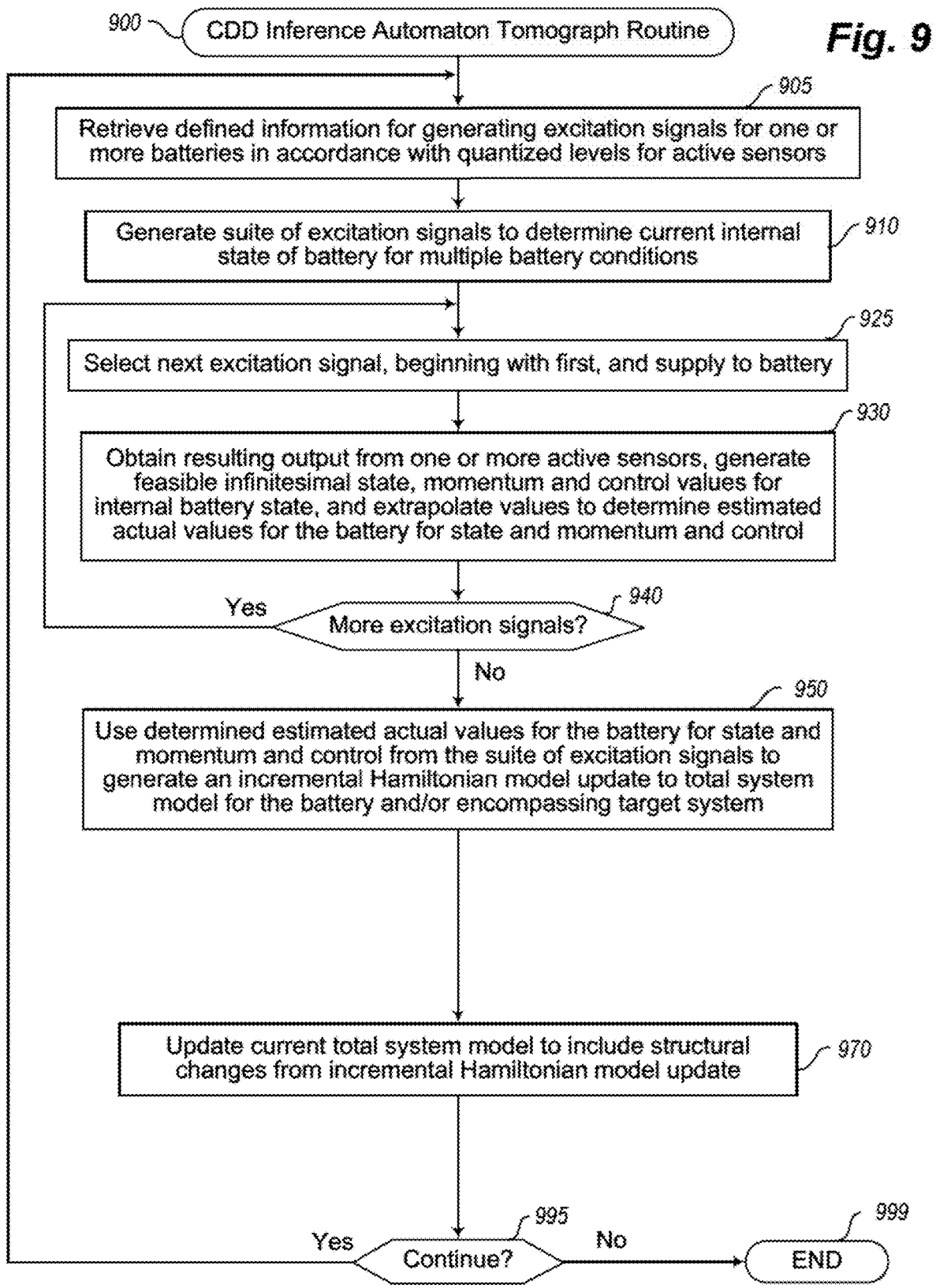
FIG. 9 illustrates a flow diagram of an example embodiment of a CDD Inference Automaton Tomograph routine.

After block 615, the routine continues to block 617 to initiate execution of an Inference Automaton Component that performs a learning feedback loop concurrently with other control loop actions performed by the illustrated routine, including to perform structural model updates during operation of the routine 600 to a current model in use (e.g., the initial model indicated in block 610 and/or a subsequently updated version of the model). One example of execution of such an Inference Automaton Component is illustrated in FIG. 9.

After block 617, the routine continues to block 619 to determine a time period to use for performing each control action decision for the decision module, such as to reflect a rate at which control element modifications in the target system are needed and/or to reflect a rate at which new incoming state information is received that may alter future manipulations of the control elements. The routine then continues to block 620 to start the next time period, beginning with a first time period moving forward from the startup of the execution of the decision module. Blocks 620-680 are then performed in a control loop for each such time period going forward until execution of the decision module is suspended or terminated, although in other embodiments a particular decision module may execute for only a single time period each time that it is executed.

In block 625, the routine optionally obtains state information for the time period, such as current state information that has been received from the target system (e.g., via one or more passive sensors) or one or more related external sources since the last time period began, and/or by actively retrieving current values of one or more elements of the target system or corresponding variables as needed. In block 630, the routine then initiates execution of a local CCD Control Action Determination component of the decision module, with one example of such a routine discussed in greater detail with respect to routine 700 of FIGS. 7A-7B. In block 635, the results of the execution of the component in block 630 are received, including to either obtain an updated model for the decision module with a local solution for the current time period and decision module that includes one or more proposed control action determinations that the decision module may perform for the current time period, or to receive an indication that no local solution was found for the decision module in the allowed time for the execution of the component in block 630. It is then determined in block 640 whether a solution was found, and if so continues to block 642 to store the updated model for the decision module, and otherwise continues to block 643 to use the prior model for the decision module to determine one or more control action determinations that are proposed for the current time period based on a previous model (e.g., that does not reflect recent changes in state information and/or recent changes in activities of other decision modules, if any), as discussed in greater detail with respect to routine 700 of FIGS. 7A-7B.

After blocks 642 or 643, the routine continues to block 644 to determine if other decision modules are collectively controlling portions of the current target system, such as part of the same automated control system as the local decision module, and if so continues to block 645. Otherwise, the routine selects the local proposed control actions of the decision module as a final determined control action to perform, and continues to block 675 to implement those control actions for the current time period.

If there are other operating decision modules, the routine in block 645 determines if the local decision module includes a local copy of a CDD Coordinated Control Management (CCM) component for use in synchronizing the proposed control action determinations for the decision module's local solutions with activities of other decision modules that are collectively controlling the same target system. If so, the routine continues to block 647 to provide the one or more proposed control action determinations of the decision module and the corresponding current local model for the decision module to the local CDD CCM component, and otherwise continues to block 649 to provide the one or more proposed control action determinations for the decision module and the corresponding local model of the decision module to one or more centralized CDD CCM components.

After blocks 647 or 649, the routine continues to block 655 to obtain results of the actions of the CDD CCM component(s) in blocks 647 or 649, including to either obtain a further updated model resulting from synchronization of the local model for the current decision module with information from one or more other decision modules, such that the further updated model indicates one or more final control action determinations to perform for the time period for the current decision module, or an indication that no such synchronization was completed in the allowed time. The routine continues to block 660 to determine whether the synchronization was completed, and if so continues to block 665 to store the further updated model from the synchronization, and otherwise continues to block 670 to use the prior proposed control action determinations locally to the decision module as the final control action determinations for the time period.

After blocks 665 or 670, the routine continues to block 675 to implement the one or more final determined control actions for the decision module in the target system, such as by interacting with one or more effectuators in the target system that modify values or otherwise manipulate one or more control elements of the target system, or by otherwise providing input to the target system to cause such modifications or other manipulations to occur. In block 680, the routine optionally obtains information about the results in the target system of the control actions performed, and stores and/or provides information to the CDD system about such obtained results and/or about the activities of the decision module for the current time period. After block 680, the routine continues to block 682 to determine whether to do a possible structural model adaptation update based on learned soft rules, such as periodically, based on whether or not a solution was found with respect to block 640, based on whether or not synchronization was done with respect to block 660, etc. If so, the routine continues to block 684 to initiate operations of the CDD Decision Module Construction component with respect to the inference automaton tomograph component in blocks 563-583, such as to return with an updated version of the model and/or a corresponding decision module.

After block 684, or if it was determined in block 682 to not do a possible structural model adaptation update based on learned soft rules, the routine continues to block 695 to determine whether to continue, such as until an indication to terminate or suspend is received (e.g., to reflect an end to current operation of the target system or an end of use of the decision module to control at least a portion of the target system). If it is determined to continue, the routine returns to block 620 to start the next time period, and otherwise continues to block 699 and ends.

Figure 7A:
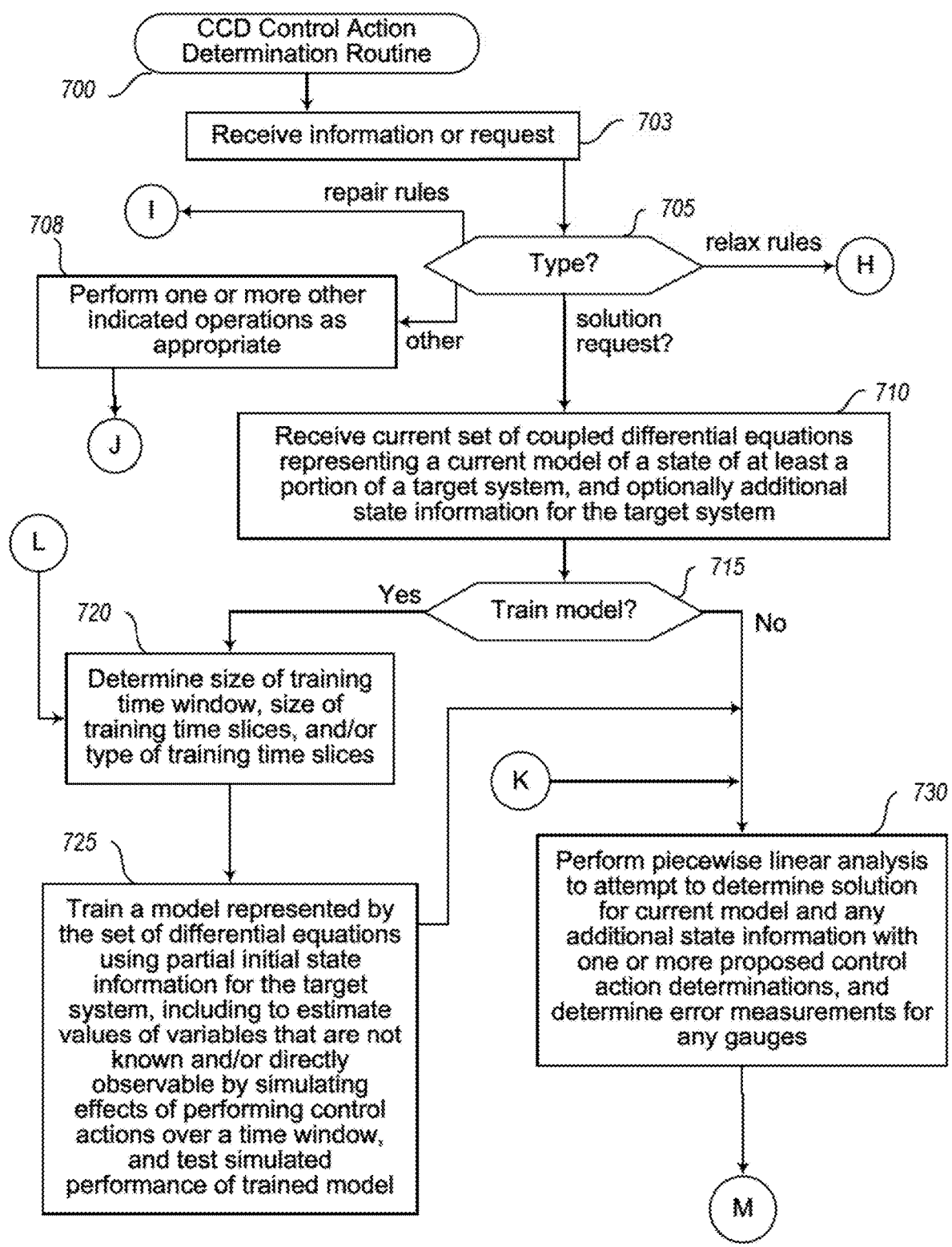
FIGS. 7A-7B illustrate a flow diagram of an example embodiment of a CDD Control Action Determination routine.
Figure 7B:
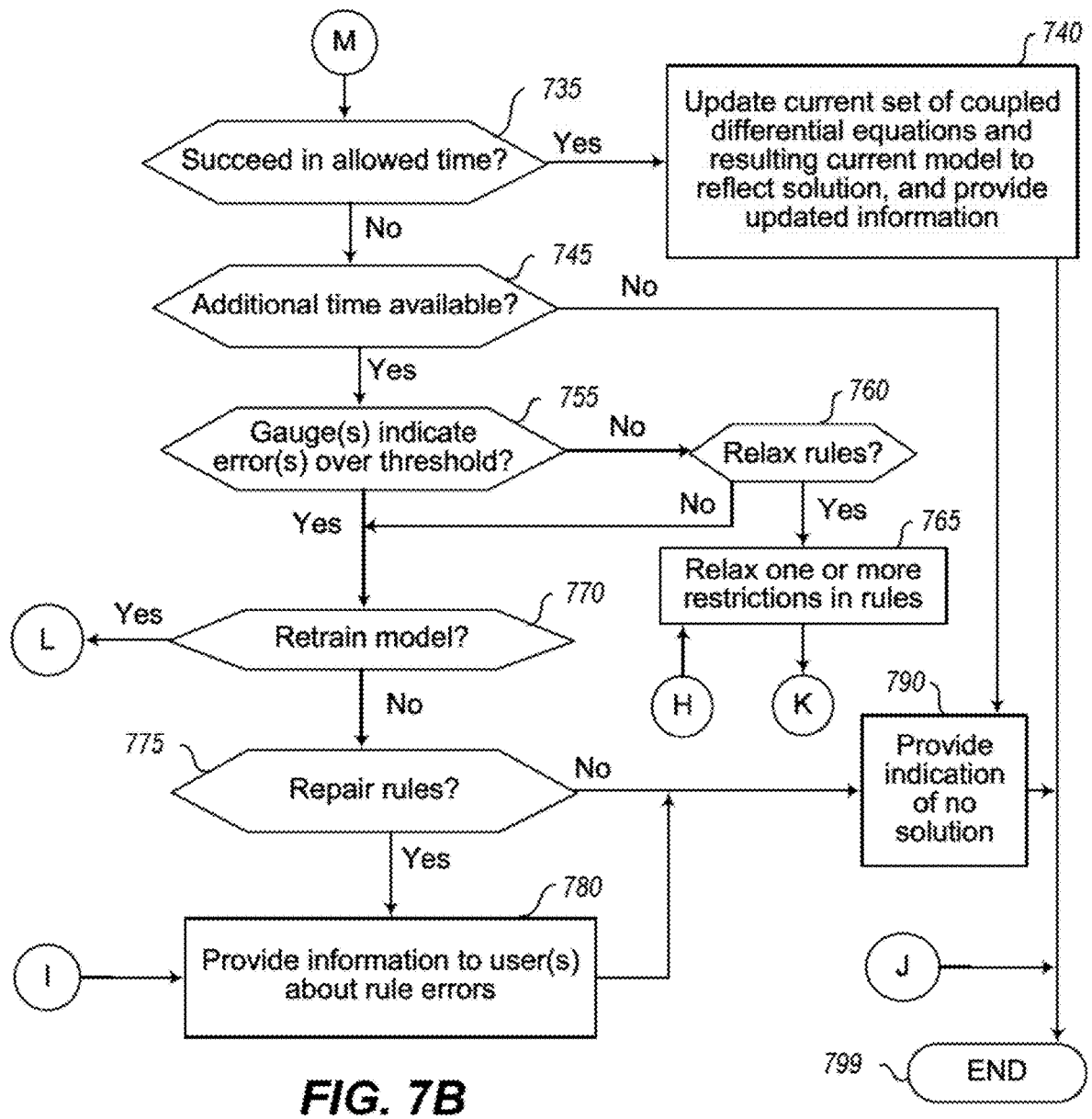

FIGS. 7A-7B are a flow diagram of a example embodiment of a CDD Control Action Determination routine 700. The routine may, for example, be provided by execution of the component 344 of FIG. 3 and/or components 144*a-n* or 184 of FIG. 1C, such as to determine control actions for a decision module to propose and/or implement for a target system during a particular time period, including in some embodiments to perform an optimization to determine near-optimal actions (e.g., within a threshold of an optimal solution) to perform with respect to one or more goals if possible. While the illustrated embodiment of the routine is performed in a manner local to a particular decision module, such that some or all decision modules may each implement a local version of such a routine, in other embodiments the routine may be implemented in a centralized manner by one or more components with which one or more decision modules interact over one or more networks, such as with a particular decision module indicated to be used at a particular time rather than acting on behalf of the local decision module.

The illustrated embodiment of the routine 700 begins at block 703, where information or a request is received. The routine continues to block 705 to determine a type of the information or request, and to proceed accordingly. In particular, if a request is received in block 703 to attempt to determine a solution for a current time period given a current model of the local decision module, the routine continues to block 710 to begin to perform such activities, as discussed in greater detail with respect to block 710-790. If it is instead determined in block 705 that a request to relax one or more rules or other restrictions for the current model of the local decision module is received, such as discussed in greater detail with respect to blocks 760 and 765, the routine continues to block 765. If it is determined in block 705 that a request is received to repair one or more rules or other restrictions for the current model of the local decision module, such as discussed in greater detail with respect to blocks 775 and 780, the routine continues to block 780 to obtain user input to use during the rule repair process (e.g., to interact with a CDD Decision Module Construction component, or to instead interact with one or more users in another manner), such as to allow the current model for the local decision module to later be updated and replaced based on further resulting user actions, or if operation of the target system can be suspended, to optionally wait to further perform the routine 700 until such an updated model is received. If it is instead determined in block 705 that the information or request is of another type, the routine continues instead to block 708 to perform one or more other indicated operations as appropriate, and to then proceed to block 799. Such other indicated operations may include, for example, receiving information about current models and/or control actions proposed or performed by one or more other decision modules that are collectively controlling a target system with the local decision module (such as for use in synchronizing the model of the local decision module with such other decision modules by generating a consensus or converged shared model, as discussed in greater detail with respect to routine 800 of FIGS. 8A-8B), to receive updates to a model or underlying information for the model for use in ongoing operation of the routine 700 (e.g., from a CDD Decision Module Construction component, such as results from interactions performed in block 780; from a CDD Inference Automaton Tomograph component, such as discussed in FIG. 9; etc.), to receive current state information for the target system, such as for use as discussed in routine 600 of FIGS. 6A-6B, etc.

If it determined in block 705 that a request for a solution was received in block 703 for a current time period and based on a current model of the local decision module, the routine continues to block 710 to receive a current set of coupled differential equations that represent the current model for the local decision module of at least a portion of the target system, optionally along with additional state information for the target system for the current time. The routine then continues to block 715 to determine whether to train or re-train the model, such as if the routine is called for a first time upon initial execution of a corresponding decision module or if error measurements from ongoing operations indicate a need for re-training, as discussed in greater detail with respect to blocks 755, 770 and 730. If it is determined to train or re-train the model, the routine continues to block 720 to determine one or more of the size of a training time window, size of training time slices within the time window, and/or type of training time slices within the training time window, such as in a manner similar to that previously discussed with respect to block 553 of routine 500 of FIGS. 5A-5C. After block 720, the routine continues to block 725 to use partial initial state information for the target system to train the model, including to estimate values of state variables for the target system that are not known and/or directly observable, by simulating effects of performing control actions over the time window for each of the time slices, as discussed in greater detail with respect to block 555 of routine 500 of FIGS. 5A-5C.

After block 725, or if it is instead determined in block 715 not to train or re-train the model, the routine continues to block 730 to perform a piecewise linear analysis to attempt to determine a solution for the current model and any additional state information that was obtained in block 710, with the solution (if determined) including one or more proposed control action determinations for the local decision module to take for a current time period, as well as in some embodiments to use one or more model error gauges to make one or more error measurements with respect to the current model, as discussed in greater detail elsewhere. The routine then continues to block 735 to determine if the operations in block 730 determined a solution within a amount of time allowed for the operation of block 730 (e.g., a defined subset or fraction of the current time period), and if so continues to block 740 to update the current set of coupled differential equations and the resulting current model for the local decision module to reflect the solution, with the resulting updated information provided as an output of the routine 700.

If it is instead determined in block 735 that the operations in block 730 did not determine a solution, the routine continues to block 745 to determine if additional time is available within the current time period for further attempts to determine a solution, and if not continues to block 790 to provide output of the routine 700 indicating that no solution was determined for the current time period.

If additional time is available within the current time period, however, the routine continues to perform blocks 755-780 to perform one or more further attempts to identify the solution—it will be appreciated that one or more of the operations of blocks 755-780 may be repeatedly performed multiple times for a given time period if sufficient time is available to continue further solution determination attempts. In particular, the routine continues to block 755 if additional time is determined to be available in block 745, where it determines whether the measurements from one or more gauges indicate model error measurements that are over one or more thresholds indicating modifications to the model are needed, such as based on the model error measurements from the gauges discussed with respect to block 730. If not, the routine continues to block 760 to determine whether there are one or more rules or other restrictions in the current model that are available to be relaxed for the current time period (that have not previously attempted to be relaxed during the time period, if this is not the first pass through this portion of the routing for the current time period), and if so continues to block 765 to relax one or more such rules or other restrictions and to return to block 730 to re-attempt the piecewise linear analysis with the revised model based on those relaxed rules or other restrictions.

If it is instead determined in block 755 that the model error measurements from one or more of the gauges are sufficient to satisfy one or more corresponding thresholds, the routine continues instead to block 770 to determine whether to re-train the model based on one or more of the gauges indicating sufficient errors to do so, such as based on accumulated errors over one or more time periods of updates to the model. If so, the routine returns to block 720 to perform such re-training in blocks 720 and 725, and then continues to block 730 to re-attempt the piecewise linear analysis with the resulting re-trained model.

If it is instead determined in block 770 not to re-train the model (or if the model was re-trained already for the current time period and the resulting re-attempt in block 730 again failed to find a solution), the routine continues to block 775 to determine whether the model error measurements from one or more of the gauges indicate a subset of one or more rules or other restrictions in the model that potentially have errors that need to be repaired. If so, the routine continues to block 780 to provide information to one or more users via the CDD Decision Module Construction component, to allow the users to revise the rules or other restrictions as appropriate, although in other embodiments some or all such rule repair activities may instead be attempted or performed in an automated manner. After block 780, or if it is instead determined in block 775 not to repair any rules, the routine continues to block 790 to provide an indication that no solution was determined for the current time period. After blocks 740, 708, or 790, the routine continues to block 799 and ends. It will be appreciated that if the routine 700 was instead implemented as a centralized routine that supports one or more decision modules remote from the executing component for the routine, the routine 700 may instead return to block 703 to await further information or requests.

Figure 8A:
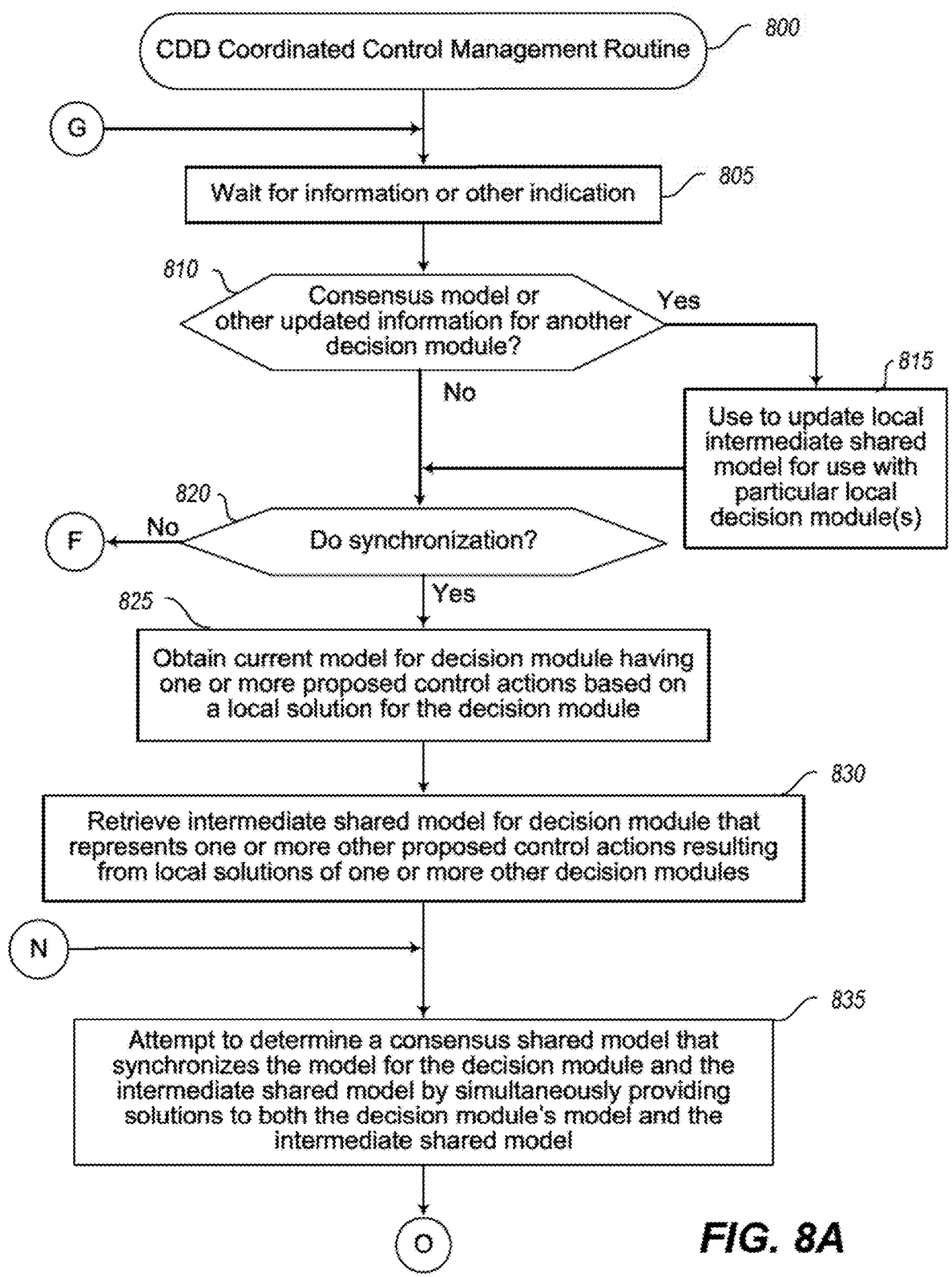
FIGS. 8A-8B illustrate a flow diagram of an example embodiment of a CDD Coordinated Control Management routine.
Figure 8B:
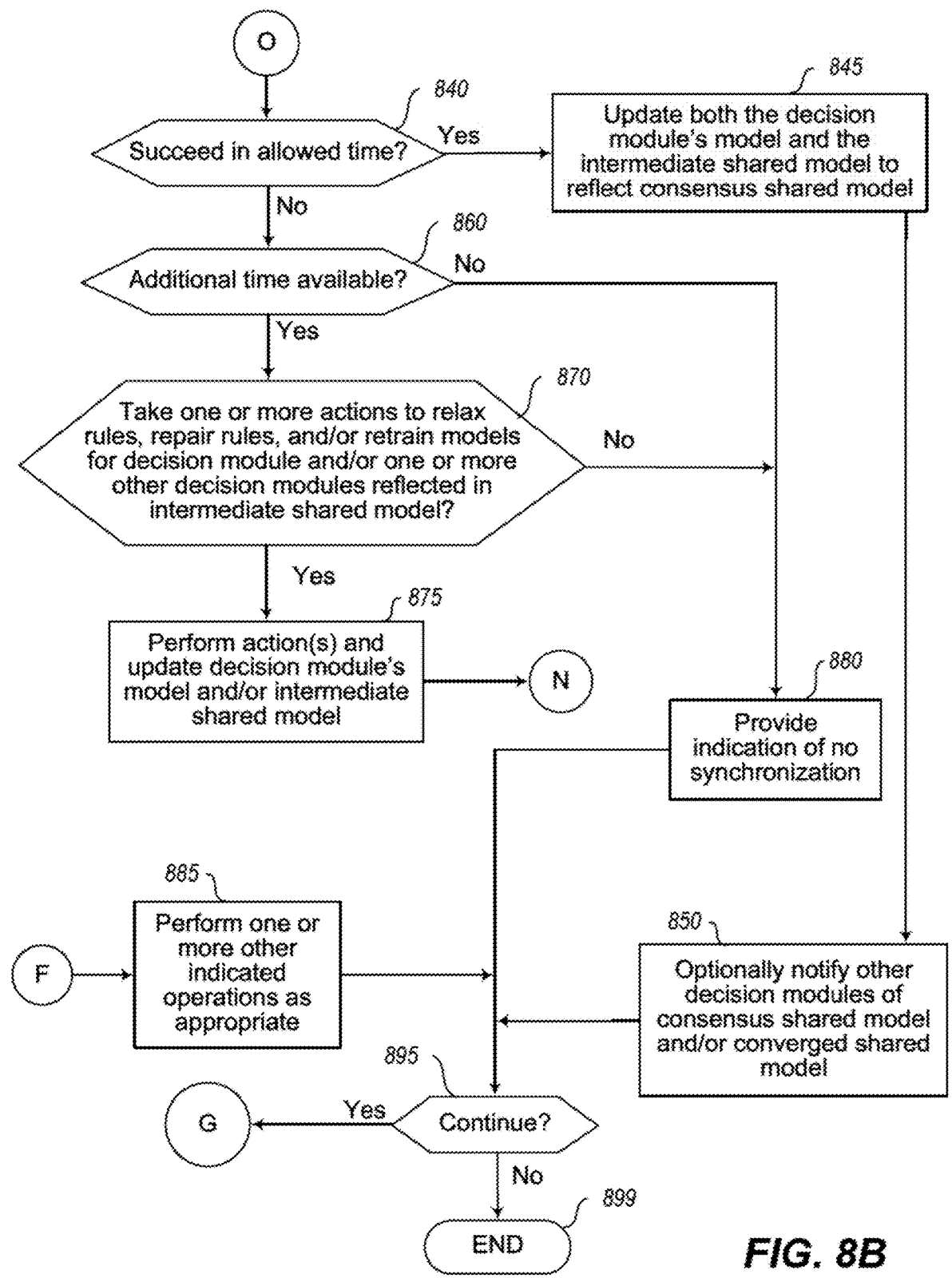

FIGS. 8A-8B are a flow diagram of an example embodiment of a CDD Coordinated Control Management routine 800. The routine may, for example, be provided by execution of the component 346 of FIG. 3 and/or the components 146*a-n* of FIG. 1C, such as to attempt to synchronize current models and their proposed control actions between multiple decision modules that are collectively controlling a target system. In the illustrated embodiment of the routine, the synchronization is performed in a pairwise manner between a particular local decision module's local current model and an intermediate shared model for that decision module that is based on information about the current state of one or more other decision modules, by using a Pareto game technique to determine a Pareto equilibrium if possible that is represented in a consensus shared model, although in other embodiments other types of synchronization methods may be used. In addition, in the illustrated embodiment, the routine 800 is performed in a local manner for a particular local decision module, such as by being included within that local decision module, although in other embodiments the routine 800 may be implemented in a centralized manner to support one or more decision modules that are remote from a computing system implementing the component for the routine and that communicate with those decision modules over one or more computer networks, such as with a particular decision module indicated to be used at a particular time rather than acting on behalf of the local decision module.

The illustrated embodiment of the routine 800 begins at block 805, where it waits to receive information or another indication. The routine continues to block 810 to determine if a consensus model or other updated information for another decision module has been received, such as from a copy of the routine 800 executing for that other decision module, and if so continues to block 815 to use the received information to update local intermediate shared model information for use with the local decision module on whose behalf the current copy of the routine 800 is executing, as discussed in greater detail with respect to block 830. If it is instead determined in block 810 that the information or request received in block 805 is not information related to one or more other decision modules, or after block 815, the routine continues to block 820 to determine whether to currently perform a synchronization for the current local model of the local decision module by using information about an intermediate shared model of the local decision module that includes information for one or more other decision modules, such as to do such synchronization each time that an update to the local decision module's model is received (e.g., based on operation of the routine 700 for a copy of the CDD Control Action Determination component local to that decision module) in block 805 and/or each time that information to update the local decision module's intermediate shared model is received in block 805 and used in block 815, or instead as explicitly indicated in block 805—if the synchronization is to currently be performed, the routine continues to block 825 and begins to perform blocks 820-880 related to such synchronization activities. Otherwise, the routine continues to block 885 to perform one or more other indicated operations as appropriate, such as to receive requests from the CDD system or other requestor for current information about operation of the routine 800 and/or to provide corresponding information to one or more entities (e.g., to reflect prior requests), etc.

If it is determined in block 820 that synchronization is to be currently performed, such as based on updated model-related information that is received in block 805, the routine continues to block 825 to obtain a current local model for the local decision module to use in the synchronizing, with the model including one or more proposed control actions to perform for a current time period based on a local solution for the local decision module. The routine then continues to block 830 to retrieve information for an intermediate shared model of the local decision module that represents information for one or more other decision modules (e.g., all other decision modules) that are collectively participating in controlling the target system, with that intermediate shared model similarly representing one or more other proposed control actions resulting from local solutions of those one or more other decision modules, optionally after partial or complete synchronization has been performed for those one or more other decision modules between themselves.

The routine then continues to block 835 to attempt to determine a consensus shared model that synchronizes the current model of the local decision module and the intermediate shared model by simultaneously providing solutions to both the local decision module's current model and the intermediate shared model. In some embodiments, the operations of block 835 are performed in a manner similar to that discussed with respect to blocks 710-730 of routine 700 of FIG. 7A-7B, such as if the local model and the intermediate shared model are combined to create a combination model for whom one or more solutions are to be identified. As discussed in greater detail elsewhere, in some embodiments, the local current model and intermediate shared model may each be represented by a Hamiltonian function to enable a straightforward creation of such a combined model in an additive manner for the respective Hamiltonian functions, with the operations of routines 600 and/or 700 of FIGS. 6A-6B and 7A-7B, respectively, similarly representing the models that they update and otherwise manipulate using such Hamiltonian functions.

After block 835, the routine continues to block 840 to determine whether the operations of block 835 succeeded in an allowed amount of time, such as a fraction or other portion of the current time period for which the synchronization is attempted to be performed, and if so the routine continues to block 845 to update both the local model and the intermediate shared model of the local decision module to reflect the consensus shared model. As earlier noted, if sufficient time is allowed for each decision module to repeatedly determine a consensus shared model with changing intermediate shared models representing one or more other decision modules of a collective group, the decision modules of the collective group may eventually converge on a single converged shared model, although in other embodiments and situations there may not be sufficient time for such convergence to occur, or other issues may prevent such convergence. After block 845, the routine continues to block 850 to optionally notify other decision modules of the consensus shared model determined for the local decision module (and/or of a converged shared model, if the operations of 835 were a last step in creating such a converged shared model), such as if each of the notified decision modules is implementing its own local version of the routine 800 and the provided information will be used as part of an intermediate shared model of those other decision modules that includes information from the current local decision module's newly constructed consensus shared model.

If it is instead determined in block 840 that a synchronization did not occur in the allowed time, the routine continues to perform blocks 860-875 to re-attempt the synchronization with one or more modifications, sometimes repeatedly if sufficient time is available, and in a manner similar to that discussed with respect to blocks 745-780 of routine 700 of FIGS. 7A-7B. In the illustrated example, the routine determines in block 860 if additional time is available for one or more such re-attempts at synchronization, and if not the routine continues to block 880 to provide an indication that no synchronization was performed within the allowed time. Otherwise, the routine continues to block 870 to take one or more actions to perform one or more of relaxing rules or other restrictions, repairing rules or other restrictions, and/or re-training a model, with respect to one or both of the current model of the local decision module and/or one or more other decision modules whose information is represented in the intermediate shared model of the local decision module. If it is determined in block 870 to proceed in this manner, the routine continues to block 875 to perform corresponding actions, sometimes one at a time in a manner similar to that discussed with respect to routine 700, including to cause resulting updates to the current model of the local decision module and/or to the local intermediate shared model of the local decision module, after which the routine returns to block 835 to re-attempt to synchronize the local model and the intermediate shared model of the local decision module.

If it is instead determined in block 870 that no further actions are to be performed with respect to relaxation, repair and/or re-training, the routine continues instead to block 880. After blocks 850, 880 or 885, the routine continues to block 895 to determine whether to continue, such as until an explicit indication to terminate or suspend operation of the routine 800 is received, such as to reflect an end to operation of the target system and/or an end to use of the local decision module and/or a collective group of multiple decision modules to control the target system. If it is determined to continue, the routine returns to block 805, and otherwise continues to block 899 and ends.

FIG. 9 is a flow diagram of an example embodiment of a CDD Inference Automaton Tomograph routine 900. The routine may, for example, be provided by execution of the component 195c of FIG. 1A, component 205c discussed with respect to FIGS. 2A-2G, component 345 of FIG. 3 and/or as otherwise discussed herein, such as to implement a learning feedback loop with respect to a target system that determines and use internal state information for a battery to update a total system model of the target system. In the illustrated embodiment of the routine, the routine 900 is performed in a local manner for a particular local decision module, such as by being included within that local decision module, although in other embodiments the routine 900 may be implemented in a centralized manner to support one or more decision modules that are remote from a computing system implementing the component for the routine and that communicate with those decision modules over one or more computer networks, such as with a particular decision module indicated to be used at a particular time rather than acting on behalf of the local decision module. In addition, while the illustrated embodiment of the routine 900 may determine and implement updates to a total system model for a target system concurrently with a control loop that is implementing control actions for the target system, in some embodiments such updates may be performed at only certain times, such as to coordinate the updates performed by the routine 900 with other possible updates to the model implemented as part of the control loop being implemented (e.g., with respect to blocks 635, 642, 655 and/or 665 of routine 600, blocks 725, 740 and/or 765 of routine 700, blocks 815, 845 and/or 875 of routine 800, etc.), The illustrated embodiment of the routine 900 begins at block 905, where information is retrieved for use in generating excitation signals for one or more batteries of the target system, in accordance with the quantized levels for the active sensors and to cause infinitesimal changes in resulting output from the one or more batteries. The routine continues to block 910 to generate a suite of multiple excitation signals, for use in determining a current internal state of battery and how the battery responds for multiple battery conditions (e.g., different battery charge levels, internal temperature, internal chemistry, etc.). The routine then continues to use the excitation signals in a loop with blocks 925-940, including to select the next excitation signal to use in block 925 (beginning with the first) and to supply it to the one or more batteries. In block 930, the routine then obtains resulting output from one or more active sensors, including to generate feasible infinitesimal values for state, momentum and control, and to extrapolate estimated actual values of the one or more batteries for state, momentum and control. For example, the operations of block 930 may include using previously determined active sensor equations to infer the feasible infinitesimal value for state, momentum and control values, a previously determined inference matrix and KSE to extract and generate instances of the infinitesimal values of state, momentum and control variables, including converging to the extrapolated estimated actual values of the one or more batteries for state, momentum and control. In block 940, if there are more excitation signals in the generated suite, the routine returns to block 925.

If it is instead determined in block 940 that there are not more excitation signals in the generated suite, the routine continues to block 950 to use the determined estimated actual values of the one or more batteries for state, momentum and control from the suite of excitation signals to generate an incremental Hamiltonian model update to the total system model, and in block 970 updates the current total system model to include structural changes from the incremental Hamiltonian model update.

In block 995 the routine determines whether to continue, such as until an explicit indication to terminate is received. If it is determined to continue, the routine returns to block 910, such as to perform further updates to the total system model, and otherwise continues to block 999 and ends.

Figure 10:
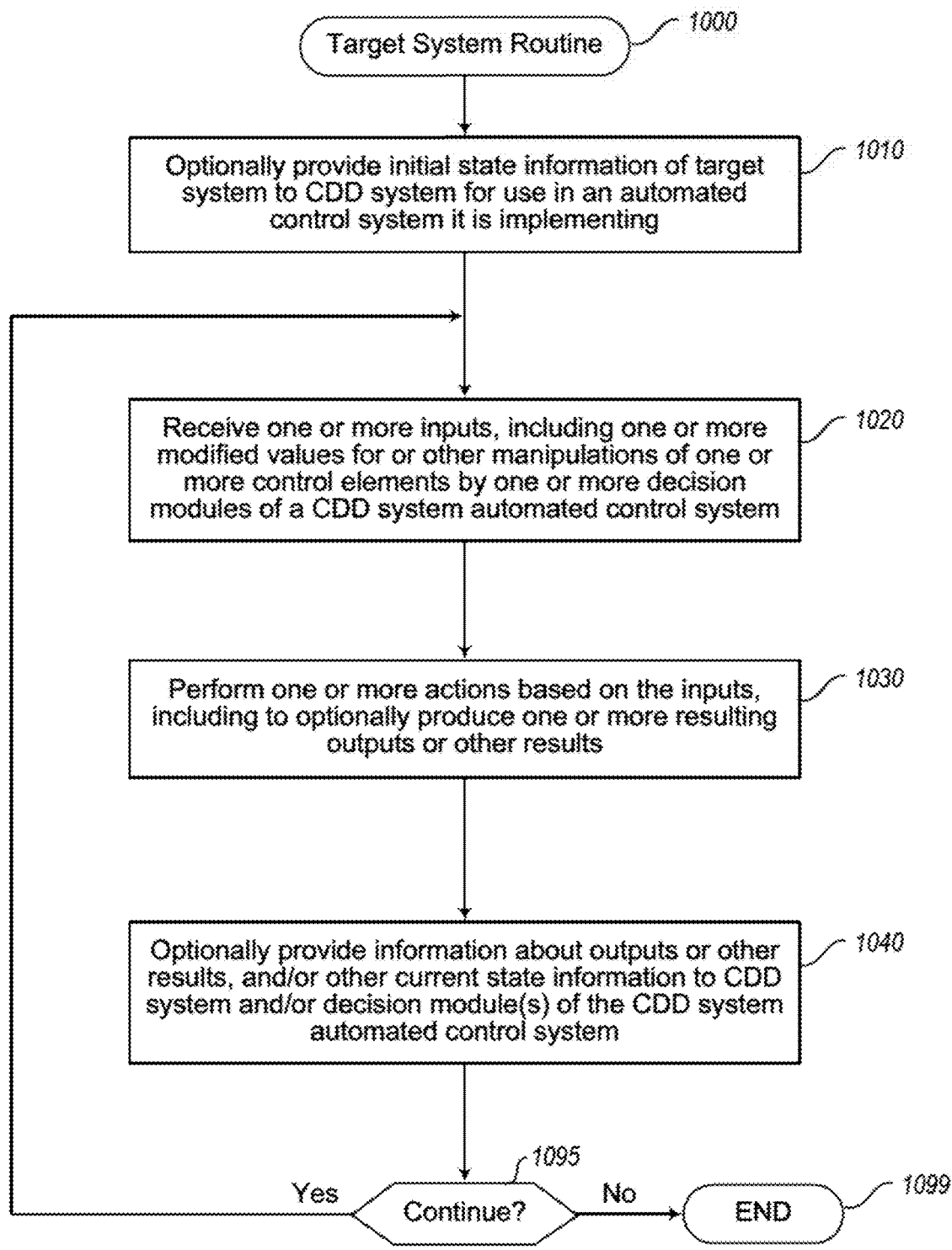
FIG. 10 illustrates a flow diagram of an example embodiment of a routine for a target system being controlled.

FIG. 10 illustrates a flow diagram of an example embodiment of a routine 1000 performed for a representative generic target system, with respect to interactions between the target system and one or more decision modules that are controlling at least a portion of the target system. The routine may, for example, be provided by execution of a target system 360 and/or 370 of FIG. 3, an electrical device 195*b* of FIG. 1A, a battery 205*b* discussed with respect to FIGS. 2A-2G, and/or a target system 160 and/or 170 of FIGS. 1B and 1C, such as to implement operations specific to the target system. It will be appreciated that the illustrated embodiment of the routine focuses on interactions of the target system with the one or more decision modules, and that many or all such target systems will perform many other operations in a manner specific to those target systems that are not illustrated here for the purpose of brevity.

The routine begins at block 1010, where it optionally provides initial state information for the target system to a CDD system for use in an automated control system of the CDD system for the target system, such as in response to a request from the CDD system or its automated control system for the target system, or instead based on configuration specific to the target system (e.g., to be performed upon startup of the target system). After block 1010, the routine continues to block 1020 to receive one or more inputs from a collective group of one or more decision modules that implement the automated control system for the target system, including one or more modified values for or other manipulations of one or more control elements of a plurality of elements of the target system that are performed by one or more such decision modules of the automated control system. As discussed in greater detail elsewhere, the blocks 1020, 1030, 1040 may be repeatedly performed for each of multiple time periods, which may vary greatly in time depending on the target system (e.g., a microsecond, a millisecond, a hundredth of a second, a tenth of a second, a second, 2 seconds, 5 seconds, 10 seconds, 15 seconds, 30 seconds, a minute, 5 minutes, 10 minutes, 15 minutes, 30 minutes, an hour, etc.).

After block 1020, the routine continues to block 1030 to perform one or more actions in the target system based on the inputs received, including to optionally produce one or more resulting outputs or other results within the target system based on the manipulations of the control elements. In block 1040, the routine then optionally provides information about the outputs or other results within the target system and/or provides other current state information for the target system to the automated control system of the CDD system and/or to particular decision modules of the automated control system, such as to be obtained and measured or otherwise analyzed via passive sensors and/or active sensors. The routine then continues to block 1095 to determine whether to continue, such as until an explicit indication to terminate or suspend operation of the target system is received. If it is determined to continue, the routine returns to block 1020 to begin a next set of control actions for a next time period, and otherwise continues to block 1099 and ends. As discussed in greater detail elsewhere, state information that is provided to a particular decision module may include requests from external systems to the target system, which the automated control system and its decision modules may determine how to respond to in one or more manners.

It will also be appreciated that in some embodiments the functionality provided by the routines discussed above may be provided in alternative ways, such as being split among more routines or consolidated into fewer routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, synchronously or asynchronously, etc.) and/or in a particular order, those skilled in the art will appreciate that in other embodiments the operations may be performed in other orders and in other manners. Those skilled in the art will also appreciate that the data structures discussed above may be structured in different manners, such as by having a single data structure split into multiple data structures or by having multiple data structures consolidated into a single data structure. Similarly, in some embodiments illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by the appended claims and the elements recited therein. In addition, while certain aspects of the invention are presented below in certain claim forms, the inventors contemplate the various aspects of the invention in any available claim form. For example, while only some aspects of the invention may currently be recited as being embodied in a computer-readable medium, other aspects may likewise be so embodied.

What is claimed is:

1. A computer-implemented method comprising:
receiving, by one or more configured computing systems, an initial model representing a physical system having a battery and one or more controls that are manipulatable to modify at least one output of the physical system, the initial model being based at least in part on binary rules that use operating principles of the physical system and evaluate state information for the battery to reach true or false values for control actions to perform to manipulate the one or more controls; and
controlling, by the one or more configured computing systems, ongoing operations of the physical system that involve supplying electrical power from the battery, including:
using the initial model and state information for the battery to determine one or more control actions to perform, performing the one or more control actions to manipulate the one or more controls and modify the at least one output of the physical system, and obtaining further state information for the battery from multiple passive sensors that measure characteristics of the battery during the ongoing operations;
learning, during the ongoing operations of the physical system, a model update that modifies a structure of the initial model, including supplying a plurality of excitation signals to the battery that elicit changes in the battery without interrupting the supplying of the electrical power from the battery, using multiple active sensors to determine the changes in the battery, and using the determined changes to generate the model update;
updating the initial model to include the model update; and
using the updated model and further state information for the battery to determine one or more additional control actions to perform, and performing the one or more additional control actions to further manipulate the one or more controls and further modify the at least one output of the physical system.

2. The computer-implemented method of claim 1 wherein the supplying of the plurality of excitation signals to the battery includes generating the excitation signals to have varying low voltage and high frequency, and applying each of the excitation signals to at least one of an anode of the battery or a cathode of the battery.

3. The computer-implemented method of claim 2 wherein the generating of the excitation signals further includes varying at least one of microamperes or microvolts for the excitation signals, wherein the using of the multiple active sensors to determine the changes in the battery includes measuring at least one of microampere changes or microvolt changes in electricity being output from the battery, and wherein the using of the multiple passive sensors that measure characteristics of the battery during the ongoing operations includes measuring amperes and volts for the electricity being output from the battery.

4. The computer-implemented method of claim 2 wherein the generating of the excitation signals further includes varying at least one of microamperes or microvolts at a frequency around a resonant of chemical reactions around at least one of an anode or a cathode of the battery, and wherein the using of the multiple active sensors to determine the changes in the battery includes measuring changes in chemistry of the battery based at least in part on free ions around at least one of an anode or a cathode of the battery.

5. The computer-implemented method of claim 2 wherein the using of the multiple passive sensors that measure characteristics of the battery during the ongoing operations includes measuring an external temperature of the battery, and wherein the using of the multiple active sensors to determine the changes in the battery includes measuring information about an internal temperature of the battery.

6. The computer-implemented method of claim 2 wherein the generating of the excitation signals further includes using a frequency in a range of 352 KHZ to 528 KHZ and using a voltage magnitude in a range of 0.5 millivolts to 1.5 millivolts.

7. The computer-implemented method of claim 1 wherein the learning of the model update further includes quantizing vector values from the multiple active sensors to levels based at least in part on a precision of the multiple active sensors, generating infinitesimal state and infinitesimal momentum and infinitesimal control values based at least in part on the quantized vector values, extrapolating the generated infinitesimal state and infinitesimal momentum and infinitesimal control values to create estimated actual values for the battery for state and momentum and control, and using the created estimated actual values for the battery for state and momentum and control for generating of the model update.

8. The computer-implemented method of claim 1 wherein the controlling of the ongoing operations of the physical system includes using a control loop to implement determining of control actions to perform and performing of determined control actions, and using a separate learning feedback loop to perform the learning of the model update and the updating of the initial model.

9. The computer-implemented method of claim 1 wherein the controlling of the ongoing operations of the physical system is performed repeatedly over a plurality of time periods, including to repeatedly update a current model representing the physical system based on learning further changes in the battery, and using a most recent updated version of the model as the current model for determining further control actions to perform.

10. The computer-implemented method of claim 9 wherein the ongoing operations of the physical system further involve supplying electrical power to the battery to be stored for later use in the supplying of electrical power from the battery, and wherein the determining of the further control actions to perform further includes performing the further control actions by, at one of the plurality of time periods, manipulating the one or more controls to cause electrical power to be supplied to the battery for storage, and by, at another of the plurality of time periods different from the one time period, manipulating the one or more controls to cause electrical power to be supplied from the battery for use by an electrical load.

11. The computer-implemented method of claim 9 wherein the determining of the further control actions to perform further includes performing the further control actions by, at one of the plurality of time periods, manipulating the one or more controls to cause a first amount of electrical power requested for the one time period to be supplied from the battery for use by an electrical load, and by, at another of the plurality of time periods different from the one time period, manipulating the one or more controls to prevent a second amount of electrical power requested for the another time period to be supplied from the battery for use by the electrical load.

12. The computer-implemented method of claim 1 wherein the determining of the one or more control actions to perform includes determining an amount of electrical power to supply from the battery based at least in part on the state information for the battery, and manipulating the one or more controls to cause the determined amount of electrical power to be supplied from the battery.

13. The computer-implemented method of claim 1 wherein the learning of the model update further includes:
   supplying excitation signals to the battery under a plurality of different internal state conditions of the battery;
   identifying different changes in the battery that occur for the plurality of different internal state conditions of the battery; and
   including the identified different changes in the battery for the plurality of different internal state conditions of the battery in the generated model update,
   and wherein the using of the updated model and the further state information for the battery includes identifying at least one of the plurality of different internal state conditions of the battery that currently matches the battery, and using at least one of the identified different changes in the battery that correspond to the identified at least one internal state conditions as part of determining the one or more additional control actions to perform.

14. The computer-implemented method of claim 1 wherein the physical system includes an electrical vehicle, wherein the one or more controls provide instructions that result in modifying movement of the electrical vehicle, wherein the at least one output includes the modified movement of the electrical vehicle, and wherein the initial model is further based on at least one specified goal that includes maximizing life of the battery while supplying energy to and/or from the battery according to indicated criteria.

15. The computer-implemented method of claim 1 wherein the physical system includes an electricity generating facility that stores generated electricity in the battery, wherein the one or more controls provide instructions that result in supplying electricity to and/or from the battery, wherein the at least one output includes the supplying of the electricity to and/or from the battery, and wherein the initial model is further based on at least one specified goal that includes maximizing life of the battery.

16. The computer-implemented method of claim 1 wherein the physical system further includes one or more super capacitor elements that store and/or supply electricity, wherein the one or more controls provide instructions that result in supplying electricity to and/or from the one or more super capacitor elements according to indicated criteria, and wherein the at least one output includes the supplying of the electricity to and/or from the one or more super capacitor elements.

17. The computer-implemented method of claim 16 wherein determining of the one or more control actions to perform includes determining to supply electricity to and/or from the one or more super capacitor elements during times when a change in rate of supply and/or demand exceeds a defined threshold, and wherein the initial model is further based on at least one specified goal that includes maximizing life of the battery.

18. The computer-implemented method of claim 1 wherein the initial model includes a total Hamiltonian function that is based on the binary rules and on historical data from previous operations of the physical system, wherein generating of the model update includes generating an incremental Hamiltonian function that is based at least in part on internal state information for the battery that is identified from the determined changes, and wherein the updating of the initial model to include the model update includes combining the total Hamiltonian function and the incremental Hamiltonian function.

19. The computer-implemented method of claim 18 wherein the binary rules include one or more absolute rules that specify non-modifiable restrictions that are requirements regarding the ongoing operations of the physical system, and further include one or more hard rules that specify restrictions regarding the ongoing operations of the physical system that can be modified in specified situations, and wherein the total Hamiltonian function is further based in part on one or more soft rules that each specifies one or more additional conditions to be evaluated to reach one of multiple possible values other than true or false with an associated likelihood.

20. A non-transitory computer-readable medium having stored contents that cause one or more computing systems to perform automated operations, the automated operations comprising:
   receiving, by the one or more computing systems, an initial model that represents a battery and is based at least in part on binary rules evaluating state information for the battery to reach true or false values for control actions to perform for the battery, wherein the initial model includes a total Hamiltonian function that is based at least in part on the binary rules and on historical data from previous use of the battery; and
   controlling, by the one or more computing systems, ongoing operations of the battery, including:
      using the initial model and state information for the battery to determine one or more control actions to perform, performing the one or more control actions to modify the ongoing operations of the battery, and obtaining further state information for the battery from multiple sensors that passively obtain information about characteristics of the battery during the ongoing operations;
      learning, during the ongoing operations of the battery, a model update that modifies the initial model, including supplying a plurality of excitation signals to the battery that elicit changes in the battery without interrupting use of the battery, using multiple additional sensors that actively analyze information about the battery to determine the changes in the battery, and using the determined changes to generate the model update, and wherein generating of the model update includes generating an incremental Hamiltonian function that is based at least in part on internal state information for the battery that is identified from the determined changes; and
      updating the initial model based on the model update, and using the updated model and further state information for the battery to determine one or more additional control actions to perform, and performing the one or more additional control actions to further modify the ongoing operations of the battery, wherein the updating of the initial model based on the model update includes combining the total Hamiltonian function and the incremental Hamiltonian function.

21. The non-transitory computer-readable medium of claim 20 wherein the battery is part of a physical system further having one or more outputs and having one or more controls that are manipulatable to modify at least one output and having the multiple sensors to passively measure the state information for the battery from the obtained information about the characteristics, and wherein the binary rules further use operating principles of the battery as part of the evaluating of the state information.

22. The non-transitory computer-readable medium of claim 21 wherein the binary rules include one or more absolute rules that specify non-modifiable restrictions that are requirements regarding the ongoing operations of the physical system, and further include one or more hard rules that specify restrictions regarding the ongoing operations of the physical system that can be modified in specified situations, and wherein the stored contents include software instructions that, when executed, further cause the one or more computing systems to generate the total Hamiltonian function based in part on the binary rules and further based on one or more soft rules that each specifies one or more additional conditions to be evaluated to reach one of multiple possible values other than true or false with an associated likelihood.

23. A non-transitory computer-readable medium having stored contents that cause one or more computing systems to perform automated operations, the automated operations comprising:
receiving, by the one or more computing systems, an initial model that represents a battery and is based at least in part on binary rules evaluating state information for the battery to reach true or false values for control actions to perform for the battery; and
controlling, by the one or more computing systems, ongoing operations of the battery, including:
using the initial model and state information for the battery to determine one or more control actions to perform, performing the one or more control actions to modify the ongoing operations of the battery, and obtaining further state information for the battery from multiple sensors that passively obtain information about characteristics of the battery during the ongoing operations;
learning, during the ongoing operations of the battery, a model update that modifies the initial model, including supplying a plurality of excitation signals to the battery that elicit changes in the battery without interrupting use of the battery, using multiple additional sensors that actively analyze information about the battery to determine the changes in the battery, and using the determined changes to generate the model update; and
updating the initial model based on the model update, and using the updated model and further state information for the battery to determine one or more additional control actions to perform, and performing the one or more additional control actions to further modify the ongoing operations of the battery, wherein the updating of the initial model based on the model update includes modifying a structure of the initial model, and wherein the using of the multiple additional sensors includes using active sensors that actively analyze the information about the battery to determine the changes in the battery, including quantizing vector values from the active sensors to levels based at least in part on a precision of the active sensors, generating infinitesimal state and infinitesimal momentum and infinitesimal control values based at least in part on the quantized vector values, extrapolating the generated infinitesimal state and infinitesimal momentum and infinitesimal control values to create estimated actual values for the battery for state and momentum and control, and using the created estimated actual values for the battery for state and momentum and control for generating of the model update.

24. A system comprising:
one or more hardware processors of one or more computing systems; and
one or more memories storing instructions that, when executed by at least one of the one or more hardware processors, cause the system to implement an automated control system for a target system having a battery, by:
receiving an initial model that represents the target system and is based at least in part on binary rules using operating principles of the battery to evaluate state information for the battery; and
controlling ongoing operations of the target system that involve use of the battery, including:
using the initial model to determine one or more control actions to perform, performing the one or more control actions to modify the use of the battery by the target system;
learning, during the ongoing operations of the target system, a model update that modifies the initial model, including supplying a plurality of excitation signals to the battery that elicit changes in the battery without interrupting the use of the battery, using multiple sensors that actively obtain information about the battery and determine the changes in the battery, and using the determined changes to generate the model update; and
updating the initial model based on the model update, and using the updated model to determine one or more additional control actions to perform, and performing the one or more additional control actions to further modify the use of the battery by the target system.

25. The system of claim 24 wherein the updating of the initial model based on the model update includes modifying a structure of the initial model, and wherein the using of the multiple sensors includes using active sensors that actively analyze the information about the battery to determine the changes in the battery, including quantizing vector values from the active sensors to levels based at least in part on a precision of the active sensors, generating infinitesimal state and infinitesimal momentum and infinitesimal control values based at least in part on the quantized vector values, extrapolating the generated infinitesimal state and infinitesimal momentum and infinitesimal control values to create estimated actual values for the battery for state and momentum and control, and using the created estimated actual values for the battery for state and momentum and control for generating of the model update.

26. The system of claim 24 wherein the target system is a physical system further having one or more outputs and having one or more controls that are manipulatable to modify at least one output and having additional sensors to passively measure the state information for the battery, wherein the binary rules further specify conditions involving the state information to be evaluated to reach true or false values for resulting control actions to take to manipulate the one or more controls, wherein the using of the initial model further includes using the measured state information from the additional sensors to determine the one or more control actions, and wherein the using of the updated model further includes using additional measured state information from the additional sensors to determine the one or more additional control actions.

27. The system of claim 24 wherein the initial model includes a total Hamiltonian function that is based at least in part on the binary rules and on historical data from previous operations of the target system, wherein generating of the model update includes generating an incremental Hamiltonian function that is based at least in part on internal state information for the battery that is identified from the determined changes, and wherein the updating of the initial model based on the model update includes combining the total Hamiltonian function and the incremental Hamiltonian function.

28. The system of claim 27 wherein the binary rules include one or more absolute rules that specify non-modifiable restrictions that are requirements regarding the ongoing operations of the target system, and further include one or more hard rules that specify restrictions regarding the ongoing operations of the target system that can be modified in specified situations, and wherein the stored instructions include software instructions that, when executed, further cause the system to generate the total Hamiltonian function based in part on the binary rules and further based on one or more soft rules that each specifies one or more additional conditions to be evaluated to reach one of multiple possible values other than true or false with an associated likelihood.

* * * * *